(12) United States Patent
Nakazawa

(10) Patent No.: US 10,903,354 B2
(45) Date of Patent: Jan. 26, 2021

(54) SEMICONDUCTOR DEVICE

(71) Applicant: RENESAS ELECTRONICS CORPORATION, Tokyo (JP)

(72) Inventor: Yoshito Nakazawa, Ibaraki (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 28 days.

(21) Appl. No.: 16/371,989

(22) Filed: Apr. 1, 2019

(65) Prior Publication Data
US 2019/0326432 A1    Oct. 24, 2019

(30) Foreign Application Priority Data
Apr. 18, 2018   (JP) ................. 2018-080189

(51) Int. Cl.

| H01L 29/78 | (2006.01) |
|---|---|
| H01L 29/10 | (2006.01) |
| H01L 29/40 | (2006.01) |
| H01L 29/66 | (2006.01) |
| H01L 29/04 | (2006.01) |
| H01L 29/06 | (2006.01) |
| H01L 29/417 | (2006.01) |
| H01L 29/739 | (2006.01) |
| H01L 29/861 | (2006.01) |
| H01L 21/265 | (2006.01) |
| H01L 27/085 | (2006.01) |

(52) U.S. Cl.
CPC ...... *H01L 29/7813* (2013.01); *H01L 29/1095* (2013.01); *H01L 29/407* (2013.01); *H01L 29/66734* (2013.01); *H01L 29/7811* (2013.01)

(58) Field of Classification Search
CPC ............. H01L 29/7393; H01L 29/7813; H01L 29/66734; H01L 29/66348; H01L 29/7397; H01L 29/7811; H01L 29/0619; H01L 29/1095
See application file for complete search history.

(56) References Cited

U.S. PATENT DOCUMENTS

| 6,885,061 | B2 | 4/2005 | Nakazawa et al. |
| 9,589,952 | B2* | 3/2017 | Senoo ................. H01L 29/0684 |
| 2013/0328105 | A1* | 12/2013 | Matsuura ............ H01L 29/0696 257/139 |

FOREIGN PATENT DOCUMENTS

JP    2005-19734 A    1/2005

\* cited by examiner

*Primary Examiner* — Marcos D. Pizarro
*Assistant Examiner* — Antonio B Crite
(74) *Attorney, Agent, or Firm* — McDermott Will & Emery LLP

(57) ABSTRACT

A semiconductor device includes: a cell region provided in a main surface of a semiconductor substrate composed of a crystal plane (100); a field insulating film embedded in the semiconductor substrate; and an annular p-type well region surrounding the cell region. The p-type well region includes a first region extending in a <010> direction, a second region extending in a <001> direction, and a third region connecting the first region and the second region and having an arc shape in plan view. The field insulating film has an opening provided in the p-type well region and extending along the p-type well region in plan view. The opening includes a first opening extending in the <010> direction in the first region and a second opening extending in the <001> direction in the second region, and the first opening and the second opening are divided from each other in the third region.

11 Claims, 41 Drawing Sheets

FIG. 2
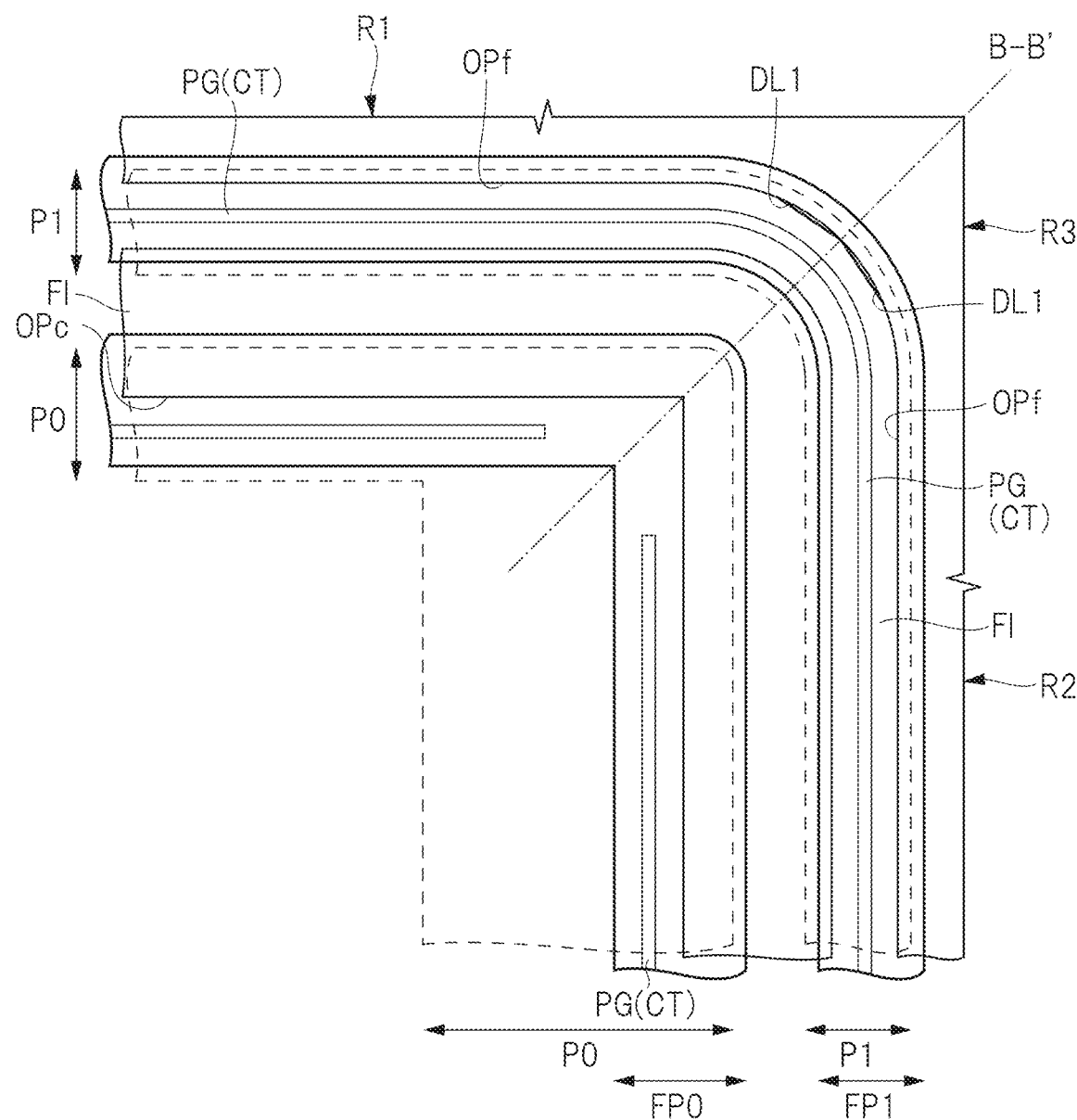
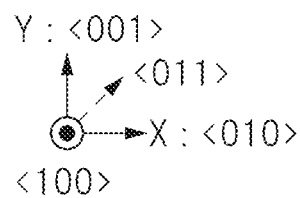

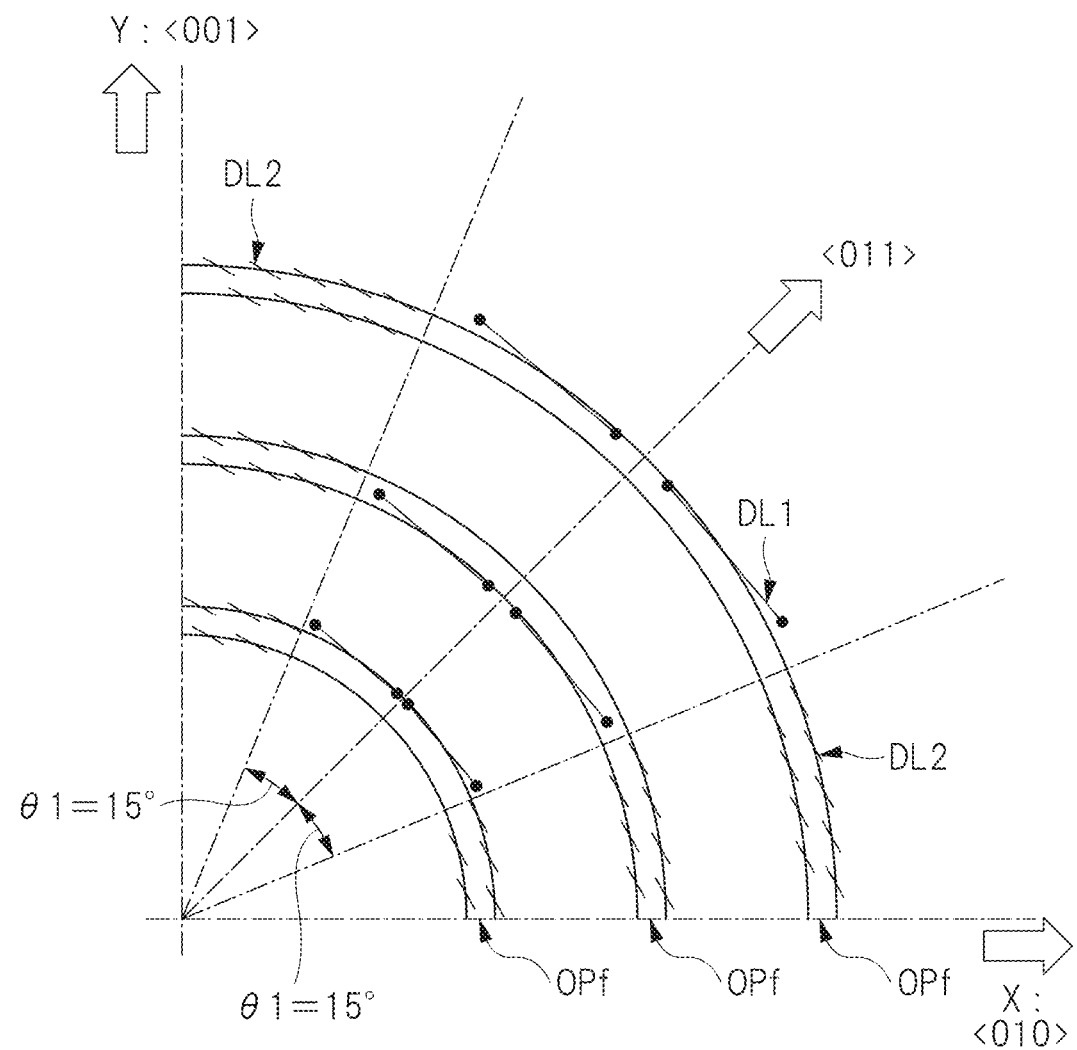
FIG. 4
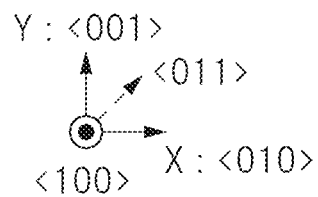

US 10,903,354 B2

SEMICONDUCTOR DEVICE

CROSS-REFERENCE TO RELATED APPLICATION

The present application claims priority from Japanese Patent Application No. 2018-080189 filed on Apr. 18, 2018, the content of which is hereby incorporated by reference into this application.

TECHNICAL FIELD OF THE INVENTION

The present invention relates to a semiconductor device and can be suitably used for, for example, a semiconductor device having a power transistor.

BACKGROUND OF THE INVENTION

A semiconductor device having a power transistor includes a cell region in which a plurality of power transistors are formed and a peripheral region (termination region) that surrounds the cell region.

Examples of the power transistor include, for example, a power MISFET having a trench gate and an IGBT having a trench gate. Then, as the structure of the peripheral region, a field limiting ring, a field plate and the like are known.

Japanese Patent Application Laid-Open Publication No. 2005-19734 (Patent Document 1) describes a semiconductor device including: a field limiting ring 11 composed of a p-type semiconductor region formed in a semiconductor substrate; and a field plate 24 composed of a wiring connected thereto. Then, the field plate 24 is formed on a field insulating film 3A formed on the semiconductor substrate and on an insulating film 14 that covers the field insulating film 3A, and is connected to the field limiting ring 11 through a contact trench 17 provided in the insulating film 14.

SUMMARY OF THE INVENTION

In the Patent Document 1 mentioned above, in the contact trench, a step difference equivalent to film thicknesses of the field insulating film and the insulating film is present, and this step difference becomes a cause of inhibiting miniaturization of the semiconductor device. Accordingly, the inventor of the present application examined the miniaturization of the semiconductor device using a shallow trench isolation (STI) technology and the like. As a result of the examination, however, it was found that the new problem of the reduction in breakdown voltage of the semiconductor device arose in a case of using the STI technology. Namely, improvement of the breakdown voltage is desired in the semiconductor device having the power transistor.

Other problems and novel features will be apparent from the description in the specification and the accompanying drawings.

According to an embodiment, a semiconductor device includes: a semiconductor substrate made of silicon and including a main surface composed of a (100) crystal plane and a first semiconductor region of a first conductivity type; an element forming region provided in the main surface; a field insulating film having an upper surface and a bottom surface, the bottom surface being located inside the semiconductor substrate and the upper surface being exposed from the main surface of the semiconductor substrate; and a well region of a second conductivity type having a closed annular shape so as to surround the element forming region in plan view, the well region being provided in the first semiconductor region so that an end portion of the well region is terminated on the bottom surface of the field insulating film. Then, in plan view, the well region includes a first region extending in a <010> direction, a second region extending in a <001> direction, and a third region connecting the first region and the second region to each other and having an arc shape in plan view. Moreover, the field insulating film has an opening provided in the well region and extending along the well region in plan view, the opening includes a first opening extending in the <010> direction in the first region and a second opening extending in the <001> direction in the second region, and the first opening and the second opening are divided from each other in the third region.

According to one embodiment, the breakdown voltage of the semiconductor device can be enhanced.

BRIEF DESCRIPTIONS OF THE DRAWINGS

FIG. 2 is a plan view of a principal part of a semiconductor device according to an examination example;

FIG. 4 is a view showing a problem of the examination example;

DESCRIPTIONS OF THE PREFERRED EMBODIMENTS

Figure 1:
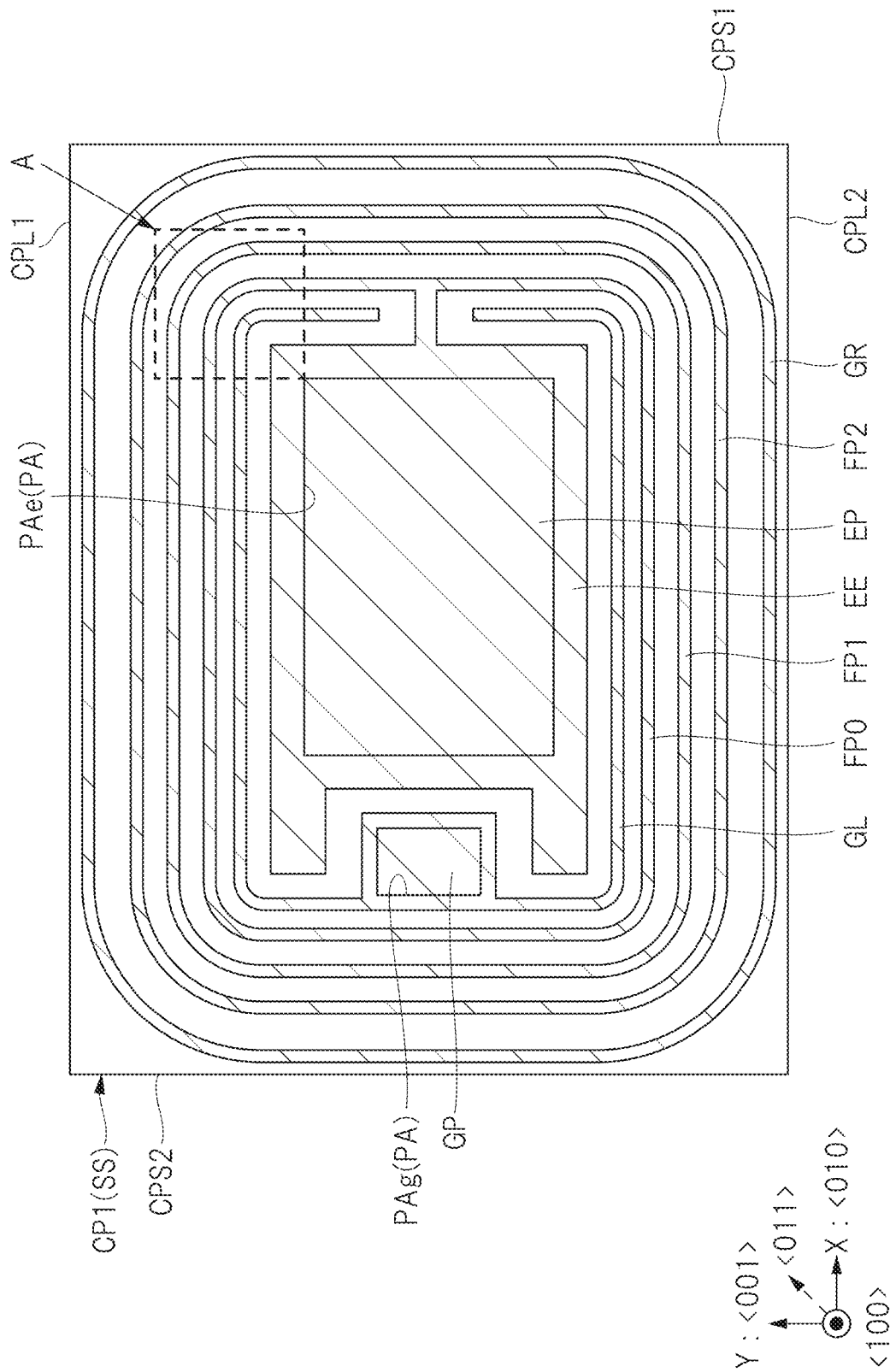
FIG. 1 is a plan perspective view of a semiconductor device according to a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when mentioning the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference characters in principle throughout the drawings for describing the embodiments, and the repetitive description thereof is omitted. In addition, the description of the same or similar portions is not repeated in principle unless particularly required in the following embodiments.

Also, in some drawings used in the following embodiments, hatching is omitted even in a cross-sectional view so as to make the drawings easy to see. In addition, hatching is used even in a plan view so as to make the drawings easy to see.

Moreover, in the following embodiments, a crystal orientation <100> includes crystal orientations [100], [010] and the like which are crystallographically equivalent thereto.

First Embodiment

<Structure of Semiconductor Device>

A semiconductor device (semiconductor chip) CP1 according to a first embodiment will be described with reference to the drawings.

FIG. 1 is a plan perspective view of the semiconductor device CP1 according to the first embodiment. FIG. 1 shows an emitter electrode (metal wiring) EE, a gate wiring (metal wiring) GL, field plates (metal wirings) FP0, FP1 and FP2, and a guard ring (metal wiring) GR, which are formed on a main surface of a semiconductor substrate SS.

As shown in FIG. 1, the main surface of the semiconductor substrate SS is, for example, rectangular, and has two long sides CPL1 and CPL2 and two short sides CPS1 and CPS2. Note that the main surface of the semiconductor substrate SS may be square. The emitter electrode EE is disposed at a center portion of the main surface of the semiconductor substrate SS, and the annular gate wiring GL is provided so as to surround the emitter electrode EE. Then, the annular field plates FP0, FP1 and FP2 closed so as to surround the emitter electrode EE and the gate wiring GL are provided sequentially, and further, the annular guard ring GR closed so as to surround the field plate FP2 is provided. The field plates FP0, FP1 and FP2 are each composed of: four linear portions which extend along the long sides CPL1 and CPL2 and the short sides CPS1 and CPS2; and four arc portions located at corner portions of the semiconductor substrate SS. The field plates FP1 and FP2 are electrically floating, and the field plate FP0 is connected to the emitter electrode EE. FIG. 1 shows an example where the number of field plates FP1 and FP2 at a floating potential is two; however, the number is not limited to this, and may be one or three or more.

The emitter electrode EE, the gate wiring GL, the field plates FP0, FP1 and FP2 and the guard ring GR are covered with an insulating film (protective insulating film) PA (not shown). A gate pad GP is provided on a part of the gate wiring GL, which is exposed from an opening PAg provided in the insulating film PA, and an emitter pad EP is provided on a part of the emitter electrode EE, which is exposed from an opening PAe provided in the insulating film PA.

Although details will be described later, the field plates FP1 and FP2 are electrically connected to closed annular p-type well regions P1 and P2 (corresponding to the above-mentioned field limiting ring) formed in the semiconductor substrate SS. The p-type well regions P1 and P2 are made of p-type semiconductor regions, and are respectively provided immediately under the field plates FP1 and FP2. Then, like the field plates FP1 and FP2, each of the p-type well regions P1 and P2 is also composed of four linear portions and four arc portions.

Moreover, the semiconductor substrate SS is a single crystal silicon substrate formed by a floating zone (FZ) method or a magnetic field applied Czochralski (MCZ) method, and the main surface thereof is a (100) plane. An element described later is formed on the (100) plane. Then, as shown in FIG. 1, the linear portions of the field plates FP1 and FP2 extend in a direction along a crystal orientation <001> or a crystal orientation <010>. Hereinafter, the direction will be simply referred to as a <001> direction or a <010> direction. For example, the linear portions of the field plates FP0, FP1 and FP2 along the long sides CPL1 and CPL2 extend in the <010> direction that is an X direction, and the linear portions of the field plates FP0, FP1 and FP2 along the short sides CPS1 and CPS2 extend in the <001> direction that is a Y direction. Similarly, linear portions of the p-type well regions P1 and P2 also extend in the <010> direction or the <001> direction. Note that the short sides may be caused to extend in the <010> direction, and the long sides may be caused to extend in the <001> direction.

<Examination Example and Problem Thereof>

First, a description will be given of an examination example examined by the inventor of the present application and a problem found in this examination. FIG. 2 is a plan view of a principal part of a semiconductor device according to the examination example, FIG. 3 is a cross-sectional view taken along a line B-B' of FIG. 2, and FIG. 4 is a view showing the problem of the examination example.

FIG. 2 shows structures of the field plate FP1 and the p-type well region P1 in a portion A (corner portion of the semiconductor device CP1) of FIG. 1. Each of the field plate FP1 and the p-type well region P1 has the linear portion that extends in the X direction and the linear portion that extends in the Y direction, and the two linear portions are coupled to each other by the arc portion. Further, a curvature radius of the arc portion is, for example, 50 μm or more. The arc portion of the p-type well region P1 is intentionally formed into an arc shape having a large curvature radius so as to prevent the reduction of a breakdown voltage.

Figure 3:
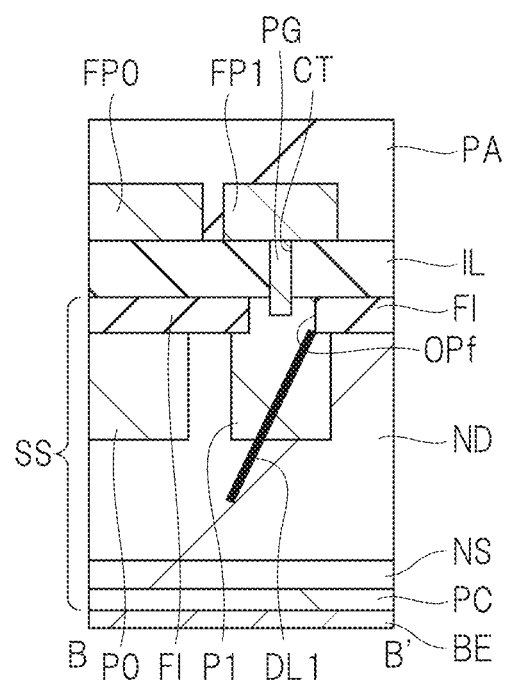
FIG. 3 is a cross-sectional view of principal part taken along a line B-B' of FIG. 2.

As shown in FIG. 3, in the structure of the examination example, a field insulating film FI is embedded in the semiconductor substrate SS. The field insulating film FI has an opening OPf, and the p-type well region P1 is formed at a position corresponding to the opening OPf. Then, the field plate FP1 formed on an interlayer insulating film (insulating film) IL is connected to the p-type well region P1 through a contact trench CT. As shown in FIG. 2, the opening OPf is located in the p-type well region P1, and has linear portions and arc portions like planar shapes of the field plate FP1 and the p-type well region P1, and a curvature radius of the arc portions is, for example, 50 μm or more.

According to the examination by the inventor of the present application, it was confirmed that a crystal defect occurred at an interface between a sidewall of the field insulating film FI and the semiconductor substrate SS in the arc portion, and this crystal defect causes the short circuit of a PN junction between the p-type well region P1 and an n-type drift region ND as shown in FIGS. 2 and 3. FIG. 4 shows a state of the crystal defect that occurs in the arc portion of the opening OPf provided in the field insulating film FI. Note that FIG. 4 shows the triple openings OPf. As shown in FIG. 4, it was confirmed that relatively large crystal defects referred to as large dislocation loops DL1 occurred in a range of $\theta 1 = \pm 15°$ with respect to a <011> direction, and relatively small crystal defects referred to as small dislocation loops DL2 occurred around them. As shown in FIG. 3, each of the large dislocation loops DL1 is a relatively large crystal defect that penetrates the p-type well region P1 and reaches the n-type drift region ND. In contrast, each of the small dislocation loops DL2 is a relatively small crystal defect that remains inside the p-type well region P1. The large dislocation loop DL1 occurs when a crystal plane of the semiconductor substrate SS, which is in contact with the sidewall of the field insulating film FI, is a crystal plane (011) or a vicinity thereof. Since the crystal plane (011) has a structure in which a surface density is lower than that of a crystal plane (010) or a crystal plane (001) (sparse structure), the dislocation loop is likely to occur along a crystal plane (111) that is a glide surface when a stress occurs. The stress is caused by a difference in thermal expansion coefficient between the semiconductor substrate SS and the field insulating film FI because the semiconductor device is heated during a heat treatment in a manufacturing process and an operation of the semiconductor device.

Next, the specification will return to the description of the structure of the semiconductor device according to the first embodiment for preventing the occurrence of the large dislocation loops DL1.

For the above-described problem, in the first embodiment, in a corner region R3 of the semiconductor device CP1, an opening OPf that extends along the long side CPL1 and an opening OPf that extends along the short side CPS1 are divided from each other.

Figure 5:
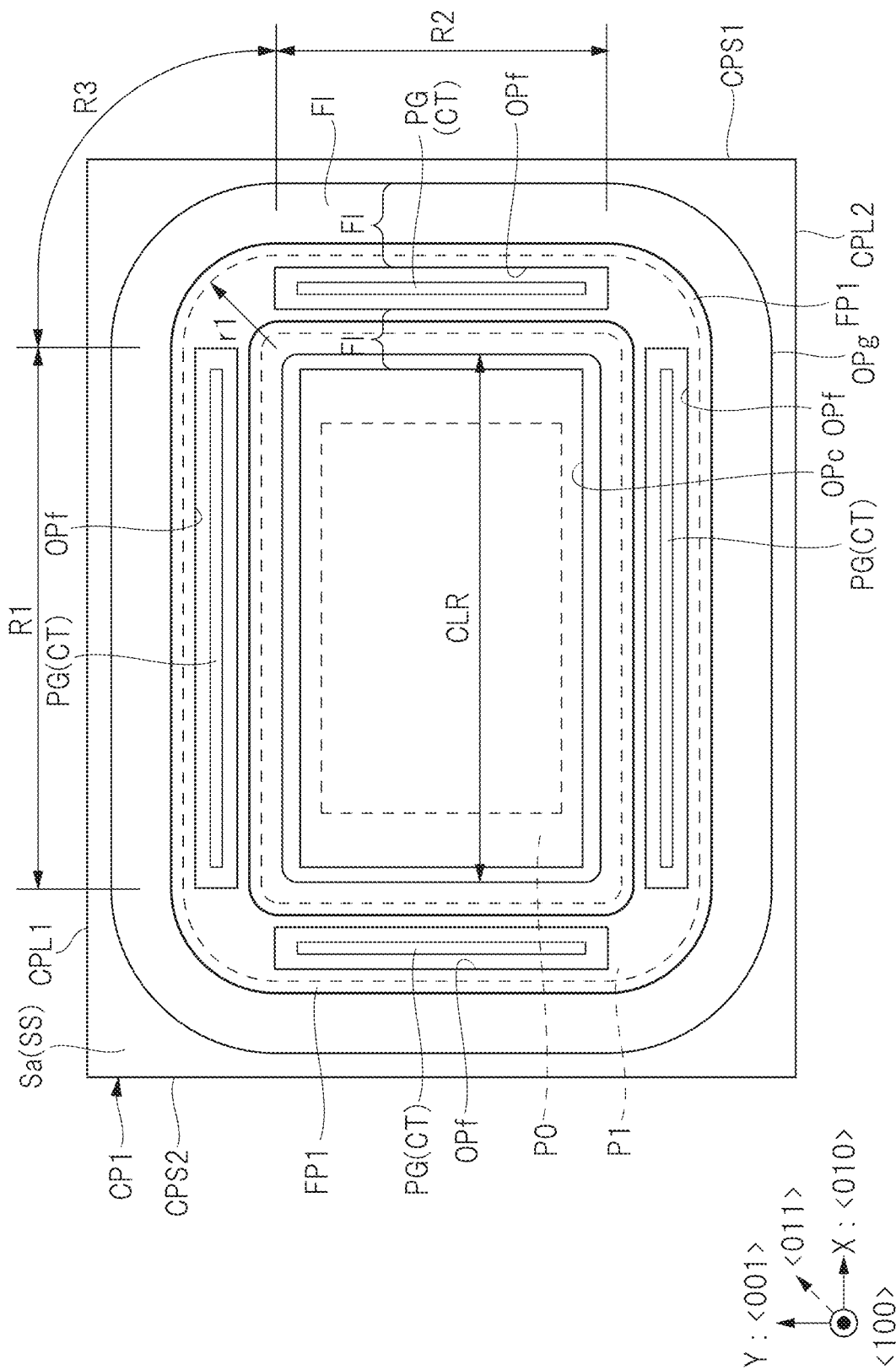
FIG. 5 is a plan view of a principal part of the semiconductor device according to the first embodiment.
Figure 6:
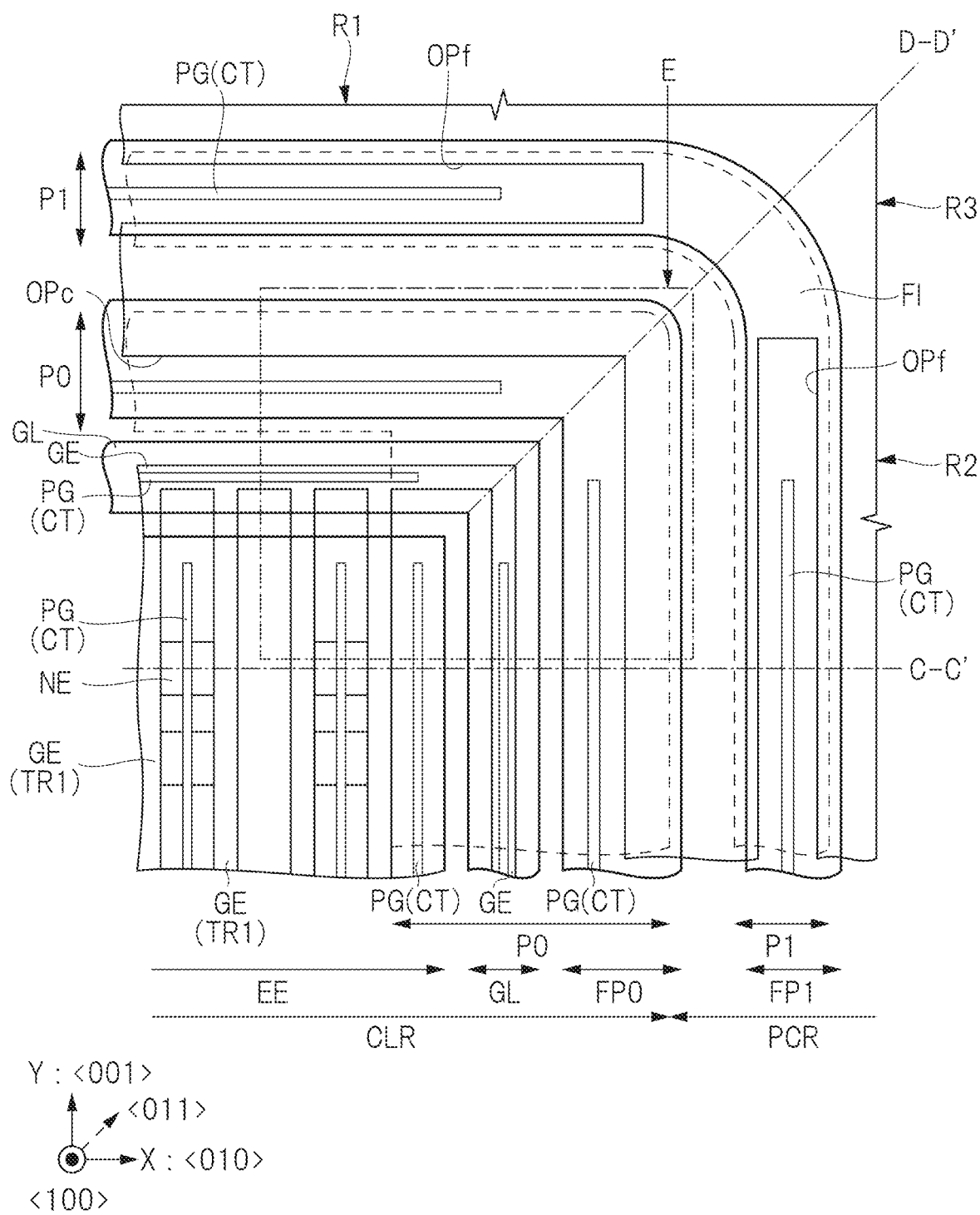
FIG. 6 is an enlarged plan view in a portion A of FIG. 1.
Figure 7:
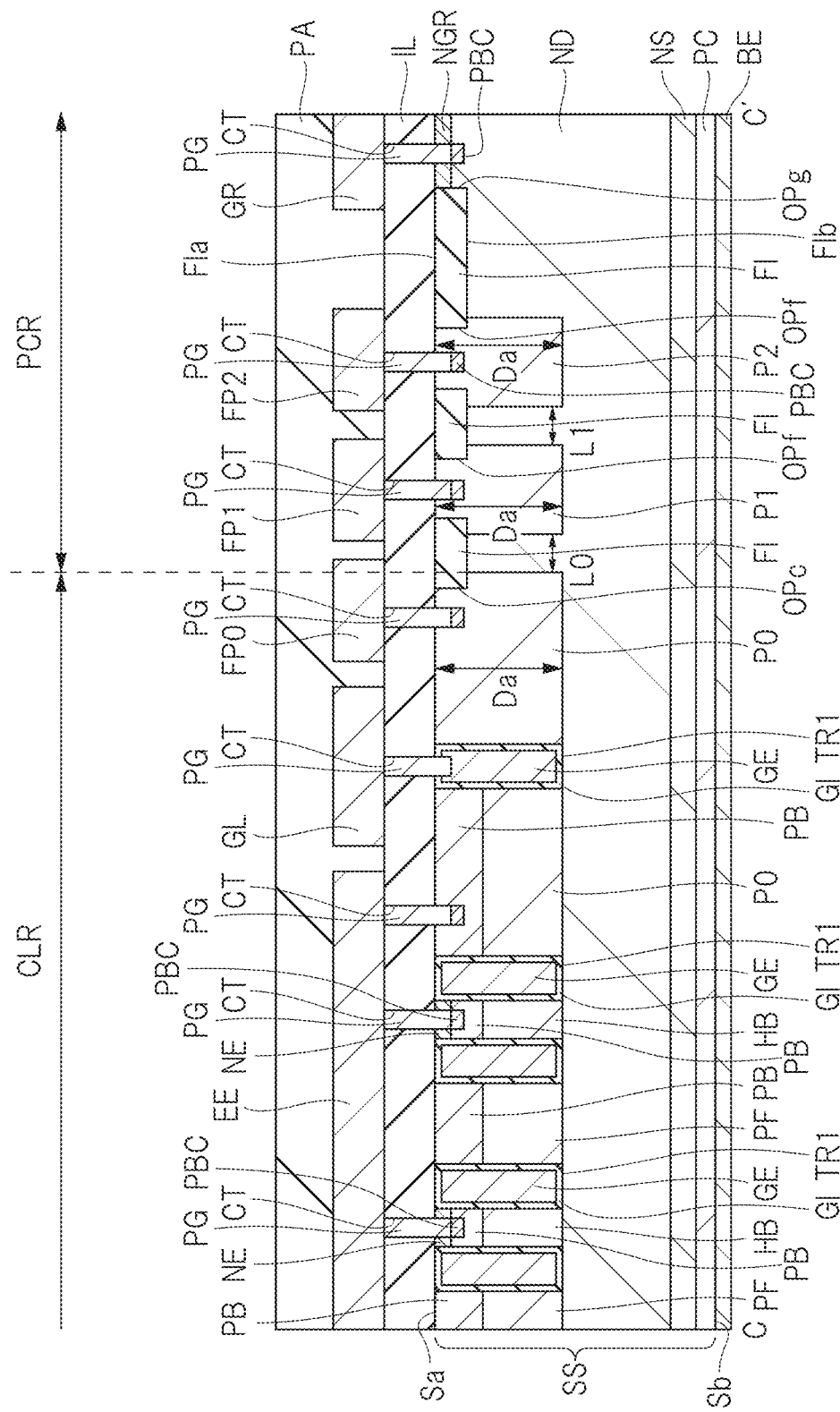
FIG. 7 is a cross-sectional view taken along a line C-C' of FIG. 6.
Figure 8:
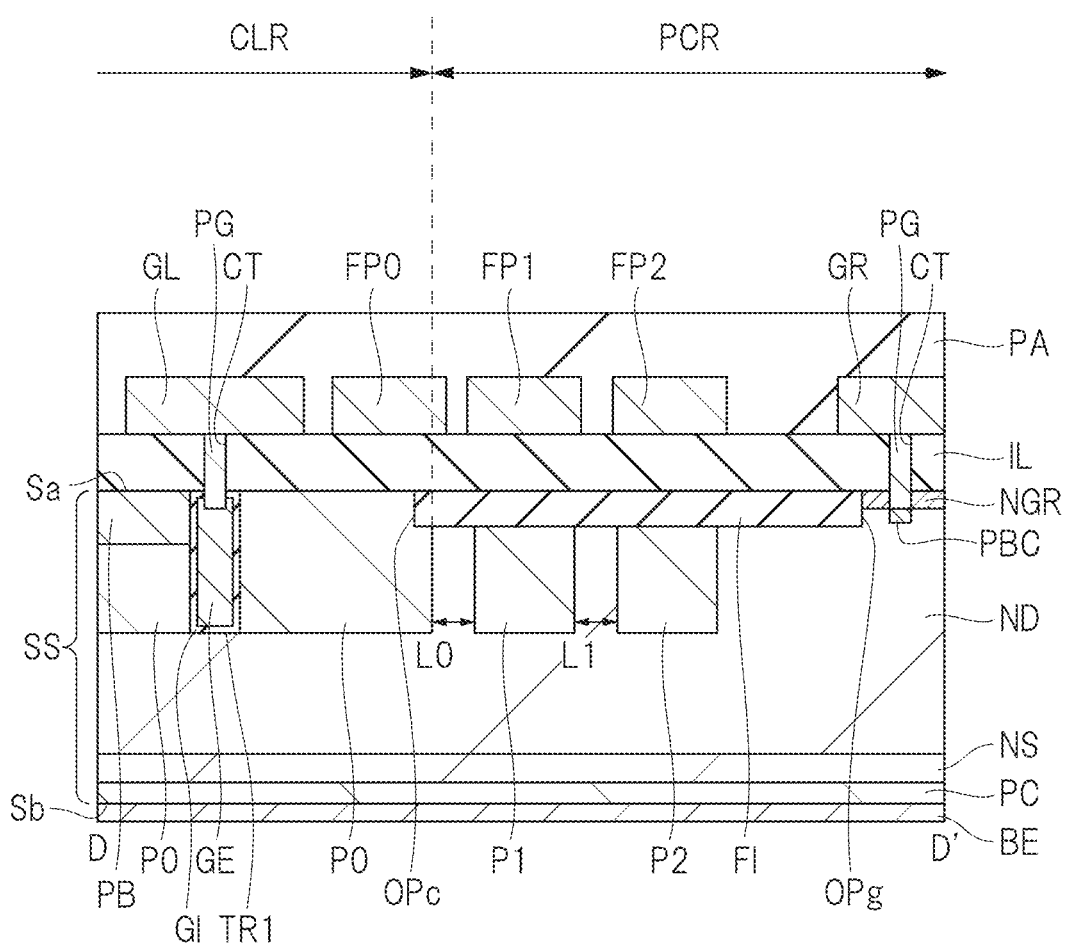
FIG. 8 is a cross-sectional view taken along a line D-D' of FIG. 6.

FIG. 5 is a plan view of a principal part of the semiconductor device according to the first embodiment. FIG. 5 particularly shows an overall shape of the field plate FP1, and the field plates FP0 and FP2 are omitted. FIG. 6 is an enlarged plan view in a portion A of FIG. 1. FIG. 7 is a cross-sectional view taken along a line C-C' of FIG. 6. That is, FIG. 7 is a cross-sectional view in a linear region R2. FIG. 8 is a cross-sectional view taken along a line D-D' of FIG. 6. That is, FIG. 8 is a cross-sectional view in the corner region R3. FIG. 7 and FIG. 8 show the field plates FP1 and FP2 and the guard ring GR in a peripheral region PCR; however, FIG. 6 omits the field plate FP2 and the guard ring GR in the peripheral region PCR.

As shown in FIG. 5, a cell region (element forming region) CLR is provided at a center of the semiconductor substrate SS, and each of the field plate FP1 and the p-type well region P1 is composed into a closed annular shape having a predetermined width, and surrounds an entire periphery of the cell region CLR. Each of the field plate FP1 and the p-type well region P1 includes: linear regions R1 which extend in parallel to the long sides CPL1 and CPL2; the linear regions R2 which extend in parallel to the short sides CPS1 and CPS2; and the corner regions (connection regions) R3 located between the linear regions R1 and R2. In each of the linear regions R1, the field plate FP1 and the p-type well region P1 extend in, for example, the <010> direction. Also, in each of the linear regions R2, the field plate FP1 and the p-type well region P1 extend in, for example, the <001> direction. In the corner region R3, the field plate FP1 and the p-type well region P1 have arc shapes having predetermined widths, one ends thereof are connected to the field plate FP1 and the p-type well region P1 which are provided in the linear region R1 and the other ends thereof are connected to the field plate FP1 and the p-type well region P1 which are provided in the linear region R2. The field plate FP1 has, in an entire periphery thereof, a region overlapping the p-type well region P1. Further, in the linear regions R1 and R2, the openings OPf provided in the field insulating film FI are disposed so as to overlap the field plate FP1 and the p-type well region P1; however, the opening OPf is not provided in the corner regions R3. Namely, the opening OPf provided in the linear region R1 and the opening OPf provided in the linear region R2 are divided from each other in the corner region R3. By adopting such a structure, the occurrence of the large dislocation loop DL1 can be prevented because the sidewall of the field insulating film FI is not in contact with the crystal plane (011) of the semiconductor substrate SS. Moreover, similarly, a plug electrode PG or the contact trench CT provided in the linear region R1 and a plug electrode PG or the contact trench CT provided in the linear region R2 are divided from each other in the corner region R3.

Note that, as apparent from FIG. 4, the range of θ1=±15° from the <011> direction is sufficient as a region for the division, and thus an opening OPf having an arc shape may extend from the linear region R1 or R2 to the corner region R3.

Moreover, as shown in FIG. 5, the field insulating film FI has an opening OPc that exposes the cell region CLR. In the cell region CLR, an inside of the opening OPc of the field insulating film FI is an active region for cell formation. Inside the cell region CLR, a closed annular p-type well region P0 is provided at an end portion of the cell region CLR. Note that an end portion of the p-type well region P0, which is close to the p-type well region P1, coincides with the end portion of the cell region CLR.

Moreover, the field insulating film FI has an opening OPg that exposes a main surface Sa of the semiconductor substrate SS, which includes the long sides CPL1 and CPL2 and the short sides CPS1 and CPS2. An n-type semiconductor region NGR to be described later is formed in the main surface Sa of the semiconductor substrate SS exposed in the opening OPg. An inside of the opening OPg of the field insulating film FI is an active region for forming the guard ring. Note that, though not shown in FIG. 5, the field plate FP2 and the p-type well region P2 have similar structures to those of the field plate FP1 and the p-type well region P1.

Moreover, an opening OPf provided between the field plate FP2 and the p-type well region P2 also has a similar shape to that of the opening OPf provided between the field plate FP1 and the p-type well region P1.

Next, structures of the cell region CLR and the peripheral region (termination region) PCR will be described with reference to FIGS. 5 to 8.

As shown in FIG. 7, the cell region CLR includes the emitter electrode EE, the gate wiring GL and the field plate FP0, and the peripheral region PCR includes the field plates FP1 and FP2 and the guard ring GR. The main surface Sa of the semiconductor substrate SS in the peripheral region PCR is basically covered with the field insulating film FI. However, the openings OPf and OPg are provided in regions corresponding to the p-type well regions P1 and P2 and the n-type semiconductor region NGR. The field insulating film FI is embedded in an inside of the semiconductor substrate SS. The field insulating film FI has an upper surface FIa and a bottom surface FIb which are opposite to each other in a thickness direction thereof, the upper surface FIa substantially flush with the main surface Sa of the semiconductor substrate SS, and the bottom surface FIb is located at a position closer to a back surface Sb of the semiconductor substrate SS by a film thickness of the field insulating film FI from the main surface Sa. Moreover, in other words, the bottom surface FIb is located inside the semiconductor substrate SS, and the upper surface FIa is exposed from the main surface Sa of the semiconductor substrate SS.

The cell region CLR is basically exposed from the field insulating film FI, and is not covered with the field insulating film FI. As shown in FIG. 5, the cell region CLR is formed in the active region for cell formation defined by the opening OPc of the field insulating film FI. Namely, the periphery of the cell region CLR is surrounded by the closed field insulating film FI. However, since the cell region CLR is defined as including the end portion of the p-type well region P0 on the side closer to the p-type well region P1, apart of the cell region CLR overlaps the field insulating film FI as shown in FIGS. 5 and 7. In other words, the end portion of the p-type well region P0 on the side closer to the p-type well region P1 is terminated on the bottom surface FIb of the field insulating film FI. Moreover, the cell region CLR includes the gate wiring GL.

As shown in FIGS. 6 and 7, in the cell region CLR, a plurality of insulated gate bipolar transistors (IGBTs) are arranged in a matrix. Also, a periphery of the plurality of IGBTs is surrounded by the closed annular p-type well region P0. Furthermore, the periphery of the plurality of IGBTs is surrounded by the closed field insulating film FI (refer to FIG. 5). The p-type well region P0 includes a p-type well region P0 electrically connected to the field plate FP0 and a p-type well region P0 electrically connected to the emitter electrode EE, and the gate electrode GE connected to the gate wiring GL is provided therebetween. Note that, as shown in FIG. 1, the field plate FP0 is connected to the emitter electrode EE.

The IGBTs are formed on the semiconductor substrate SS, and each have the emitter electrode EE, the gate electrode GE and a back electrode (collector electrode) BE. The semiconductor substrate SS is composed of an n-type single crystal silicon substrate, which is formed by the FZ method or the MCZ method and to which n-type impurities such as phosphorus (P) are introduced. The semiconductor substrate SS has the main surface Sa that is one surface and the back surface Sb that is a surface opposite to the main surface Sa, and the main surface Sa is a (100) plane.

On the side closer to the back surface Sb of the semiconductor substrate SS, a p-type collector layer (p-type semiconductor region) PC with a predetermined thickness is formed. In addition, on the back surface Sb of the semiconductor substrate SS, the back electrode (collector electrode) BE is formed so as to be in contact with the p-type collector layer PC.

Moreover, on a surface of the p-type collector layer PC, which is opposite to the surface on which the back electrode BE is formed, an n-type field stop layer (n-type semiconductor region) NS is formed so as to be in contact with the p-type collector layer PC.

The back electrode BE can be formed of, for example, a stacked film including an aluminum (Al) layer, a titanium (Ti) layer, a nickel (Ni) layer and a gold (Au) layer in order from the back surface Sb of the semiconductor substrate SS.

As shown in FIG. 7, the n-type drift region (n-type semiconductor region) ND is formed on the n-type field stop layer NS.

In the semiconductor substrate SS, a plurality of trenches TR1 which extend from the main surface Sa in a depth direction (thickness direction) of the semiconductor substrate SS and reach the n-type drift region ND are formed, and the gate electrode GE is embedded in each of the trenches TR1 with a gate insulating film GI interposed therebetween. Each of the gate electrodes GE is composed of a conductor film such as a doped polysilicon film (for example, a doped polysilicon film into which phosphorus or the like is introduced). As shown in FIG. 6, the trenches TR1 and the gate electrodes GE embedded therein extend in the Y direction (<001> direction). The plurality of gate electrodes GE are coupled to one another at end portions thereof, and are electrically connected to the gate wiring GL via the plug electrode PG.

As shown in FIG. 7, "active cell regions" and "inactive cell regions" are alternately arranged between the adjacent gate electrodes GE. Also, in each of the active cell regions, an n-type emitter region (n-type semiconductor region) NE, a p-type body region (p-type semiconductor region) PB and an n-type hole barrier region (n-type semiconductor region) HB are provided in the semiconductor substrate SS in order from the main surface Sa. Further, the n-type hole barrier region (n-type semiconductor region) HB is in contact with the n-type drift region ND. In addition, in the inactive cell region, a p-type body region PB and a p-type floating region (p-type semiconductor region) PF are provided in the semiconductor substrate SS in order from the main surface Sa. Moreover, the p-type body region PB provided in the active cell region serves as a channel forming region of the IGBT, and a current flows through the active cell region.

An impurity concentration of the n-type drift region ND is lower than an impurity concentration of each of the n-type field stop layer NS, the n-type emitter region NE and the n-type hole barrier region HB. The n-type drift region ND has a function to extend a depletion layer that extends from the main surface Sa of the semiconductor substrate SS and to ensure the breakdown voltage. The n-type field stop layer NS has an impurity concentration higher than that of the n-type drift region ND, and has a function to prevent the depletion layer, which extends from the main surface Sa of the semiconductor substrate SS, from reaching the p-type collector layer PC.

The interlayer insulating film IL composed of, for example, a silicon oxide film is formed on the main surface Sa of the semiconductor substrate SS, and the gate electrode GE is covered with the interlayer insulating film IL. The emitter electrode EE composed of a metal film containing, for example, aluminum (Al) as a main component is formed on the interlayer insulating film IL. On the interlayer insulating film IL, the insulating film (protective insulating film) PA that is a surface protection film is formed so as to cover the emitter electrode EE. The insulating film PA is composed of, for example, a polyimide-based organic insulating film (resin film).

The contact trench CT penetrates the interlayer insulating film IL, and further reaches the inside of the semiconductor substrate SS. For example, a bottom surface of the contact trench CT reaches an interface between the n-type emitter region NE and the p-type body region PB. Also, the plug electrode PG is embedded in the contact trench CT. The plug electrode PG may be composed of the metal film that constitutes the emitter electrode EE, or may be composed of a stacked structure of, for example, a barrier metal film made of titanium tungsten (TiW) or titanium nitride (TiN) and a main conductor film made of tungsten or the like.

As shown in FIGS. 5 to 8, the peripheral region PCR is disposed so as to surround the entire periphery of the cell region CLR. The peripheral region PCR includes the p-type well regions P1 and P2, the n-type semiconductor region NGR, the field plates FP1 and FP2 and the guard ring GR. The p-type well regions P1 and P2 are closed annular p-type semiconductor regions, the p-type well region P1 surrounds the cell region CLR, and the p-type well region P2 surrounds the p-type well region P1. The n-type semiconductor region NGR is a closed annular n-type semiconductor region, and surrounds the p-type well region P2. The p-type well regions P0, P1 and P2 have an equal depth Da, and an interval L1 between the p-type well region P1 and the p-type well region P2 is substantially equal to an interval L0 between the p-type well region P0 and the p-type well region P1, or the interval L1 is a little larger than the interval L0. As shown in FIGS. 7 and 8, the p-type well regions P0, P1 and P2 have the equal depth Da in the linear regions R1 and R2 and the corner region R3. This point will be described later.

The field insulating film FI embedded in the semiconductor substrate SS has the openings OPf at positions which overlap the p-type well regions P1 and P2. A width of the openings OPf is narrower than the width of the p-type well region P1 or the p-type well region P2, and end portions of the p-type well regions P1 and P2 are terminated on the bottom surface FIb of the field insulating film FI. The end portions of the p-type well regions P0, P1 and P2 are terminated on the bottom surface of the field insulating film FI, whereby a PN junction breakdown voltage between the p-type well region P0, P1 or P2 and the n-type drift region ND can be enhanced.

The field plates FP1 and FP2 and the guard ring GR are closed annular metal films provided on the interlayer insulating film IL, and are respectively connected to the p-type well regions P1 and P2 and the n-type semiconductor region NGR through the plug electrodes PG. Note that the guard ring GR is connected to the n-type drift region ND through the n-type semiconductor region NGR. Here, the contact trenches CT and the plug electrodes PG provided in the interlayer insulating film IL are located in the opening OPf or OPg provided in the field insulating film FI. By adopting such a configuration, it becomes possible to form the contact trenches CT in the cell region CLR and the peripheral region PCR in the same step. For example, when whole areas of the p-type well regions P1 and P2 are covered with the field insulating film FI, the contact trenches CT in the cell region CLR must be formed in a different step from that for the contact trench CT in the peripheral region PCR, and there is a disadvantage that manufacturing steps are increased.

In the first embodiment, as shown in FIGS. 5, 6 and 8, the opening OPf is not provided in the field insulating film FI in the corner region R3 of the semiconductor substrate SS. Namely, as shown in FIG. 8, in the corner region R3, the whole areas of the p-type well regions P1 and P2 are covered with the field insulating film FI. Moreover, in the corner region R3, the plug electrode PG and the contact trench CT, which connect the p-type well region P1 or P2 and the field plate FP1 or FP2 to each other, are not provided.

As described with reference to FIG. 5, the opening OPf is not present in the corner region R3, and accordingly, the sidewall of the field insulating film FI is not in contact with the crystal plane (011) of the semiconductor substrate SS, and the occurrence of the large dislocation loop DL1 can be prevented.

Note that, though the opening OPf between the p-type well region P1 and the field plate FP1 has been described with reference to FIGS. 5 and 6, the same also applies to the opening OPf between the p-type well region P2 and the field plate FP2. Moreover, though the one corner region R3 of the semiconductor substrate SS has been described as an example, the same also applies to the other three corner portions.

<Manufacturing Method of Semiconductor Device>

Figure 19:
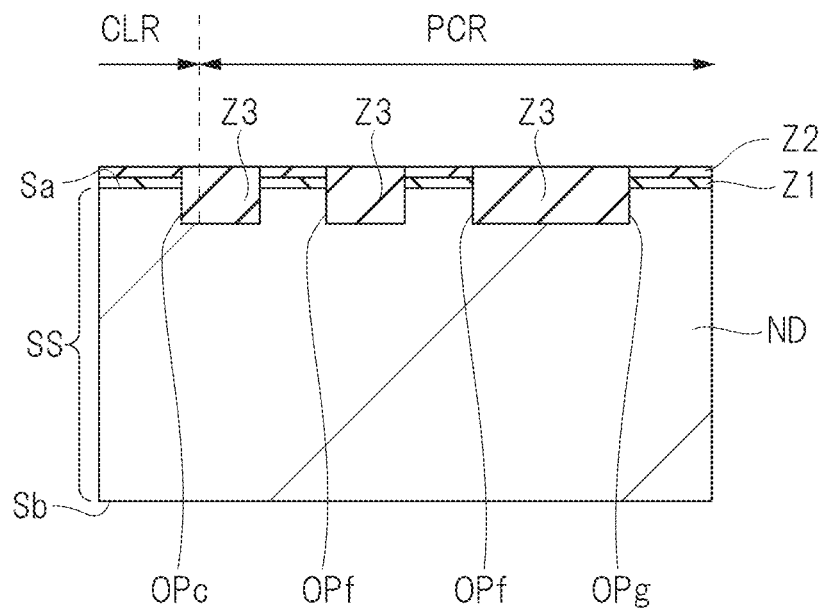
FIG. 19 is a cross-sectional view showing the manufacturing process of the field insulating film according to first embodiment.
Figure 20:
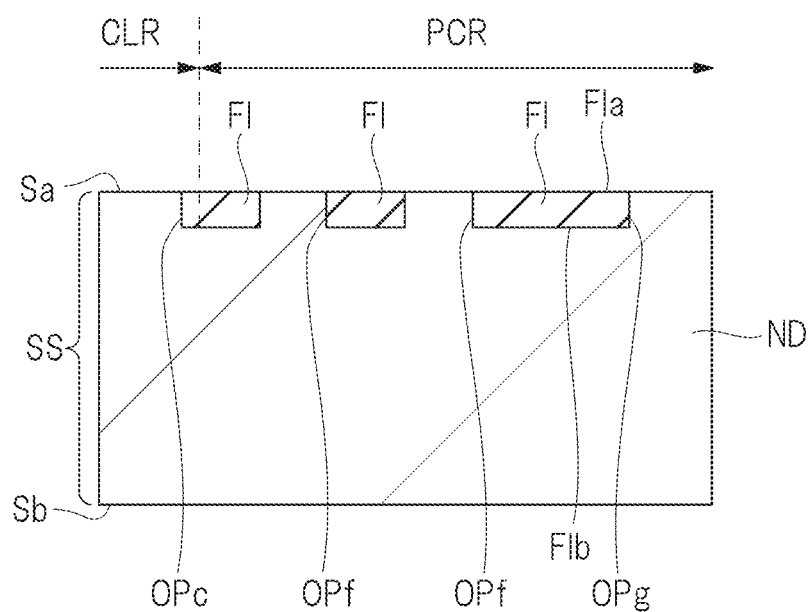
FIG. 20 is a cross-sectional view showing the manufacturing process of the field insulating film according to first embodiment.
Figure 21:
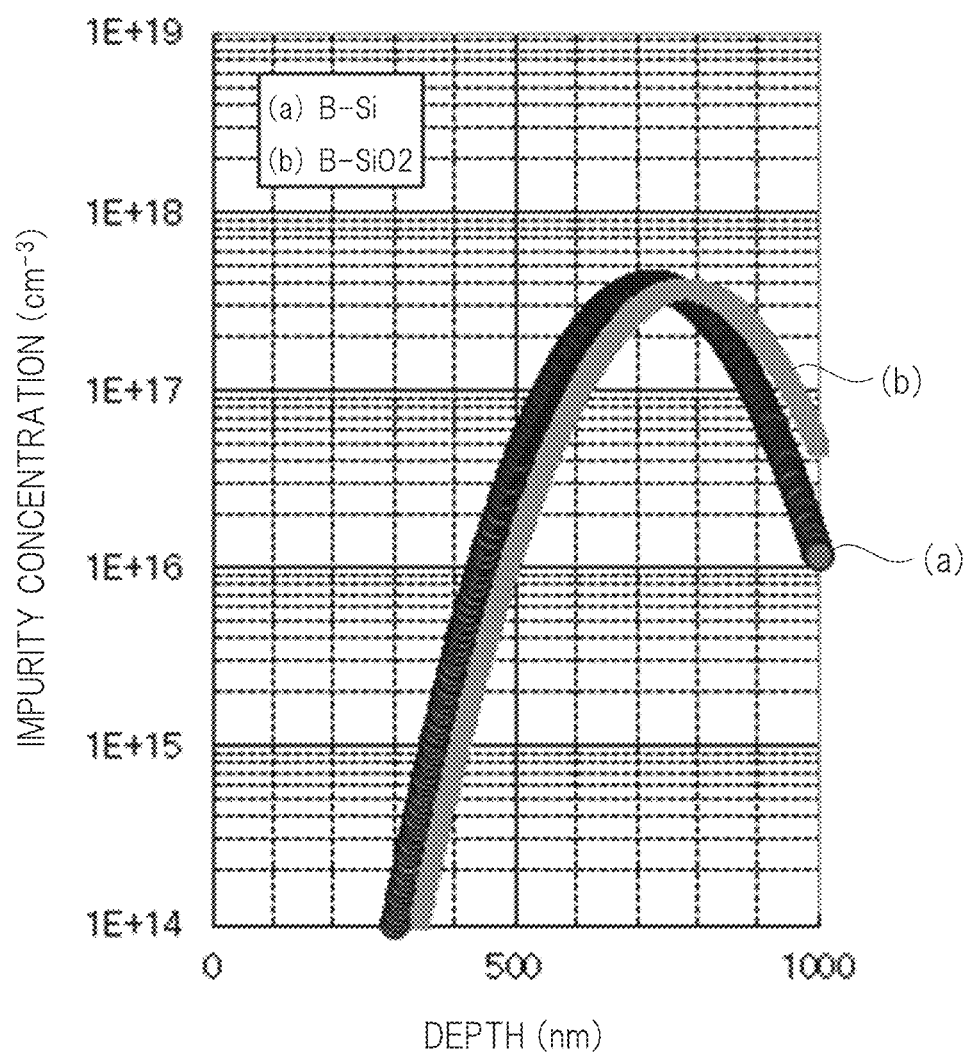
FIG. 21 is a diagram showing an impurity profile in an ion implantation step.
Figure 22:
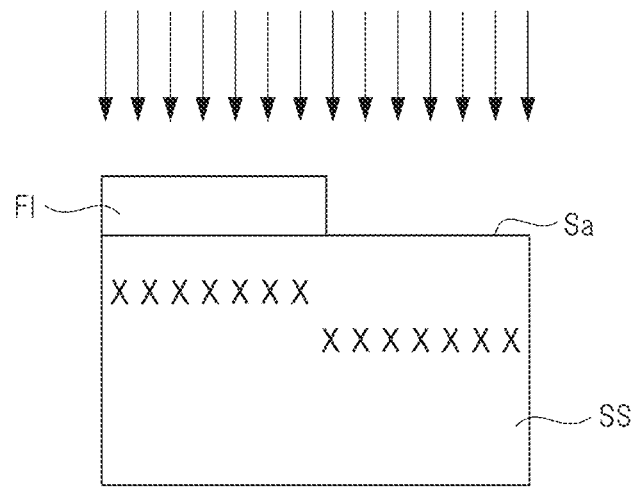
FIG. 22 is a cross-sectional view showing a manufacturing method of a p-type well region in a comparative example 1.
Figure 23:
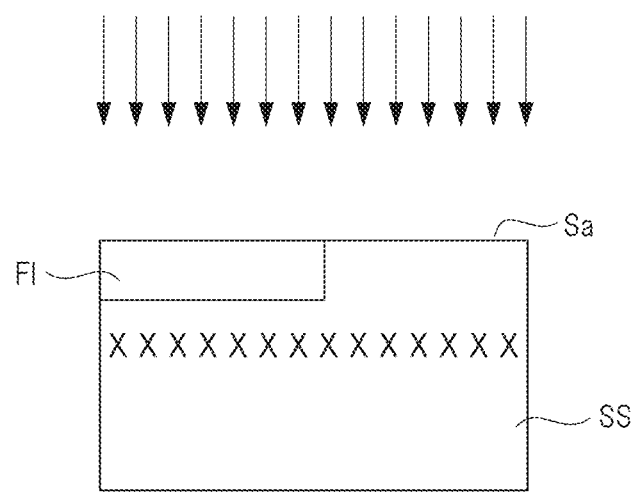
FIG. 23 is a cross-sectional view showing a manufacturing method of a p-type well region according to the first embodiment.

Next, a manufacturing method of the semiconductor device according to the first embodiment will be described with reference to FIGS. 9 to 23. FIGS. 9 to 16 are cross-sectional views of the semiconductor device according to first embodiment during a manufacturing process thereof, and correspond to the cross-sectional view of FIG. 7. However, FIG. 12 corresponds to the cross-sectional view of FIG. 8. FIGS. 17 to 20 are cross-sectional views showing a manufacturing process of the field insulating film according to the first embodiment, FIG. 21 is a diagram showing an impurity profile in an ion implantation step, FIG. 22 is a cross-sectional view showing a manufacturing method of a p-type well region in a comparative example 1, and FIG. 23 is a cross-sectional view showing a manufacturing method of the p-type well region according to the first embodiment.

Figure 9:
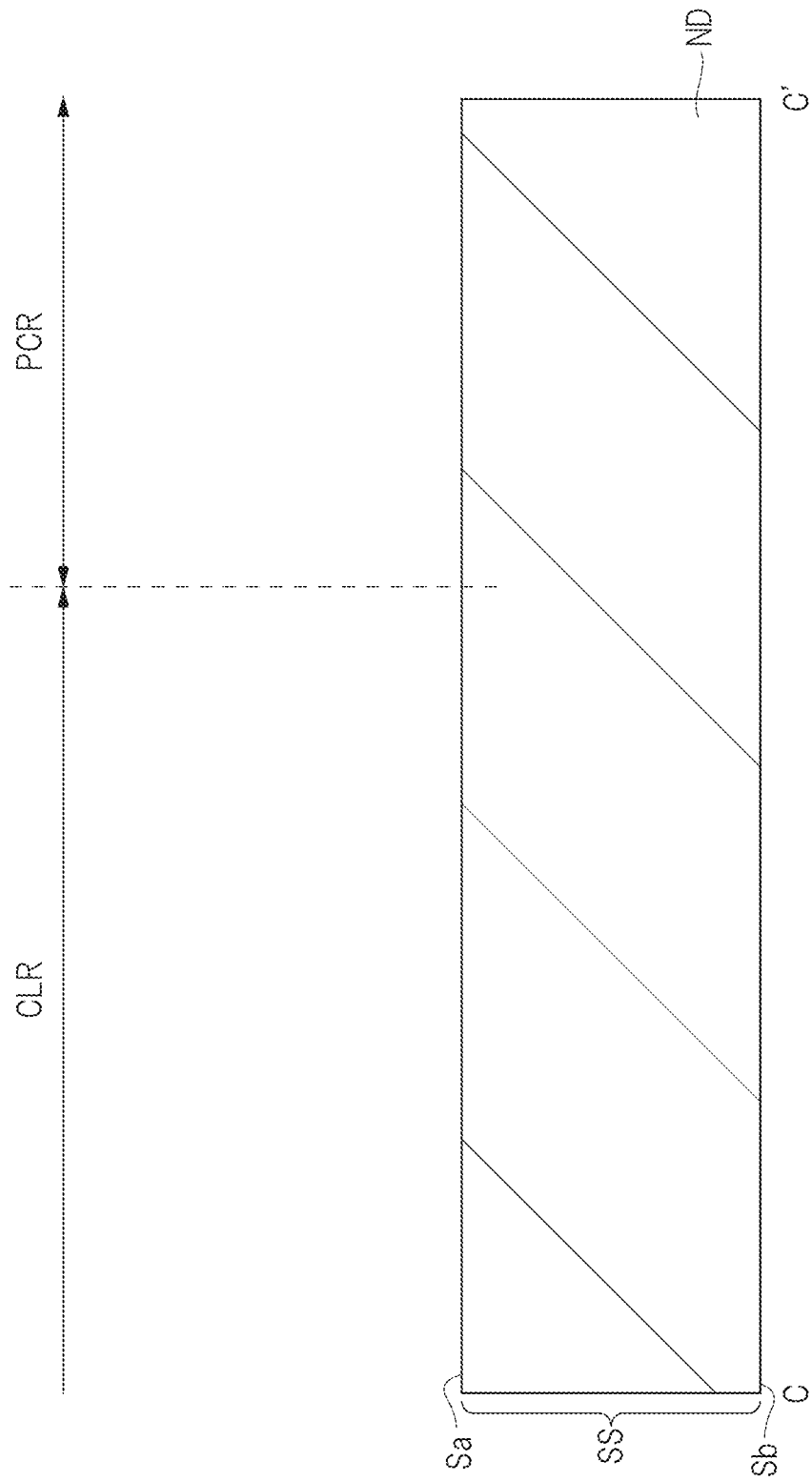
FIG. 9 is a cross-sectional view of the semiconductor device according to the first embodiment during a manufacturing process thereof.

First, as shown in FIG. 9, the semiconductor substrate SS having the main surface Sa and the back surface Sb is prepared. The semiconductor substrate SS is formed by the FZ method or the MCZ method, and the main surface thereof is a (100) plane. Moreover, n-type impurities are introduced into the semiconductor substrate SS, and an impurity concentration thereof can be set to, for example, approximately $2 \times 10^{14}$ cm$^{-3}$. Moreover, the semiconductor substrate SS has the cell region CLR in which elements such as the IGBTs are formed and the peripheral region PCR disposed so as to surround the periphery of the cell region CLR.

Figure 10:
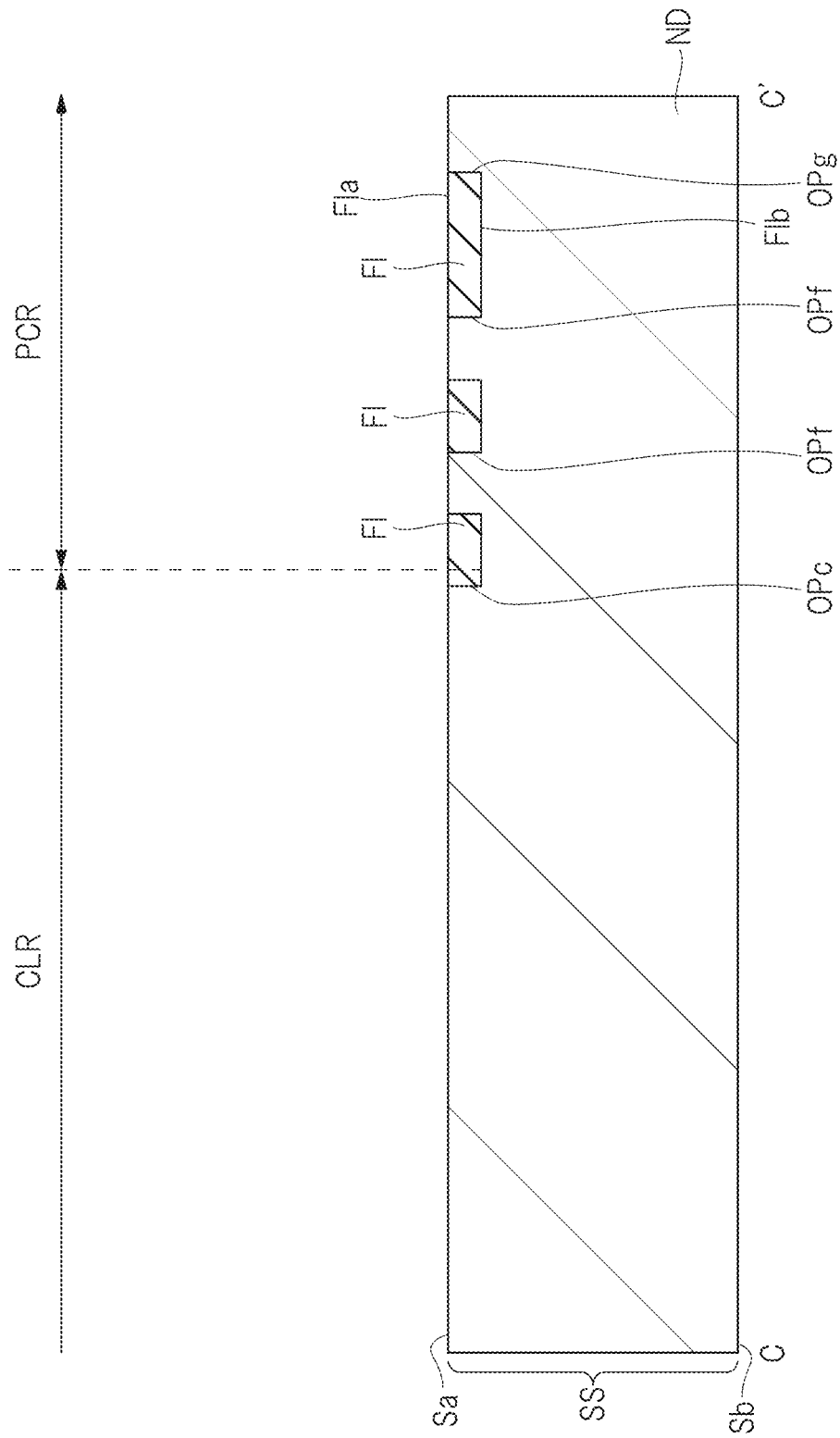
FIG. 10 is a cross-sectional view of the semiconductor device according to the first embodiment during the manufacturing process thereof.

Next, as shown in FIG. 10, the field insulating film FI is formed in the peripheral region PCR. The field insulating film FI is composed of, for example, a silicon oxide film, and has a film thickness of approximately 1 µm. Moreover, the field insulating film FI has the upper surface FIa and the bottom surface FIb. When the back surface Sb of the semiconductor substrate SS is taken as a reference, a height of the upper surface FIa is substantially equal to a height of the main surface Sa of the semiconductor substrate SS. Although manufacturing variations occur in the manufacturing process, a height variation of the upper surface FIa remains within ±20% of the film thickness of the field insulating film FI when the main surface Sa is taken as a reference. Namely, "equal height" mentioned above means a range including such a variation described above. Moreover, as mentioned above, the field insulating film FI has the opening OPc that exposes the cell region CLR, the two openings OPf which expose the forming regions of the p-type well regions P1 and P2, and the opening OPg that exposes the forming region of the n-type semiconductor region NGR.

Figure 17:
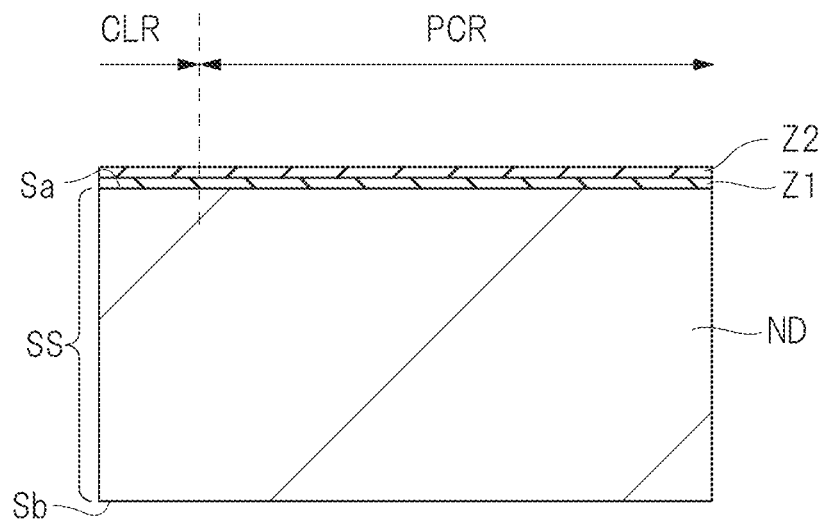
FIG. 17 is a cross-sectional view showing a manufacturing process of a field insulating film according to first embodiment.
Figure 18:
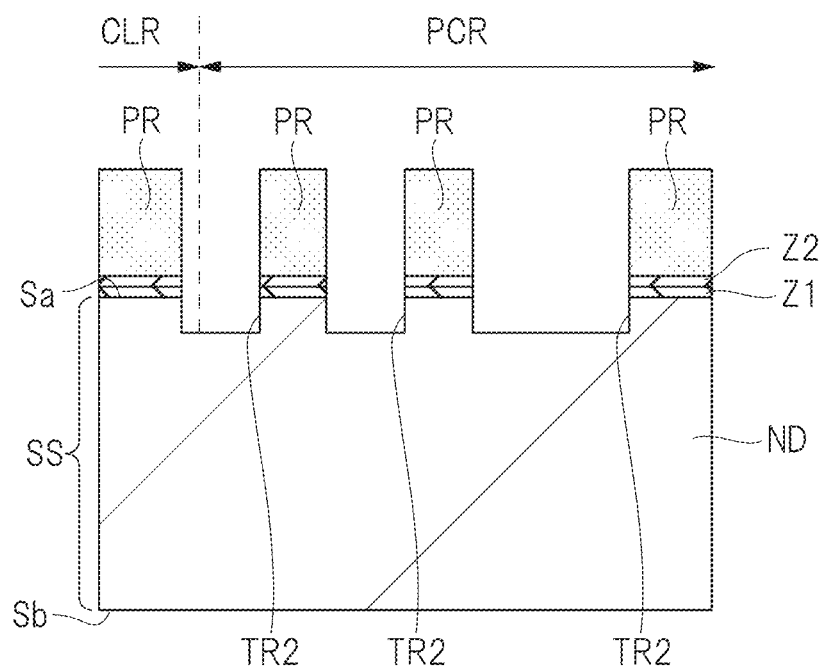
FIG. 18 is a cross-sectional view showing the manufacturing process of the field insulating film according to first embodiment.

Here, the manufacturing method of the field insulating film FI will be described with reference to FIGS. 17 to 20. First, as shown in FIG. 17, an insulating film Z1 composed of a silicon oxide film and an insulating film Z2 composed of a silicon nitride film are sequentially formed on the main surface Sa of the semiconductor substrate SS. Next, as shown in FIG. 18, in a region exposed from a photoresist film PR, the insulating films Z2 and Z1 and the semiconductor substrate SS are sequentially subjected to an etching treatment, thereby forming trenches TR2 in the semiconductor substrate SS. Next, as shown in FIG. 19, an insulating film Z3 composed of a silicon oxide film is formed in the trenches TR2 by, for example, a thermal oxidation method. Here, since a region other than the trenches TR2 is covered with the insulating film Z2 composed of a silicon nitride film, the insulating film Z3 can be selectively formed in the trenches TR2. Next, as shown in FIG. 20, the insulating films Z2 and Z1 are sequentially removed, and the field insulating film FI is completed. Note that, since the insulating film Z3 is also etched in the step of removing the insulating films Z2 and Z1, the height of the upper surface FIa of the field insulating film FI and the height of the main surface Sa of the semiconductor substrate SS can be made substantially equal to each other.

Note that, though the insulating film Z3 is formed using the thermal oxidation method in FIG. 19, the insulating film Z3 can also be formed using a chemical mechanical polishing (CMP) method. Namely, after the photoresist film PR shown in FIG. 18 is removed and a silicon oxide film is deposited in the trenches TR2 and on the insulating film Z2 by a chemical vapor deposition (CVD) method, the silicon oxide film on the insulating film Z2 is removed by the CMP method and the silicon oxide film is selectively left in the trenches TR2, whereby the insulating film Z3 can be formed.

Figure 11:
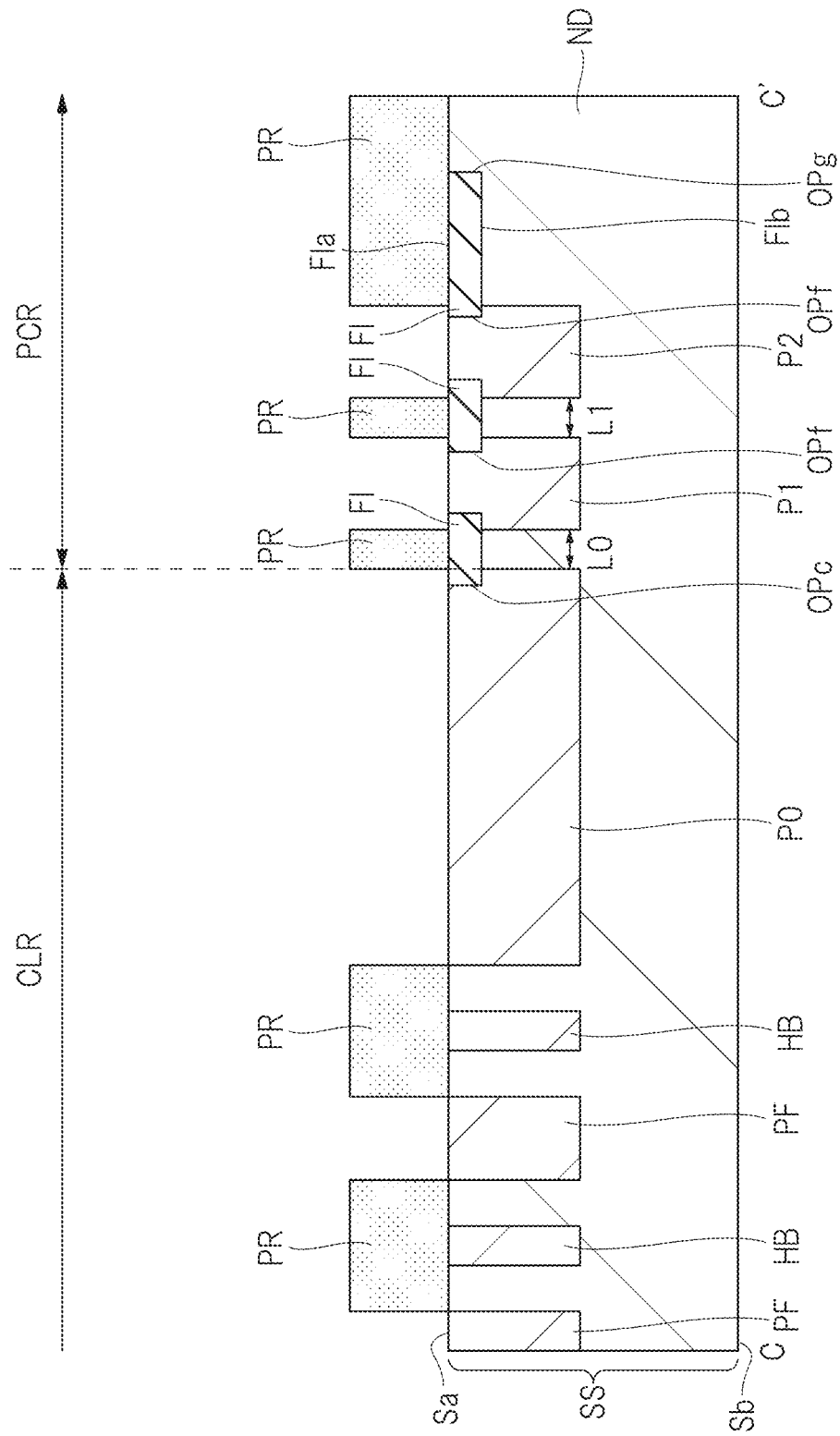
FIG. 11 is a cross-sectional view of the semiconductor device according to the first embodiment during the manufacturing process thereof.
Figure 12:
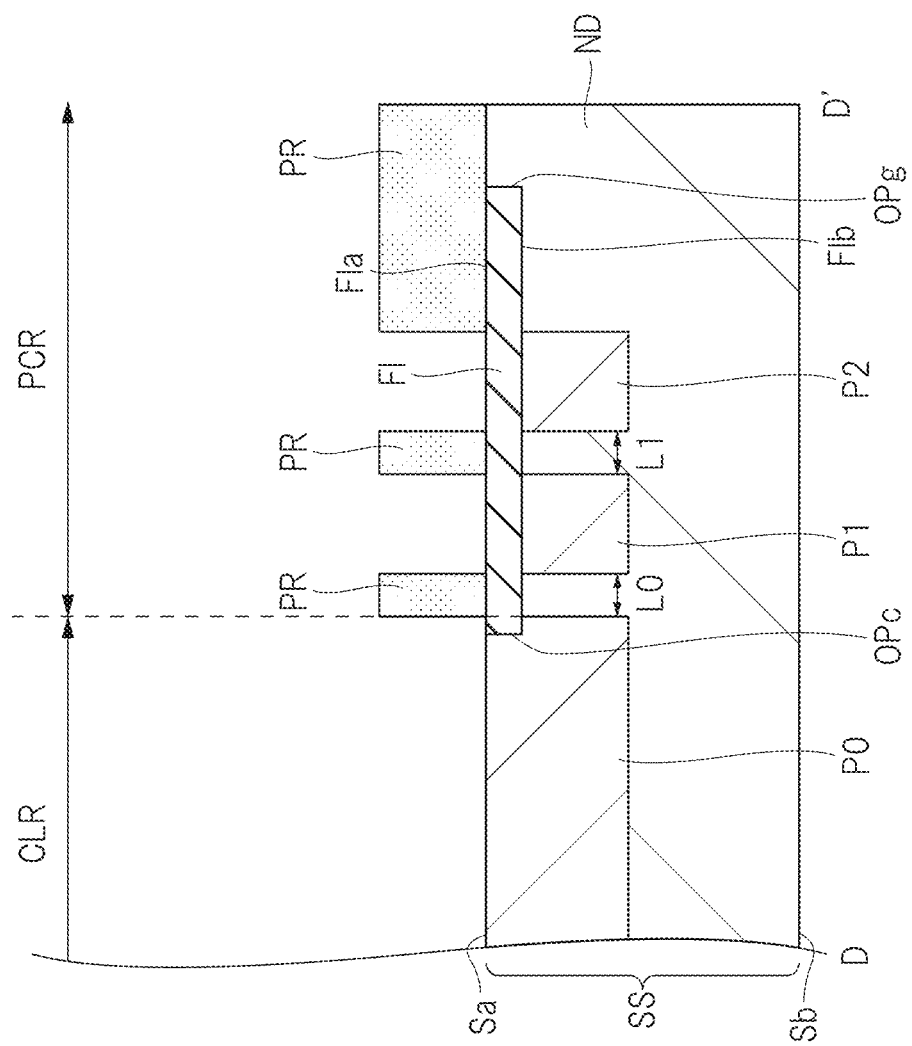
FIG. 12 is a cross-sectional view of the semiconductor device according to the first embodiment during the manufacturing process thereof.

Next, as shown in FIG. 11, n-type impurities (for example, phosphorus (P)) are introduced to form the n-type hole barrier region HB in the semiconductor substrate SS. Moreover, p-type impurities (for example, boron (B)) are introduced into the semiconductor substrate SS with using the photoresist film PR as a mask, whereby the p-type floating region PF and the p-type well region P0 are provided in the cell region CLR and the p-type well regions P1 and P2 are formed in a region of the peripheral region PCR in which the openings OPf are provided. In this case, boron (B) is ion-implanted with a high energy of approximately 2 MeV and rapid thermal anneal (RTA) is performed at approximately 1000° C., whereby the p-type floating region PF and the p-type well regions P0, P1 and P2 having a depth of approximately 3 µm are formed. Here, FIG. 12 shows a forming step of the p-type well regions P0, P1 and P2 in a cross section of the corner region R3 which corresponds to FIG. 8. Surfaces of the forming regions of the p-type well regions P1 and P2 are covered with the field insulating film FI, but boron ions are implanted through the field insulating film FI, so that the p-type well regions P1 and P2 are formed. The p-type well regions P1 and P2 are formed in the regions in which the openings OPf are provided in FIG. 11, and the p-type well regions P1 and P2 are formed in the region covered with the field insulating film FI in FIG. 12, but the p-type well regions P1 and P2 can be formed to have an equal depth in the linear region R2 shown in FIG. 11 and the corner region R3 shown in FIG. 12. This point will be described later.

Figure 13:
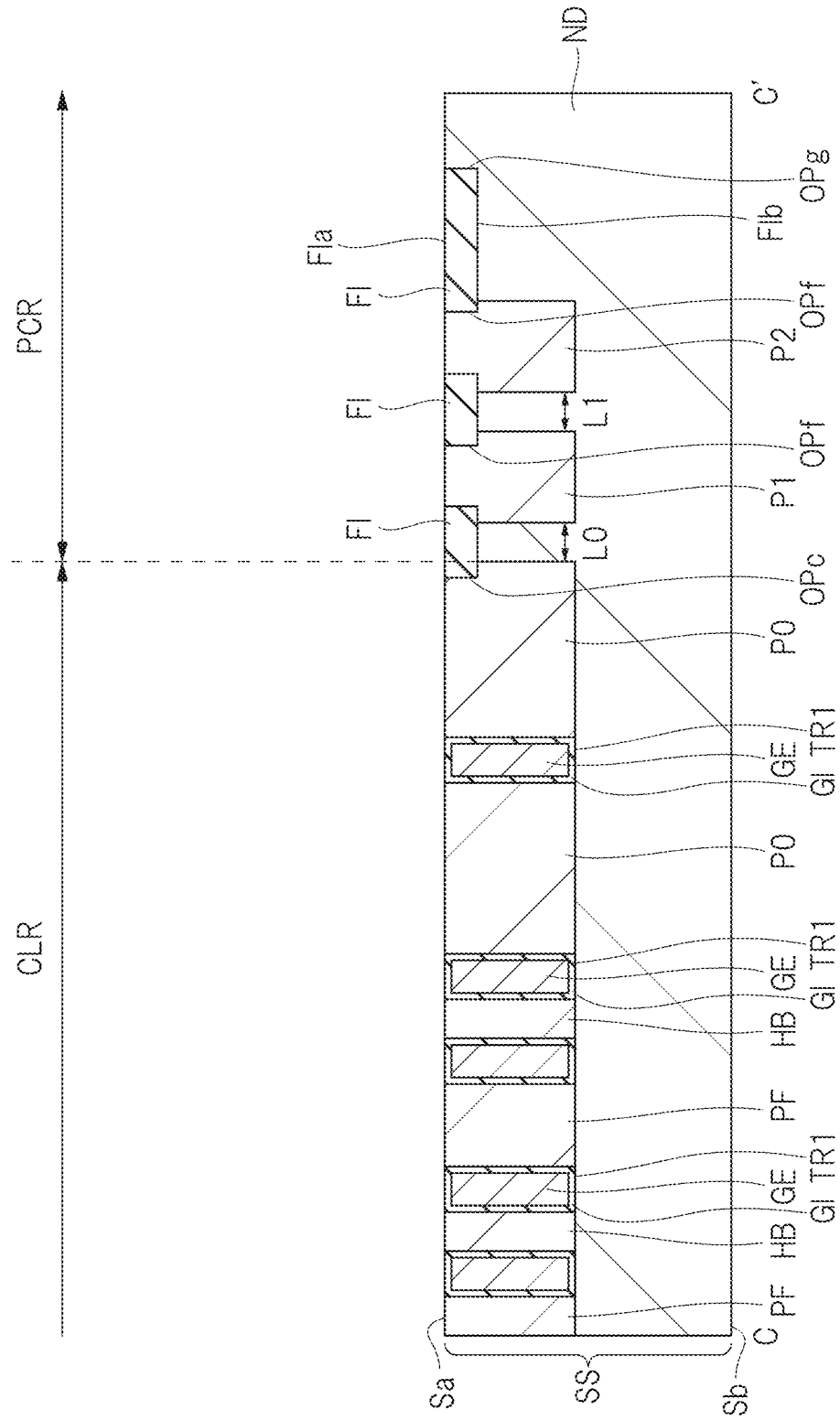
FIG. 13 is a cross-sectional view of the semiconductor device according to the first embodiment during the manufacturing process thereof.

Next, as shown in FIG. 13, the gate electrodes GE are formed. First, the trenches TR1 are formed from the main surface Sa of the semiconductor substrate SS toward the back surface Sb. A depth of the trenches TR1 is approximately 3 μm, which is substantially equal to the depth of the p-type floating region PF. Next, the gate insulating films GI, each of which is composed of a silicon oxide film, and the gate electrodes GE, each of which is composed of a doped polysilicon film, are formed in the trenches TR1. In the cell region CLR, the gate electrodes GE are formed between the n-type hole barrier region HB and the p-type floating region PF and in a center portion of the p-type well region P0.

Figure 14:
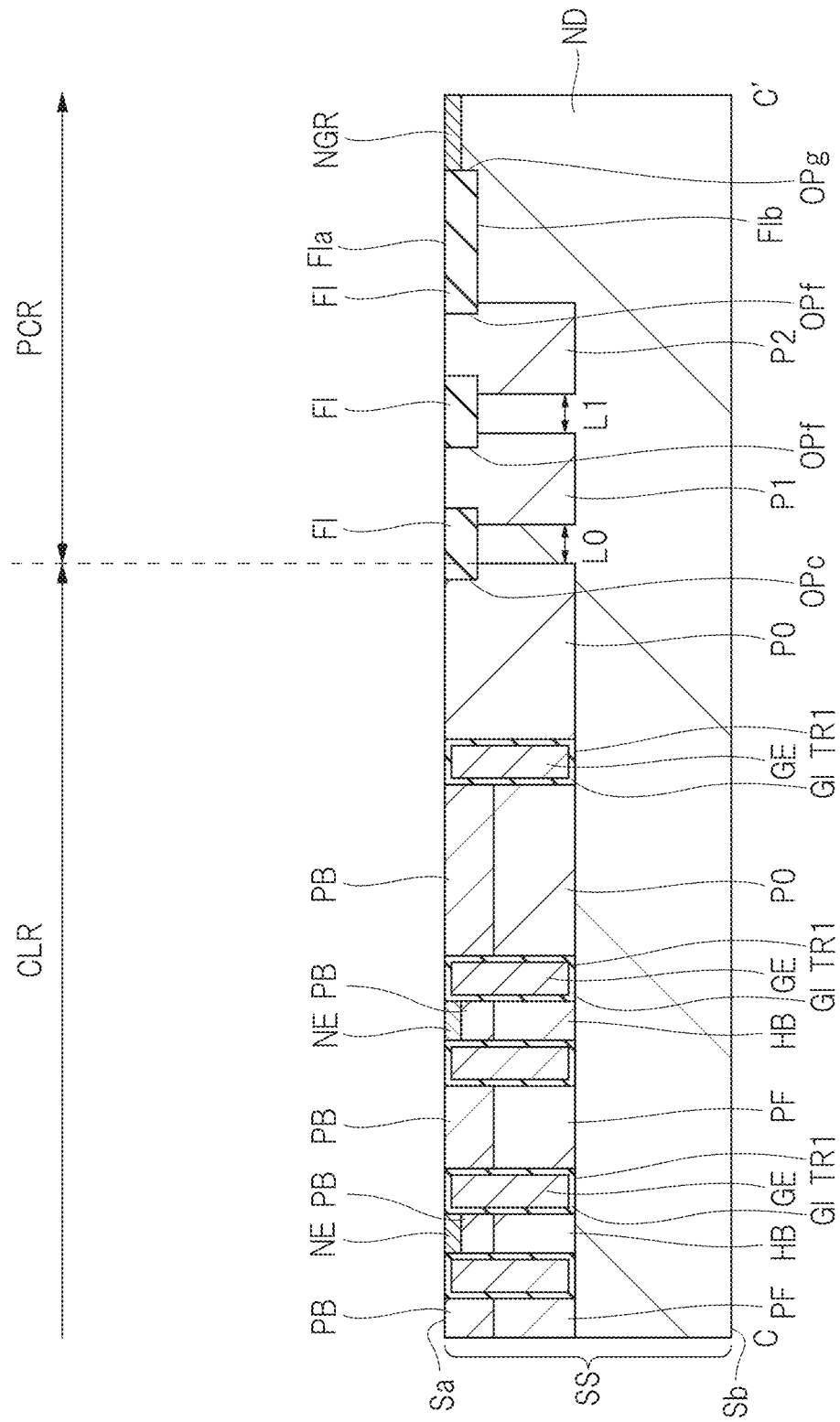
FIG. 14 is a cross-sectional view of the semiconductor device according to the first embodiment during the manufacturing process thereof.

Next, as shown in FIG. 14, in the cell region CLR, the p-type impurities are introduced between the gate electrodes GE, whereby the p-type body region PB is formed. The p-type body region PB is formed on the n-type hole barrier region HB, the p-type floating region PF and the p-type well region P0. However, the p-type body region PB is not formed on the p-type well region P0 connected to the above-mentioned field plate FP0. Next, in the cell region CLR, the n-type impurities are introduced between the gate electrodes GE, whereby the n-type emitter region NE is formed. The n-type emitter region NE is formed in the p-type body region PB formed on the n-type hole barrier region HB. Also, in the peripheral region PCR, the n-type semiconductor region NGR is formed in the main surface Sa exposed by the opening OPg of the field insulating film FI.

Figure 15:
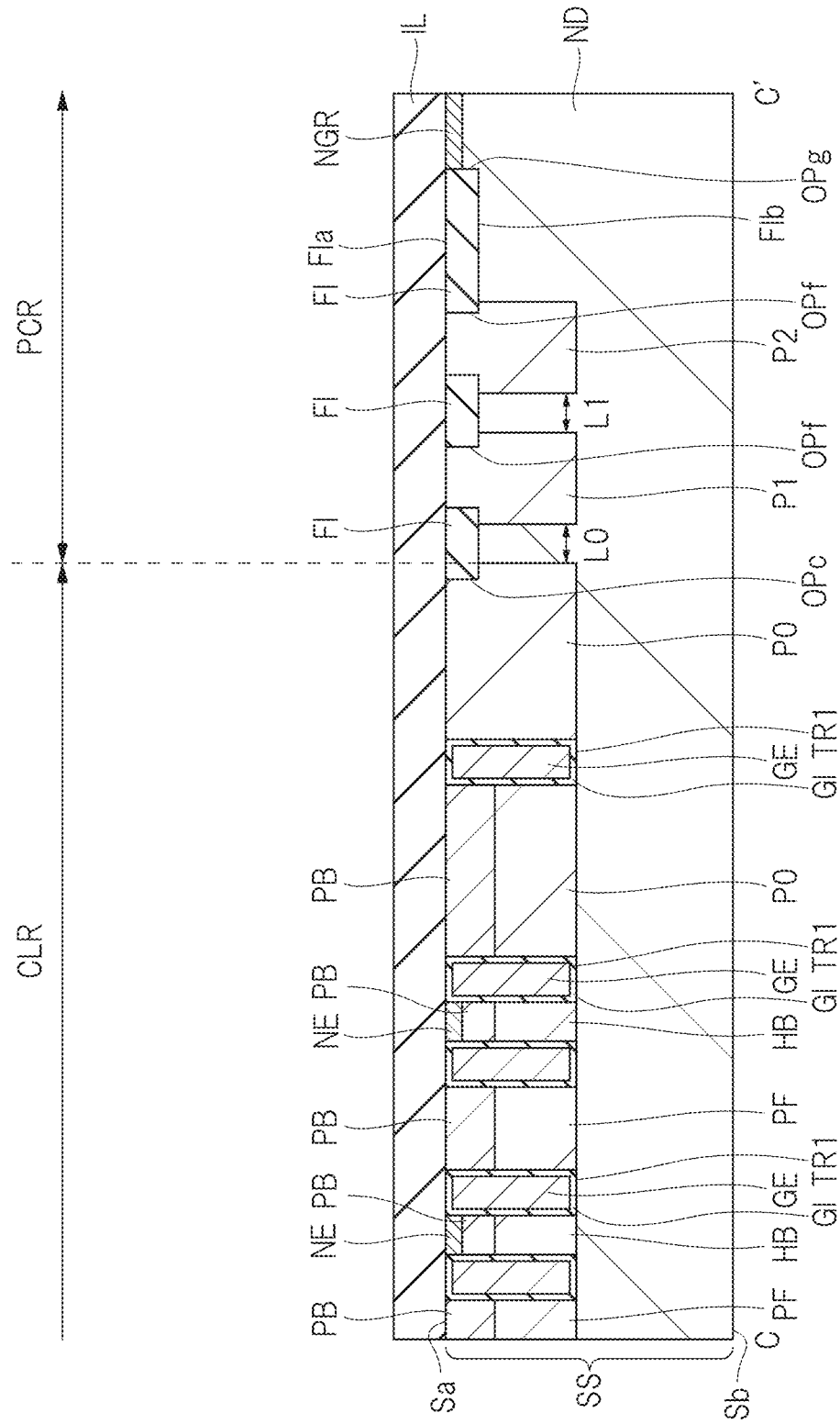
FIG. 15 is a cross-sectional view of the semiconductor device according to the first embodiment during the manufacturing process thereof.

Next, as shown in FIG. 15, the interlayer insulating film (insulating film) IL is formed on the main surface Sa so as to cover the gate electrodes GE and the field insulating film FI. The interlayer insulating film IL is composed of, for example, an insulating film such as a silicon oxide film, and can be formed using the CVD method or the like. Moreover, after the insulating film is deposited, a surface thereof may be planarized using the CMP method.

Figure 16:
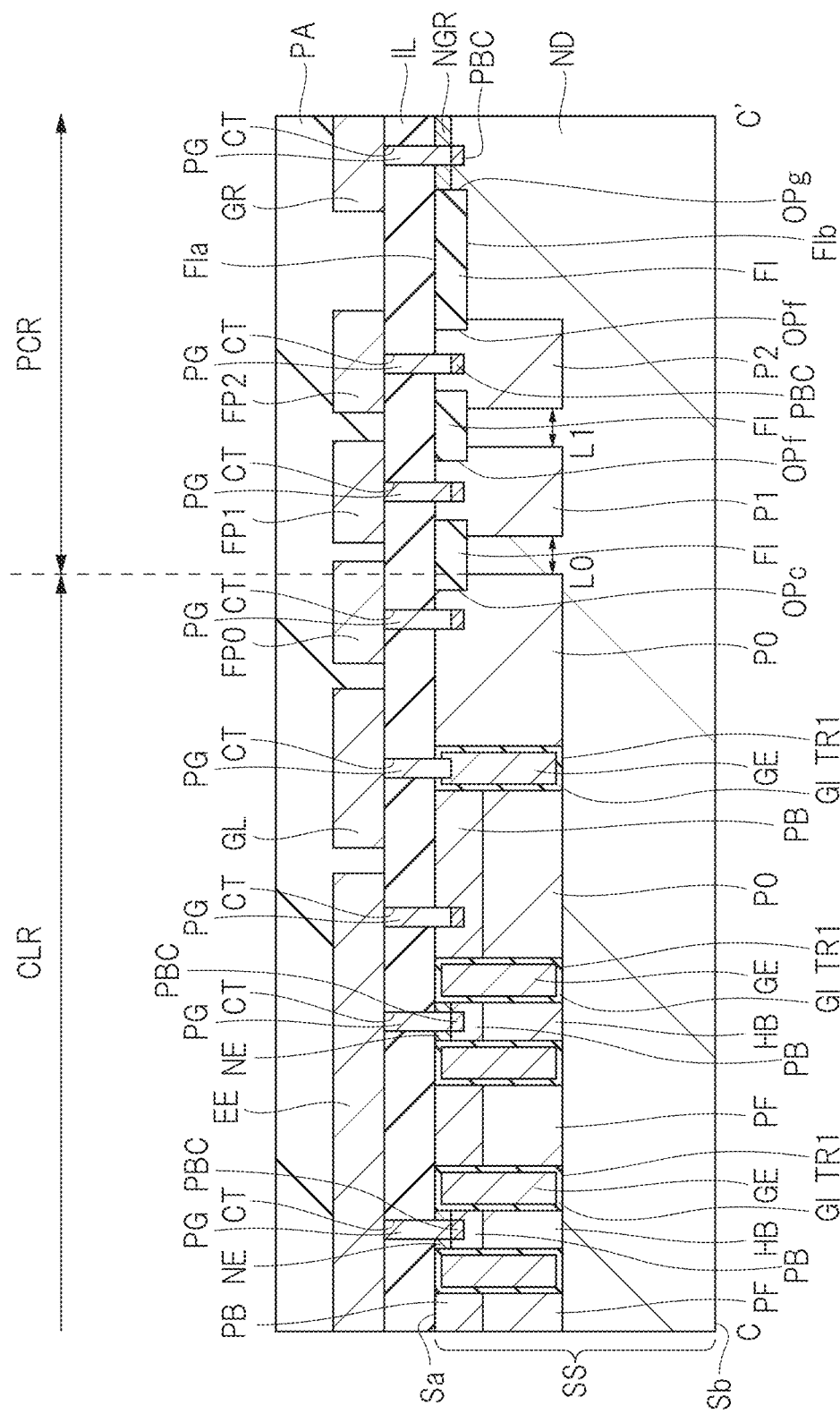
FIG. 16 is a cross-sectional view of the semiconductor device according to the first embodiment during the manufacturing process thereof.

Next, as shown in FIG. 16, the contact trenches CT are formed in the interlayer insulating film IL. Here, for example, the contact trenches CT penetrate the n-type emitter regions NE and reach the p-type body region PB. Next, the p-type impurities are ion-implanted through the contact trenches CT into the semiconductor substrate SS exposed at bottom portions of the contact trenches CT, whereby p-type body contact regions PBC are formed. Next, in the contact trenches CT and on the interlayer insulating film IL, a stacked film of a barrier metal film such as a titanium tungsten (TiW) film and a main conductor film such as an aluminum-based metal film is formed. This aluminum-based metal film contains aluminum (Al) as a main component. For example, silicon (Si) of several atomic percent is added to the aluminum-based metal film and the rest thereof is made of aluminum (Al). Next, by patterning the stacked film using a photolithography technology, the plug electrodes PG are formed in the contact trenches CT, and the emitter electrode EE, the gate wiring GL, the field plates FP0, FP1 and FP2, and the guard ring GR are formed on the interlayer insulating film IL. Here, the plug electrodes PG and the emitter electrode EE are composed of the stacked film including the aluminum-based metal film; however, the plug electrodes PG can be formed of a metal film different from that for the emitter electrode EE. For example, after a stacked film of a barrier metal film such as a titanium nitride (TiN) film and a main conductor film such as a tungsten film is deposited in the contact trenches CT and on the interlayer insulating film IL, the plug electrodes PG are selectively formed only in the contact trenches CT using the CMP method. Then, the emitter electrode EE and others composed of the aluminum-based metal film may be formed on the plug electrodes PG.

Next, as shown in FIG. 16, the insulating film PA is formed so as to cover the emitter electrode EE, the gate wiring GL, the field plates FP0, FP1 and FP2 and the guard ring GR. The insulating film PA is composed of an organic insulating film containing, for example, polyimide as a main component.

Next, the back surface Sb of the semiconductor substrate SS is subjected to a back grinding treatment, and thereafter, the n-type field stop layer NS, the p-type collector layer PC and the back electrode BE are formed thereon as shown in FIG. 7. The n-type impurities are introduced from the back surface Sb into the semiconductor substrate SS by, for example, ion implantation, whereby the n-type field stop layer NS is formed. Next, the p-type impurities are introduced from the back surface Sb into the semiconductor substrate SS by, for example, the ion implantation, whereby the p-type collector layer PC is formed. Next, the back electrode BE is formed on the back surface Sb of the semiconductor substrate SS by, for example, a sputtering method. The n-type field stop layer NS is in contact with the n-type drift region ND, and has a higher impurity concentration than the impurity concentration of the n-type drift region ND. The p-type collector layer PC is located between the n-type field stop layer NS and the back electrode BE.

A supplementary description will be given of the manufacturing process of the p-type well regions P0, P1 and P2 described with reference to FIGS. 11 and 12. In the first embodiment, as shown in FIGS. 7 and 8, the p-type well regions P0, P1 and P2 have the equal depth Da in the linear regions R1 and R2 and the corner region R3, and the reason for this will be described. FIG. 21 shows relationships between depths and impurity concentrations when boron (B) is ion-implanted under conditions where implantation energy is 300 KeV and a dose is $1 \times 10^{13}$ cm$^{-2}$. (a) indicates a case where boron (B) is ion-implanted into a silicon layer, and (b) indicates a case where boron (B) is ion-implanted into a silicon oxide layer. In terms of characteristics, the relationships between the depths and the impurity concentrations are substantially equal to each other in (a) and (b).

FIG. 22 shows a manufacturing method of a p-type well region in a comparative example 1, and boron (B) is ion-implanted into the semiconductor substrate SS in a state where the field insulating film FI composed of a silicon oxide film is provided on the main surface Sa of the semiconductor substrate SS. It is seen that, in this case, an implantation depth of boron (B) varies depending on the presence of the field insulating film FI. FIG. 23 shows the manufacturing method of the p-type well region in the first embodiment, and the field insulating film FI composed of a silicon oxide film is embedded in the semiconductor substrate SS. In this case, the implantation depth of boron (B) can be equalized without depending on the presence of the field insulating film FI. This results from the characteristics described with reference to FIG. 21.

In the first embodiment, as shown in FIGS. 7 and 8, the field insulating film FI is embedded in the semiconductor substrate SS, and thus the depths of the p-type well regions P0, P1 and P2 can be equalized in the linear regions R1 and R2 and the corner region R3.

Figure 24:
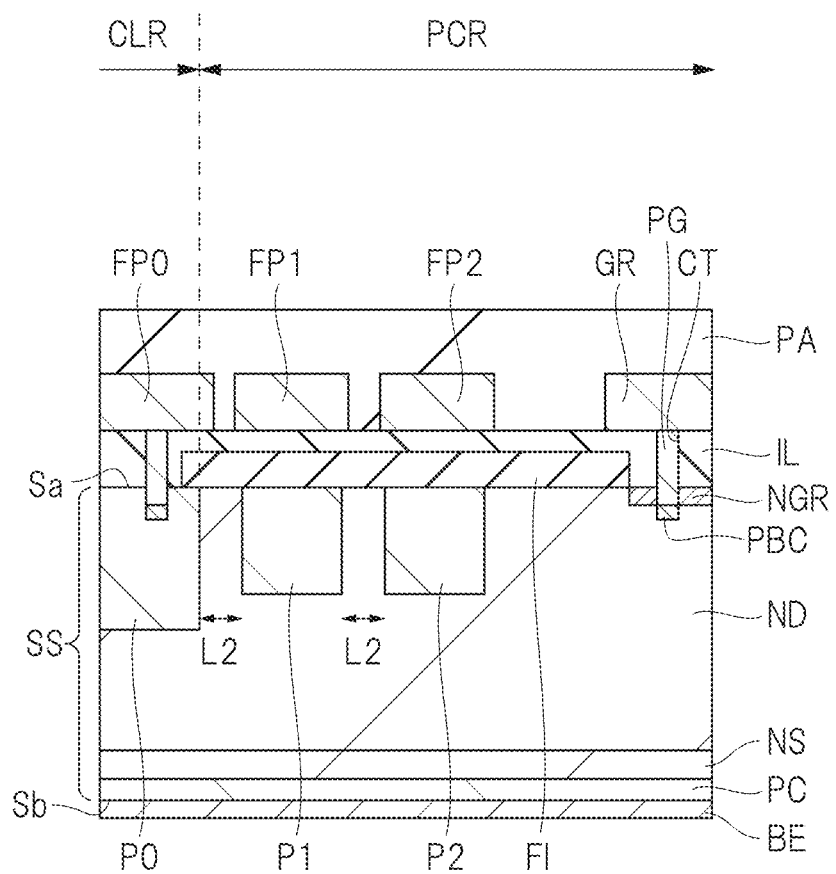
FIG. 24 is a cross-sectional view of a corner region in the comparative example 1.

FIG. 24 is a cross-sectional view of a corner region in the comparative example 1. As shown in FIG. 24, since the field insulating film FI is located on the semiconductor substrate SS, the depths of the p-type well regions P1 and P2 become shallower than the depth of the p-type well region P0 in the corner region R3. Meanwhile, in the linear regions R1 and R2, the openings OPf are provided in the field insulating film FI, and thus the depths of the p-type well regions P1 and P2 become equal to the depth of the p-type well region P0. When the deep region and the shallow region are mixed in each of the p-type well regions P1 and P2 as in the comparative example 1, a breakdown voltage in the shallow region becomes dominant. Accordingly, an interval L2 between the p-type well regions P1 and P2 must be shortened. Hence, the number of p-type well regions needs to be increased in order to ensure a desired breakdown voltage, and there is a problem that the peripheral region PCR is increased in size.

In the first embodiment, in the corner region R3, the depths of the p-type well regions P1 and P2 can be equalized to the depths of the p-type well regions P1 and P2 in the linear regions R1 and R2. Accordingly, it becomes possible to miniaturize the semiconductor device.

Modified Example 1

FIGS. 25 to 28 are cross-sectional views of a semiconductor device in a modified example 1 during a manufacturing process thereof. Although FIGS. 25 to 28 show a modified example of the manufacturing method of the p-type well regions P1 and P2, the description will be given of the manufacturing method of the p-type well region P1.

Figure 28:
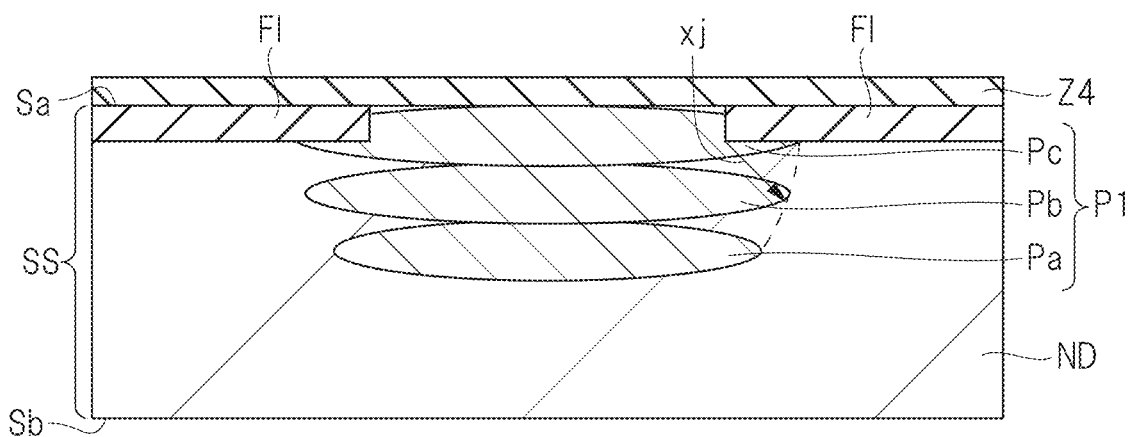
FIG. 28 is a cross-sectional view of the semiconductor device in the modified example 1 during the manufacturing process thereof.

As shown in FIG. 28, the p-type well region P1 is composed of, for example, three p-type semiconductor regions Pa, Pb and Pc stacked on three stages. The p-type semiconductor region Pb on an intermediate stage has a width larger than that of the p-type semiconductor region Pa on a lower stage, and is stacked on the p-type semiconductor region Pa. The p-type semiconductor region Pc on an upper stage has a width larger than that of the p-type semiconductor region Pb on the intermediate stage, and is stacked on the p-type semiconductor region Pb. Since the p-type well region P1 is formed to have such a stacked structure, a curvature radius xj of the PN junction formed between the p-type well region P1 and the n-type drift region ND can be increased, so that the breakdown voltage between the p-type well region P1 and the n-type drift region ND can be enhanced. Note that the width described above means a width along a surface parallel to the main surface Sa of the semiconductor substrate SS.

Figure 25:
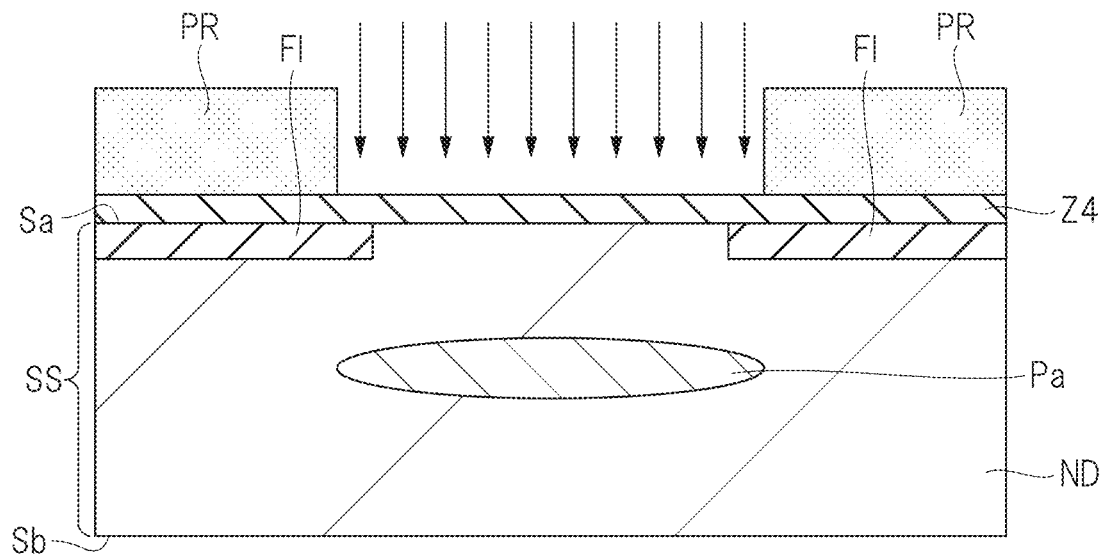
FIG. 25 is a cross-sectional view of a semiconductor device in a modified example 1 during a manufacturing process thereof.
Figure 26:
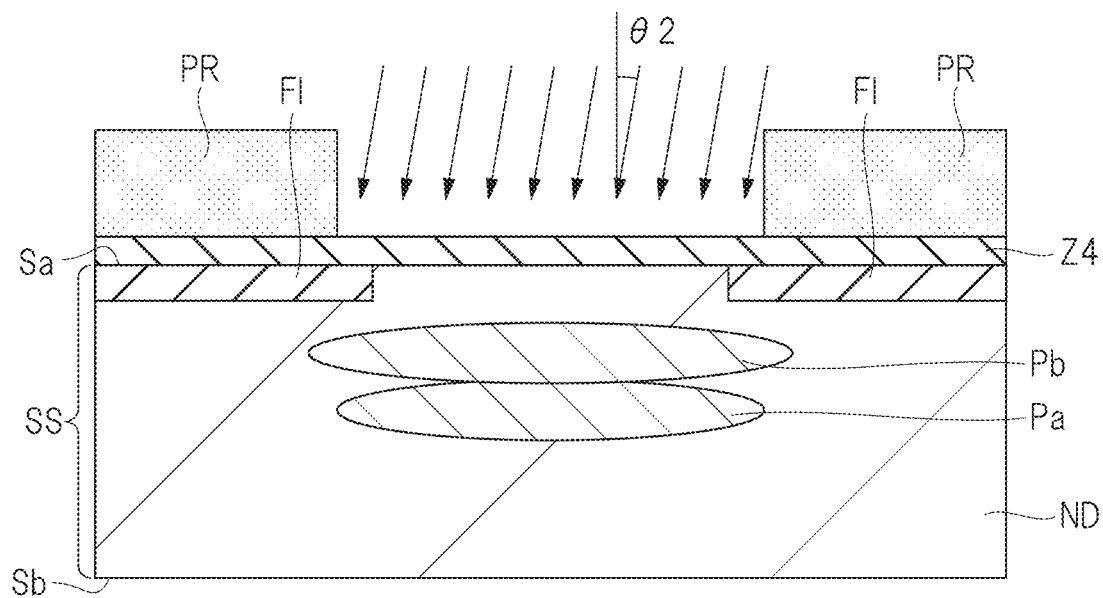
FIG. 26 is a cross-sectional view of the semiconductor device in the modified example 1 during the manufacturing process thereof.
Figure 27:
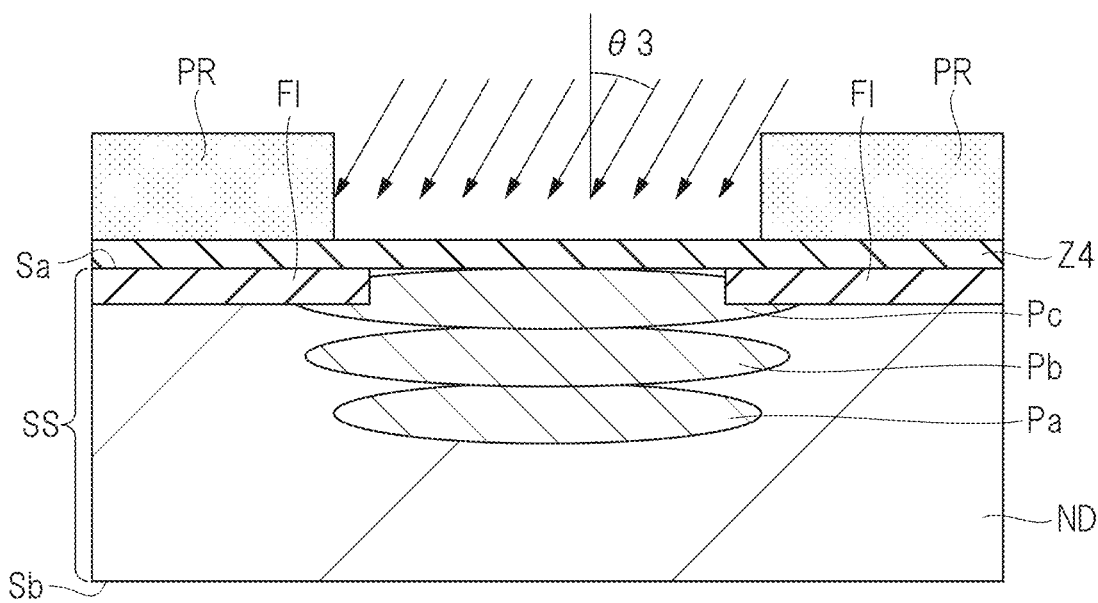
FIG. 27 is a cross-sectional view of the semiconductor device in the modified example 1 during the manufacturing process thereof.

Next, the manufacturing method will be described with reference to FIGS. 25 to 27. As shown in FIG. 25, for example, the p-type semiconductor region Pa is formed by performing first ion implantation in a normal direction of the main surface Sa of the semiconductor substrate SS. Next, as shown in FIG. 26, the p-type semiconductor region Pb is formed by performing second ion implantation at a tilt angle θ2 with respect to the normal direction of the main surface Sa. Next, as shown in FIG. 27, the p-type semiconductor region Pc is formed by performing third ion implantation at a tilt angle θ3 with respect to the normal direction of the main surface Sa. Here, the tilt angle θ3 is larger than the tilt angle θ2. Moreover, the second and third ion implantations are implemented by a rotary implantation method in which ions are implanted into a wafer while rotating the wafer about a surface center thereof after the tilt angles are set. The rotary implantation method includes: a method of continuously rotating the wafer while implanting ions thereinto; and step rotary implantation of repeating the cycle in which the rotation is stopped at a time of the implantation, the wafer is then rotated at a predetermined angle, and the implantation is performed again. Alternatively, a tilt angle may be set in the first ion implantation, and in that case, the tilt angle θ2 of the second ion implantation is larger than the tilt angle of the first ion implantation, and the tilt angle θ3 of the third ion implantation is larger than the tilt angle θ2 of the second ion implantation.

Modified Example 2

Figure 29:
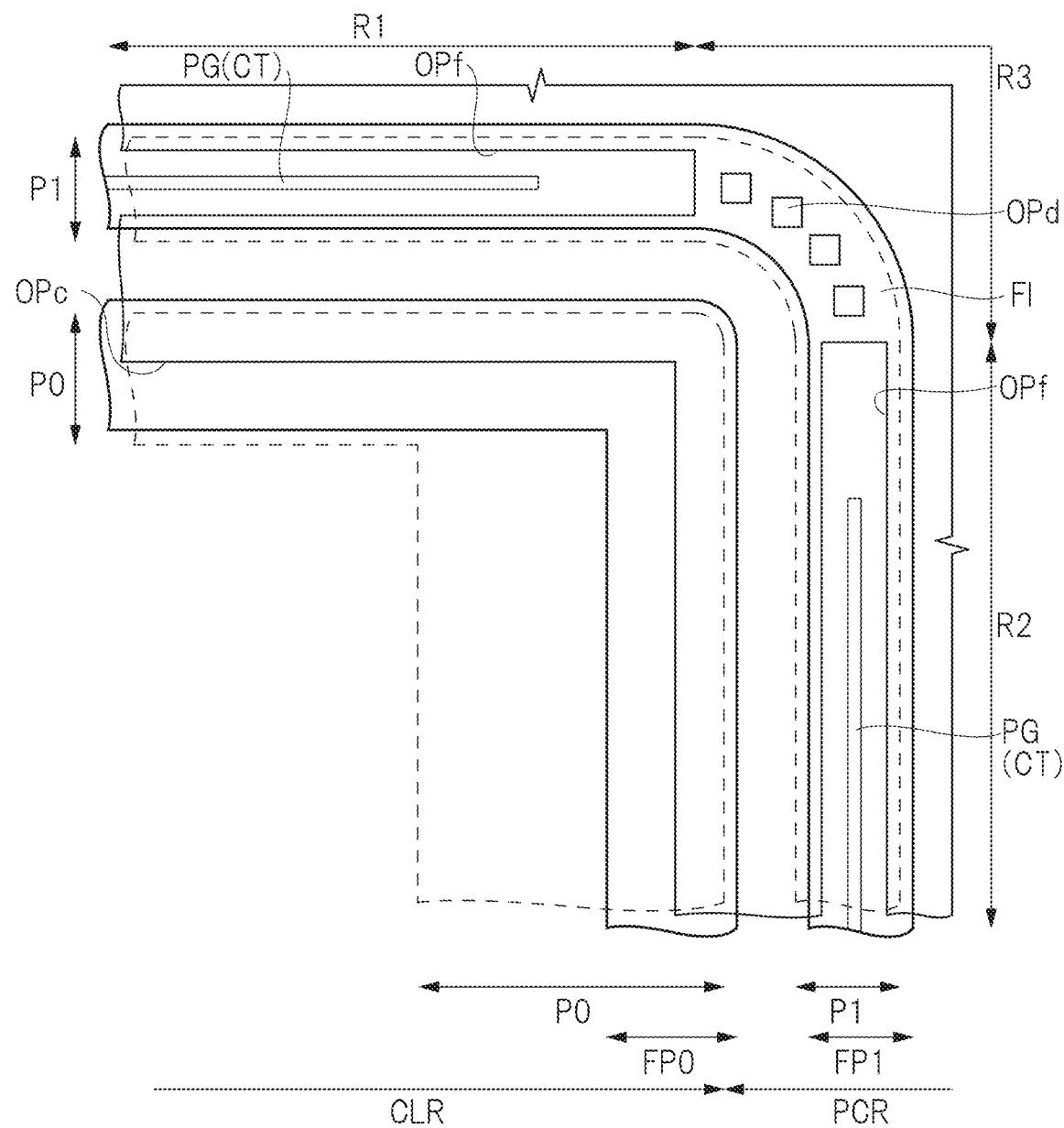
FIG. 29 is a plan view of a principal part of a semiconductor device in a modified example 2.

FIG. 29 is a plan view of a principal part of a semiconductor device in a modified example 2. As shown in FIG. 29, in the corner region R3, a plurality of dummy openings OPd are disposed in the field insulating film FI between the p-type well region P1 and the field plate FP1. In plan view, in the linear region R1, the slit-shaped opening OPf provided in the field insulating film FI is disposed so as to overlap the p-type well region P1 and the field plate FP1, and this opening OPf extends in the X direction that is the <010> direction. Moreover, the slit-shaped contact trench CT and plug electrode PG are provided in the opening OPf, and electrically connect the p-type well region P1 to the field plate FP1. Also, in plan view, in the linear region R2, the slit-shaped opening OPf provided in the field insulating film FI is disposed so as to overlap the p-type well region P1 and the field plate FP1, and this opening OPf extends in the Y direction that is the <001> direction. Moreover, the slit-shaped contact trench CT and plug electrode PG are provided in the opening OPf, and electrically connect the p-type well region P1 to the field plate FP1. In plan view, in the corner region R3, the plurality of dummy openings OPd are disposed in the p-type well region P1 and the field plate FP1 along the arc portions of the p-type well region P1 and the field plate FP1. In the corner region R3, such contact trenches CT and plug electrodes PG are not provided in the plurality of dummy openings OPd.

In plan view, a whole area of each of the dummy openings OPd overlaps the p-type well region P1 and the field plate FP1. Each dummy opening OPd has a square or rectangular planar shape. Two sides of the dummy opening OPd among four sides extend in the X direction that is the <010> direction, and the other two sides extend in the Y direction that is the <001> direction. Namely, sidewalls of the field insulating film FI corresponding to the four sides of the dummy opening OPd are disposed so as not to be (011) planes of the semiconductor substrate SS.

Moreover, since the plurality of dummy openings OPd are provided in the corner region R3, a dent of the upper surface FIa of the field insulating film FI can be prevented. As described with reference to FIG. 19, when the field insulating film FI is formed in a wide region by the CMP method, a phenomenon called dishing occurs, and a dent occurs on the upper surface FIa of the field insulating film FI. In the modified example 2, since the dummy openings OPd are provided to reduce an occupancy of the field insulating film FI in the wide region, the dishing can be prevented.

Moreover, corner portions of the dummy openings OPd have an arc shape with a curvature radius of, for example, approximately 5 μm in the manufacturing process of the semiconductor device; however, this curvature radius is sufficiently smaller in comparison with 50 μm or more of the curvature radius of the p-type well region P1 and the field plate FP1. Hence, even if the corner portions of the dummy openings OPd overlap the <011> direction, the occurrence of the above-mentioned large dislocation loop DL1 can be prevented.

Note that the contact trenches CT and the plug electrodes PG may be provided in the dummy openings OPd in the corner region R3, and the p-type well region P1 may be electrically connected to the field plate FP1.

Moreover, though a relationship among the p-type well region P1, the field plate FP1, the openings OPf and the dummy openings OPd has been described, the same also applies to a relationship among the p-type well region P2, the field plate FP2, the openings OPf and the dummy openings OPd.

Modified Example 3

Figure 30:
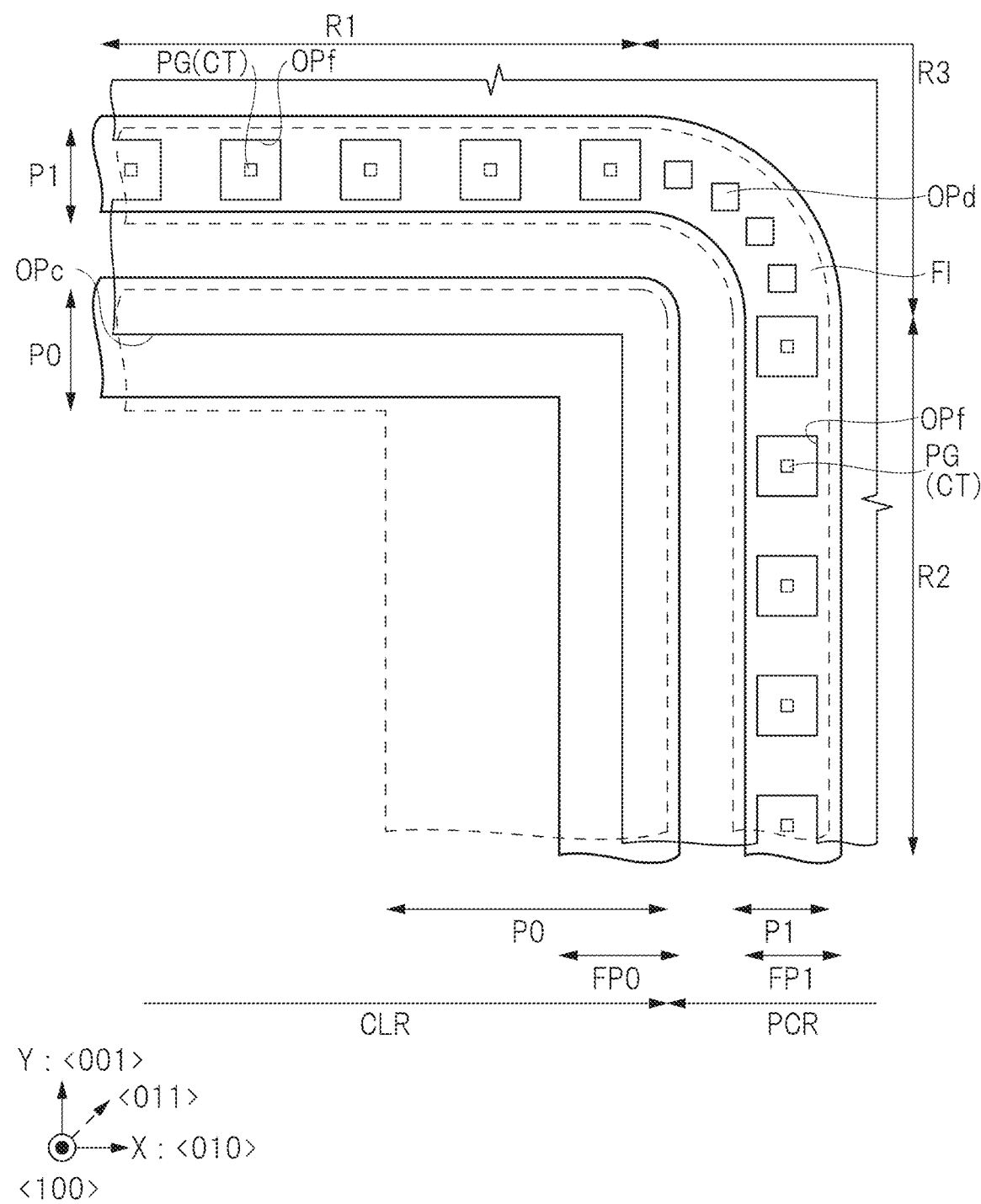
FIG. 30 is a plan view of a principal part of a semiconductor device in a modified example 3.

FIG. 30 is a plan view of a principal part of a semiconductor device in a modified example 3. The modified example 3 is a modified example with respect to the first embodiment or the modified example 2, and is different therefrom in the shape of the openings OPf in the linear regions R1 and R2. In the linear regions R1, a plurality of the openings OPf having a square or rectangular planar shape are disposed in the X direction that is the <010> direction. Further, the contact trenches CT and the plug electrodes PG are provided in the individual openings OPf, and electrically connect the p-type well region P1 to the field plate FP1. In the linear regions R2, a plurality of the openings OPf having a square or rectangular planar shape are disposed in the Y direction that is the <001> direction. Further, the contact trenches CT and the plug electrodes PG are provided in the individual openings OPf, and electrically connect the p-type well region P1 to the field plate FP1.

In the linear regions R1 and R2, the openings OPf provided in the field insulating film FI are divided into the plurality of square or rectangular openings OPf, so that the dishing that occurs at a time of forming the field insulating film FI using the CMP method can be suppressed. Moreover, since the contact trenches CT and the plug electrodes PG are also similarly divided into plurality of portions, the dishing that occurs at a time of forming the plug electrodes PG using the CMP method can be suppressed.

Modified Example 4

Figure 31:
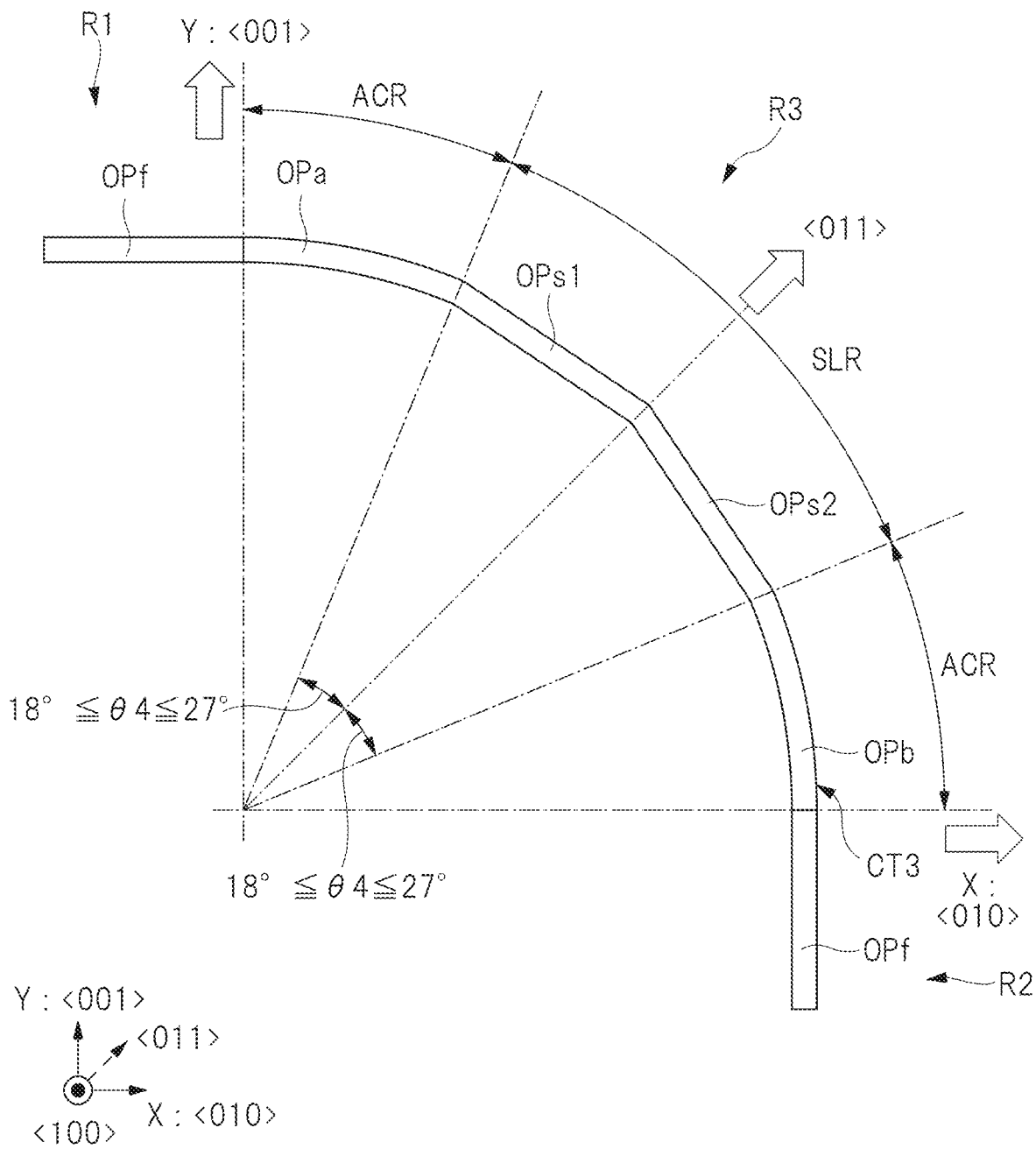
FIG. 31 is a plan view of a principal part of a semiconductor device in a modified example 4.
Figure 32:
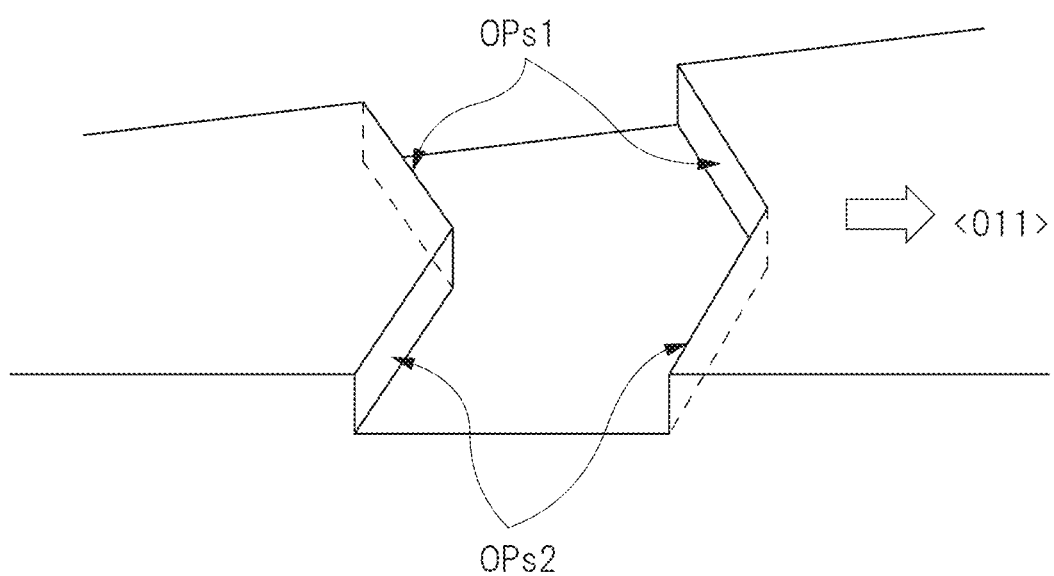
FIG. 32 is a perspective view of a principal part of the semiconductor device in the modified example 4.

FIGS. 31 and 32 are a plan view and a perspective view of a principal part of a semiconductor device in a modified example 4. The modified example 4 is a modified example of the first embodiment described above. In the corner region R3 of the modified example 4, the opening OPf disposed in the linear region R1 and the opening OPf disposed in the linear region R2 are continuously connected to each other by openings OPa, OPs1, OPs2 and OPb.

As shown in FIG. 31, in the corner region R3, the opening is composed of a linear region SLR and arc regions ACR disposed on both sides of the linear region SLR. In the linear region SLR, the two openings OPs1 and OPs2 disposed in line symmetry with respect to the crystal orientation <011> are disposed, and the openings OPs1 and OPs2 extend linearly in directions different from the crystal orientation <010>, the crystal orientation <001> and the crystal orientation <011>. Moreover, the openings OPs1 and OPs2 extend in directions different from each other. As described above, the linear region SLR is composed of the two openings OPs1 and OPs2 which extend in the directions different from the crystal orientation <010>, the crystal orientation <001> and the crystal orientation <011>, whereby it is possible to prevent the crystal plane (011) from appearing on the sidewalls of the openings OPs1 and OPs2 in the linear region SLR. Hence, it is possible to prevent the above-mentioned large dislocation loop DL1 from being formed in the linear region SLR.

In the arc regions ACR, the openings OPa and OPb having an arc shape are disposed. In the linear region SLR, one end of the opening OPs1 and one end of the opening OPs2 are connected to each other on an axis of the crystal orientation <011>, the other end of the opening OPs1 is connected to one end of the opening OPa of the arc region ACR, and the other end of the opening OPa is connected to the opening OPf of the linear region R1. Moreover, the other end of the opening OPs2 is connected to one end of the opening OPb, and the other end of the opening OPb is connected to the opening OPf of the linear region R2.

Furthermore, a range of the linear region SLR is defined as a range of ±θ4 (18°≤θ4≤27°) around the crystal orientation <011>. Here, when θ4 is smaller than 18° (θ4<18°), a shape of the linear region SLR approximates to the arc of the examination example, and thus θ4 is preferably equal to or larger than 18° (θ4≥18°). Incidentally, when θ4 is equal to 18° (θ4=18°), sidewalls of the opening OPs1 shown in FIG. 32 are crystal plane (021), and sidewalls of the opening OPs2 are crystal plane (012). In addition, when θ4 is equal to 27° (θ4=27°), the sidewalls of the opening OPs1 shown in FIG. 32 are crystal plane (031), and the sidewalls of the opening OPs2 are crystal plane (013).

Note that, though the opening OPa of the arc region ACR is formed into the arc shape in plan view, the shape of this portion can also be changed to a linear shape.

Second Embodiment

Figure 33:
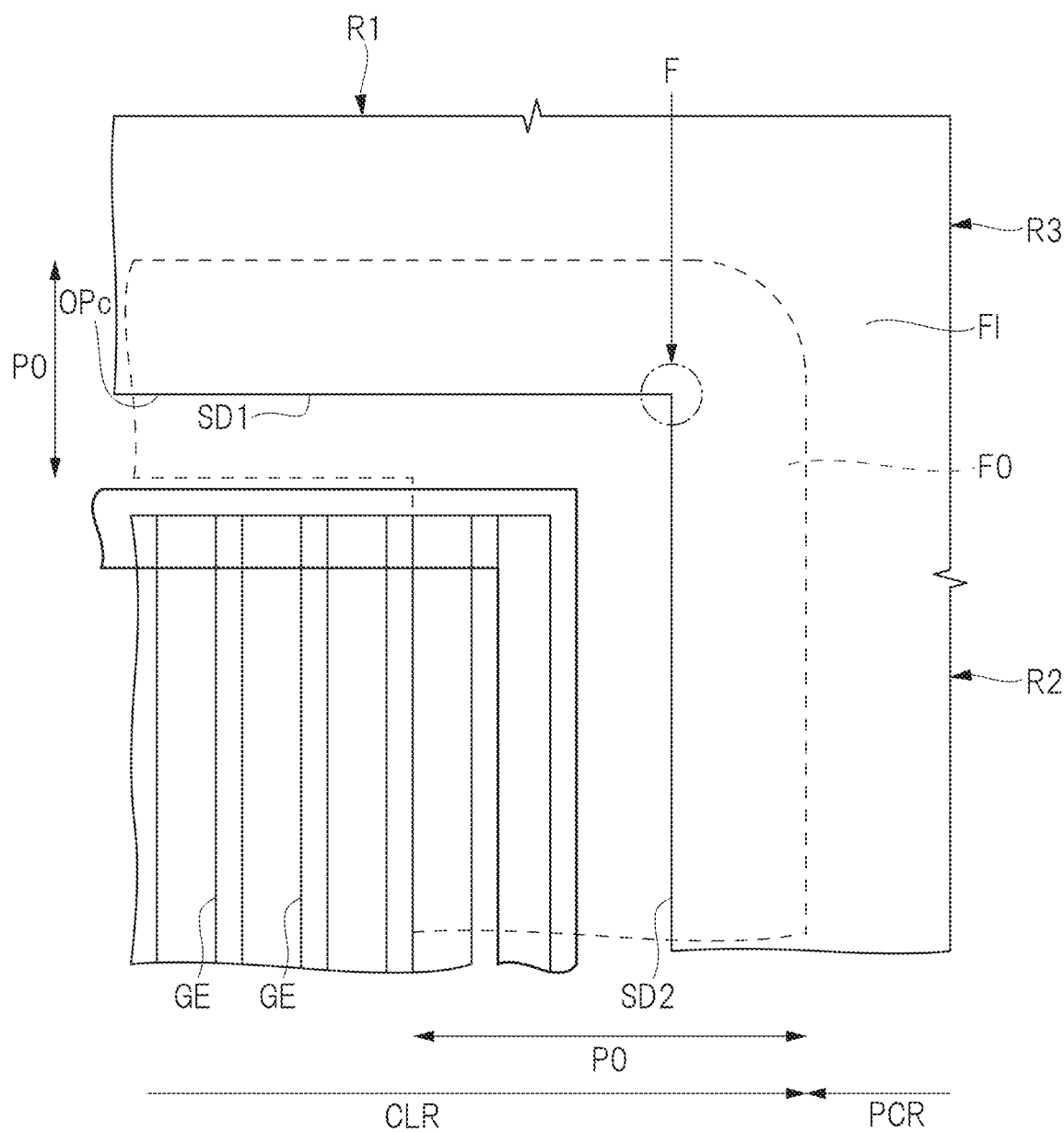
FIG. 33 is a plan view of a principal part of a semiconductor device according to a second embodiment.

FIG. 33 is a plan view of a principal part of a semiconductor device according to a second embodiment, and is an enlarged plan view of a portion E of FIG. 6. As described with reference to FIG. 5, the active region of the cell forming region is defined by the opening OPc of the field insulating film FI. In the second embodiment, the occurrence of the large dislocation loop DL1 which penetrates the p-type well region P0 is prevented by devising the shape of the opening OPc in the corner region R3.

As shown in FIG. 33, the opening OPc has a side SD1 extending in the X direction that is the crystal orientation <010> in the linear region R1 and a side SD2 extending in the Y direction that is the crystal orientation <001> in the linear region R2, and the side SD1 and the side SD2 are perpendicular to each other in the corner region R3. Also, the end portion of the p-type well region P0 which is a boundary between the cell region CLR and the peripheral region PCR has an arc shape with a curvature radius of 50 μm or more in the corner region R3. As a comparative example, when the shape of the opening OPc in plan view in the corner region R3 is set to have an arc shape with a substantially equal curvature radius to that of the end portion of the p-type well region P0, the sidewall of the field insulating film FI is in contact with a crystal plane (011) of the semiconductor substrate SS, so that a risk of the occurrence of the large dislocation loop DL1 is increased.

In this second embodiment, an angle of a corner portion (portion F in FIG. 33) of the opening OPc is made perpendicular in the corner region R3, whereby the occurrence of the large dislocation loop DL1 can be suppressed. This is because, when the angle of the corner portion is made perpendicular at a design stage, a curvature radius of the corner portion after manufacture is, for example, approximately 5 μm and this curvature radius is significantly smaller than the curvature radius of the arc portion of the p-type well region P0.

Modified Example 5

Figure 34:
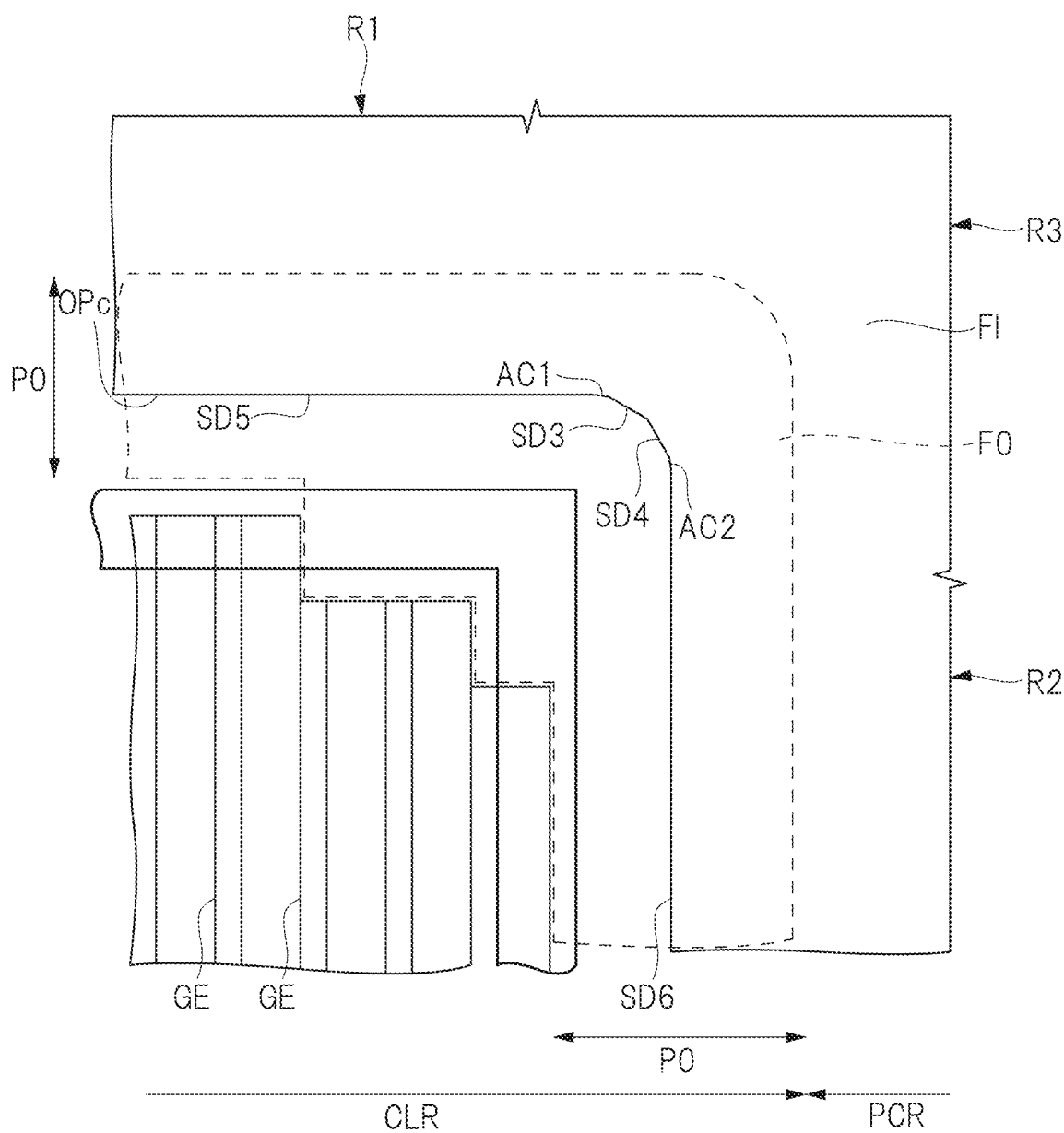
FIG. 34 is a plan view of a principal part of a semiconductor device in a modified example 5.

FIG. 34 is a plan view of a principal part of a semiconductor device in a modified example 5. The modified example 5 is a modified example of the second embodiment, and an idea of the modified example 4 is applied to the second embodiment. As shown in FIG. 34, the opening OPc has a side SD5 extending in the X direction that is the crystal orientation <010> in the linear region R1 and a side SD6 extending in the Y direction that is the crystal orientation <001> in the linear region R2. In addition, the opening OPc has sides SD3 and SD4 and arc portions AC1 and AC2 in the corner region R3. The sides SD3 and SD4 correspond to the openings OPs1 and OPs2 in the modified example 4, and the arc portions AC1 and AC2 correspond to the openings OPa and OPb in the modified example 4.

Specifically, the sides SD3 and SD4 are disposed in line symmetry with respect to the crystal orientation <011>, and the sides SD3 and SD4 extend linearly in directions different from the crystal orientation <010>, the crystal orientation <001> and the crystal orientation <011>. Moreover, the sides SD3 and SD4 extend in directions different from each other. A range of the sides SD3 and SD4 is defined as a range of $\pm\theta 4$ ($18°\leq\theta 4\leq 27°$) around the crystal orientation <011>. Incidentally, when $\theta 4$ is equal to 18° ($\theta 4=18°$), a sidewall of the semiconductor substrate SS which corresponds to the side SD3 is a crystal plane (021), and a sidewall of the semiconductor substrate SS which corresponds to the side SD4 is a crystal plane (012). Further, when $\theta 4$ is equal to 27° ($\theta 4=27°$), the sidewall of the semiconductor substrate SS which corresponds to the side SD3 is a crystal plane (031), and the sidewall of the semiconductor substrate SS which corresponds to the side SD4 is a crystal plane (013).

Note that the arc portions AC1 and AC2 can also be changed to linear portions in plan view.

In the corner region R3, the sidewall of the semiconductor substrate SS corresponding to the sides SD3 and SD4 does not become the crystal plane (011), and thus the occurrence of the large dislocation loop DL1 can be suppressed.

Moreover, since the region where the field insulating film FI and the p-type well region P0 overlap each other can be reduced in the X direction and the Y direction in comparison with the second embodiment, a region in the cell region CLR where the gate electrodes GE and the like are arranged can be expanded.

Modified Example 6

Figure 35:
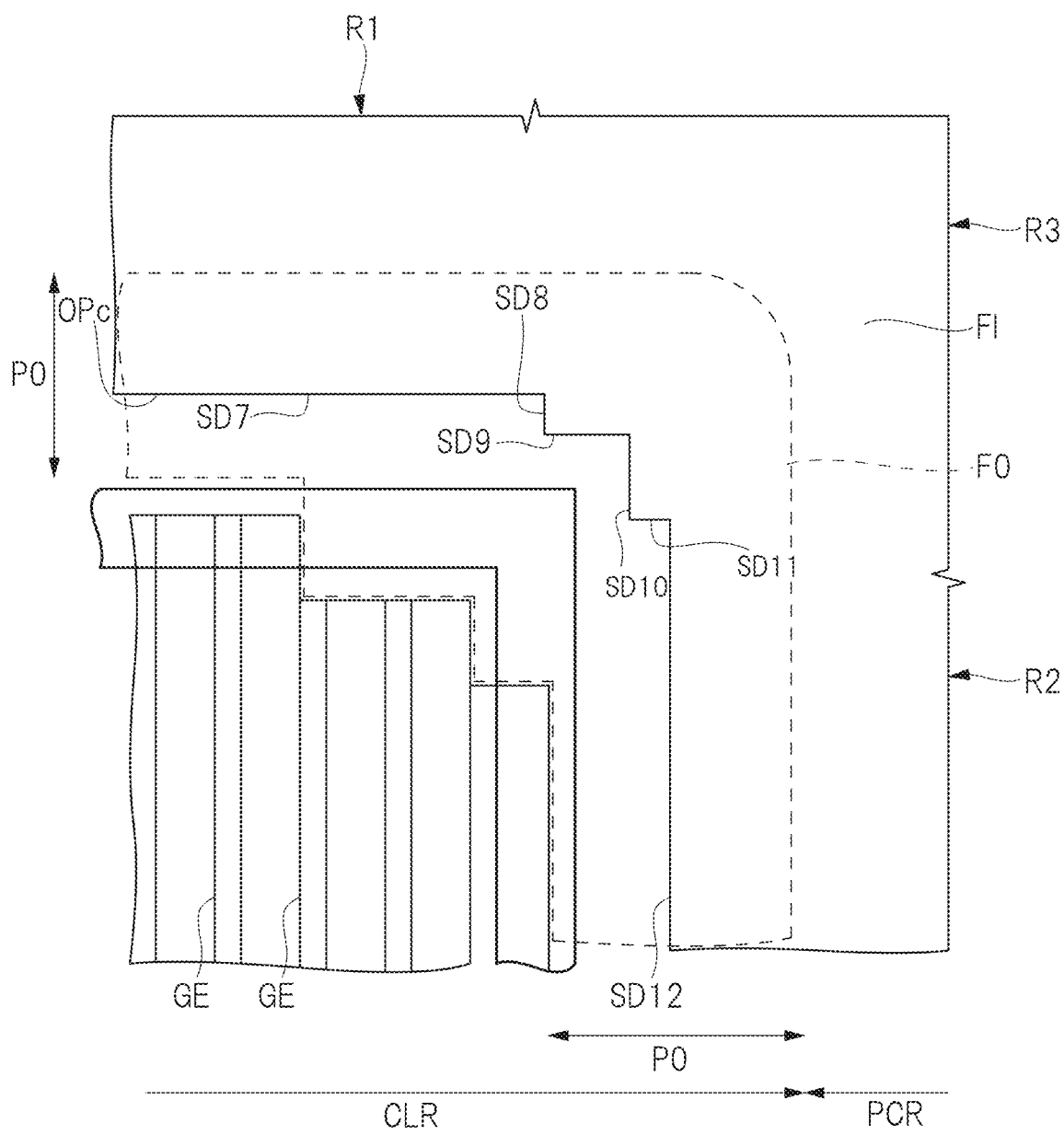
FIG. 35 is a plan view of a principal part of a semiconductor device in a modified example 6.

FIG. 35 is a plan view of a principal part of a semiconductor device in a modified example 6. The modified example 6 is a modified example of the second embodiment, and a corner portion of the opening OPf is formed into a stepwise shape.

As shown in FIG. 35, the opening OPc has a side SD7 extending in the X direction that is the crystal orientation <010> in the linear region R1, a side SD12 extending in the Y direction that is the crystal orientation <001> in the linear region R2, and sides SD8 to SD11 in the corner region R3. The sides SD9 and SD11 extend in the X direction, and the sides SD8 and SD10 extend in the Y direction. The adjacent sides SD7 and SD8 are perpendicular to each other, the adjacent sides SD8 and SD9 are perpendicular to each other, the adjacent sides SD9 and SD10 are perpendicular to each other, the adjacent sides SD10 and SD11 are perpendicular to each other, and the adjacent sides SD11 and SD12 are perpendicular to each other.

Since the opening OPc of the corner region R3 is formed into the stepwise shape, the sidewall of the semiconductor substrate SS corresponding to the sides SD8 to SD11 in the corner region R3 does not become the crystal plane (011), and thus the occurrence of the large dislocation loop DL1 can be suppressed.

Moreover, since the opening OPc of the corner region R3 is formed into the stepwise shape, the region where the field insulating film FI and the p-type well region P0 overlap each other can be reduced, and thus the region in the cell region CLR where the gate electrodes GE and the like are arranged can be expanded.

Here, the corner portion of the opening OPc is formed into the stepwise shape having three steps; however, the number of steps may be two or four or more.

Third Embodiment

Figure 36:
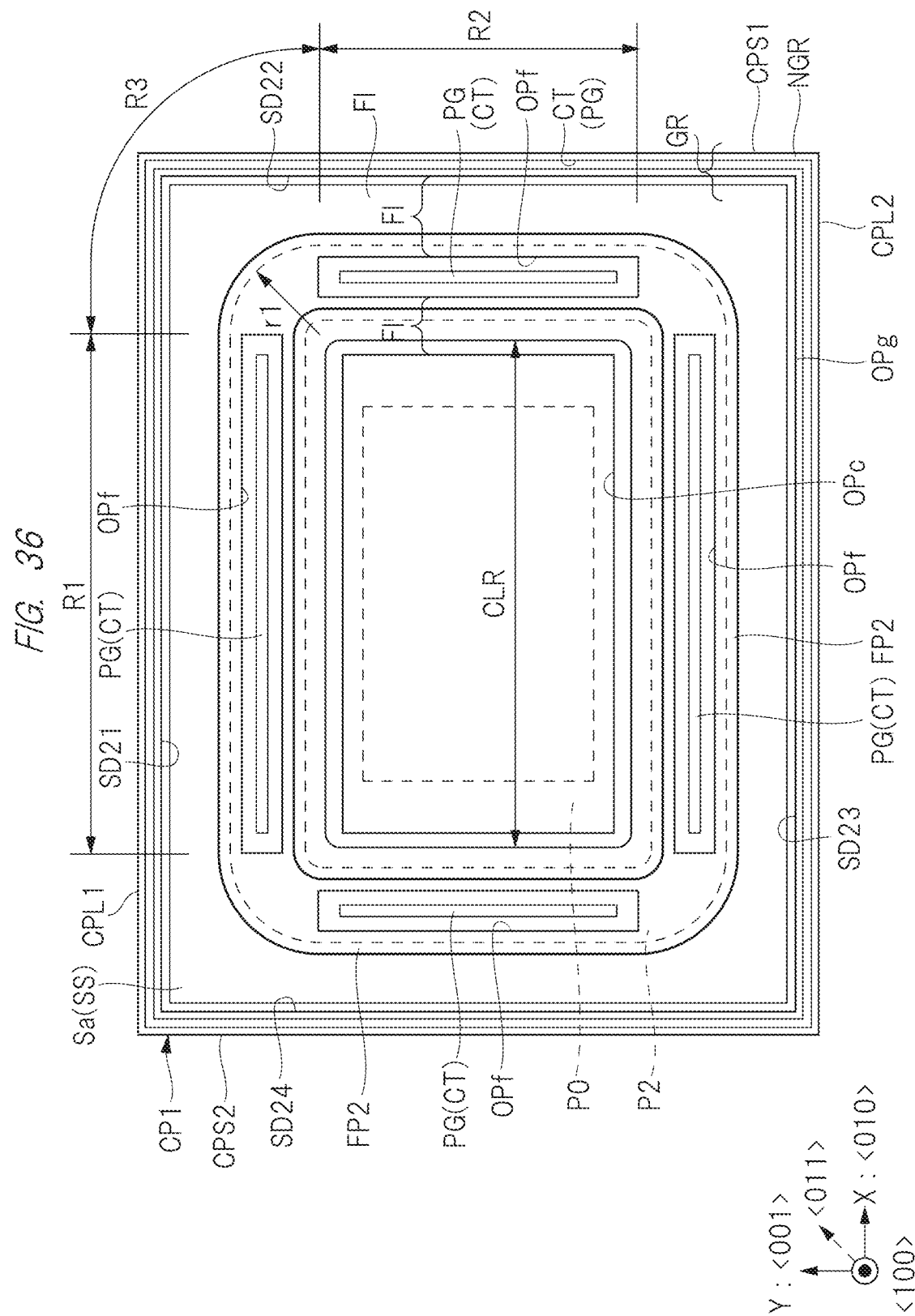
FIG. 36 is a plan view of a principal part of a semiconductor device according to a third embodiment.

FIG. 36 is a plan view of a principal part of a semiconductor device according to a third embodiment. An active region for forming the guard ring is defined by the opening OPg of the field insulating film FI. The third embodiment is common to the second embodiment in terms of the idea, and the occurrence of the large dislocation loop DL1 is prevented by devising the shape of the opening OPg in the corner region R3. Unlike FIG. 5, FIG. 36 shows the p-type well region P2 and the field plate FP2. The opening OPg has a side SD21 extending in the X direction that is the crystal orientation <010> in the linear region R1 and a side SD22 extending in the Y direction that is the crystal orientation <001> in the linear region R2, and the side SD21 and the side SD22 are perpendicular to each other in the corner region R3. The shape of the opening OPg is the same also in the other three corner regions. Since the angle of the corner portion of the opening OPg is made perpendicular in the corner region R3, the occurrence of the large dislocation loop DL1 can be suppressed.

In a case where the large dislocation loop DL1 occurs in the active region for forming the guard ring, the problem of the increase in leakage current arises when a depletion layer extending from the p-type well region P2 in a direction of the guard ring GR reaches this large dislocation loop DL1 even if the large dislocation loop DL1 does not reach the p-type well region P2.

Modified Example 7

Figure 37:
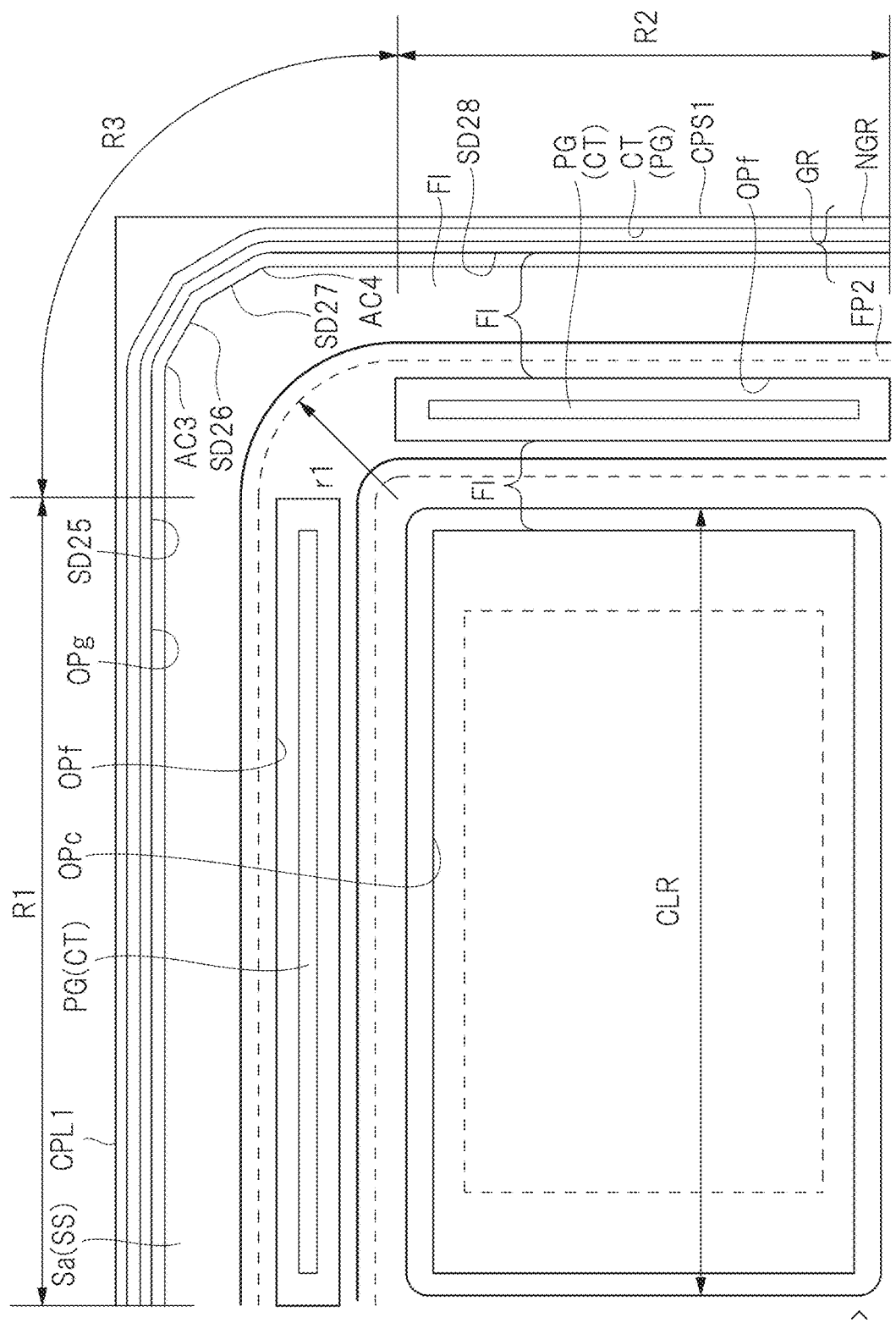
FIG. 37 is a plan view of a principal part of a semiconductor device in a modified example 7.

FIG. 37 is a plan view of a principal part of a semiconductor device in a modified example 7. FIG. 37 shows the linear regions R1 and R2 and the corner region R3. The modified example 7 is a modified example of the third embodiment, which corresponds to the modified example 5. As shown in FIG. 37, the opening OPg has a side SD25 extending in the X direction that is the crystal orientation <010> in the linear region R1 and a side SD26 extending in the Y direction that is the crystal orientation <001> in the linear region R2. Further, the opening OPg has sides SD26 and SD27 and arc portions AC3 and AC4 in the corner region R3. The sides SD26 and SD27 correspond to the sides SD3 and SD4 in the modified example 5, and the arc portions AC3 and AC4 correspond to the arc portions AC1 and AC2 in the modified example 5.

Namely, the sides SD26 and SD27 are disposed in line symmetry with respect to the crystal orientation <011>, and the sides SD26 and SD27 extend linearly in directions different from the crystal orientation <010>, the crystal orientation <001> and the crystal orientation <011>. Moreover, the sides SD26 and SD27 extend in directions different from each other. A range of the sides SD26 and SD27 is defined as a range of $\pm\theta 4$ ($18°\leq\theta 4\leq 27°$) around the crystal orientation <011>. Incidentally, when θ4 is equal to 18° (θ4=18°), a sidewall of the semiconductor substrate SS corresponding to the side SD26 is the crystal plane (021), and a sidewall of the semiconductor substrate SS corresponding to the side SD27 is the crystal plane (012). Further, when θ4 is equal to 27° (θ4=27°), the sidewall of the semiconductor substrate SS corresponding to the side SD26 is the crystal plane (031), and the sidewall of the semiconductor substrate SS corresponding to the side SD27 is the crystal plane (013).

Note that the arc portions AC3 and AC4 can also be changed to linear portions in plan view.

In the corner region R3, the sidewall of the semiconductor substrate SS corresponding to the sides SD26 and SD27 does not become the crystal plane (011), and thus the occurrence of the large dislocation loop DL1 can be suppressed.

Fourth Embodiment

Figure 38:
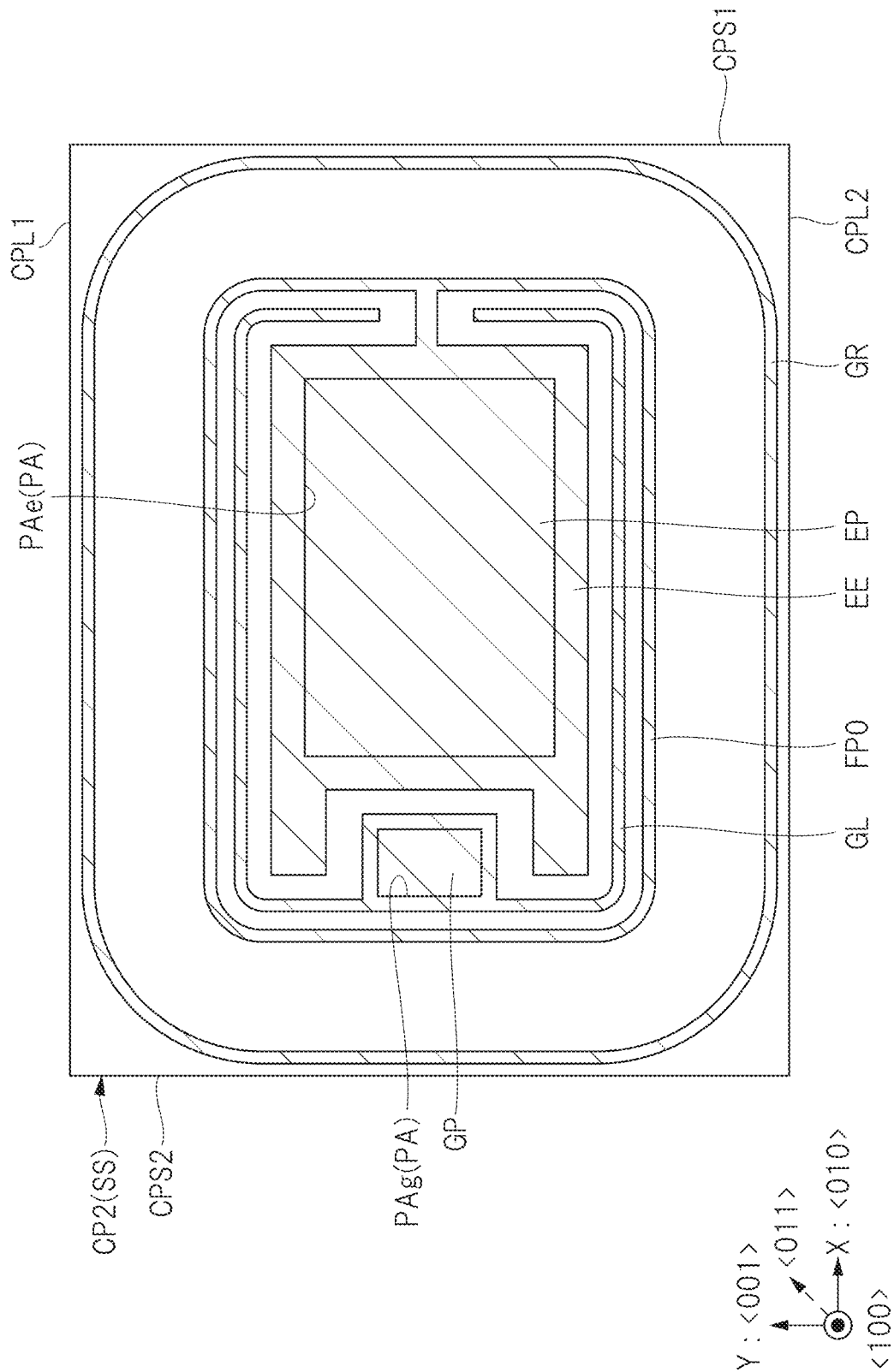
FIG. 38 is a plan perspective view of a semiconductor device according to a fourth embodiment.
Figure 39:
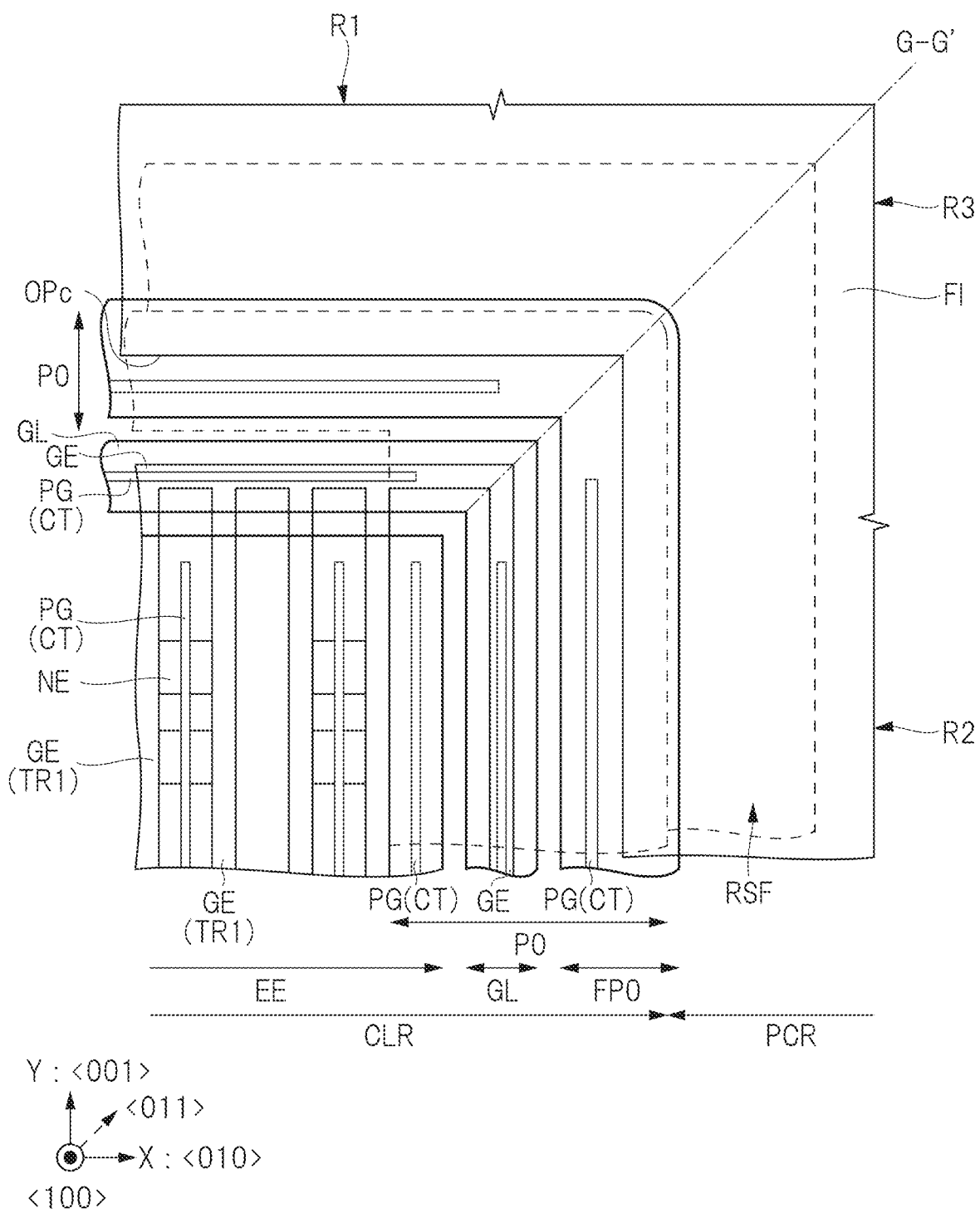
FIG. 39 is a plan view of a principal part of the semiconductor device according to the fourth embodiment.
Figure 40:
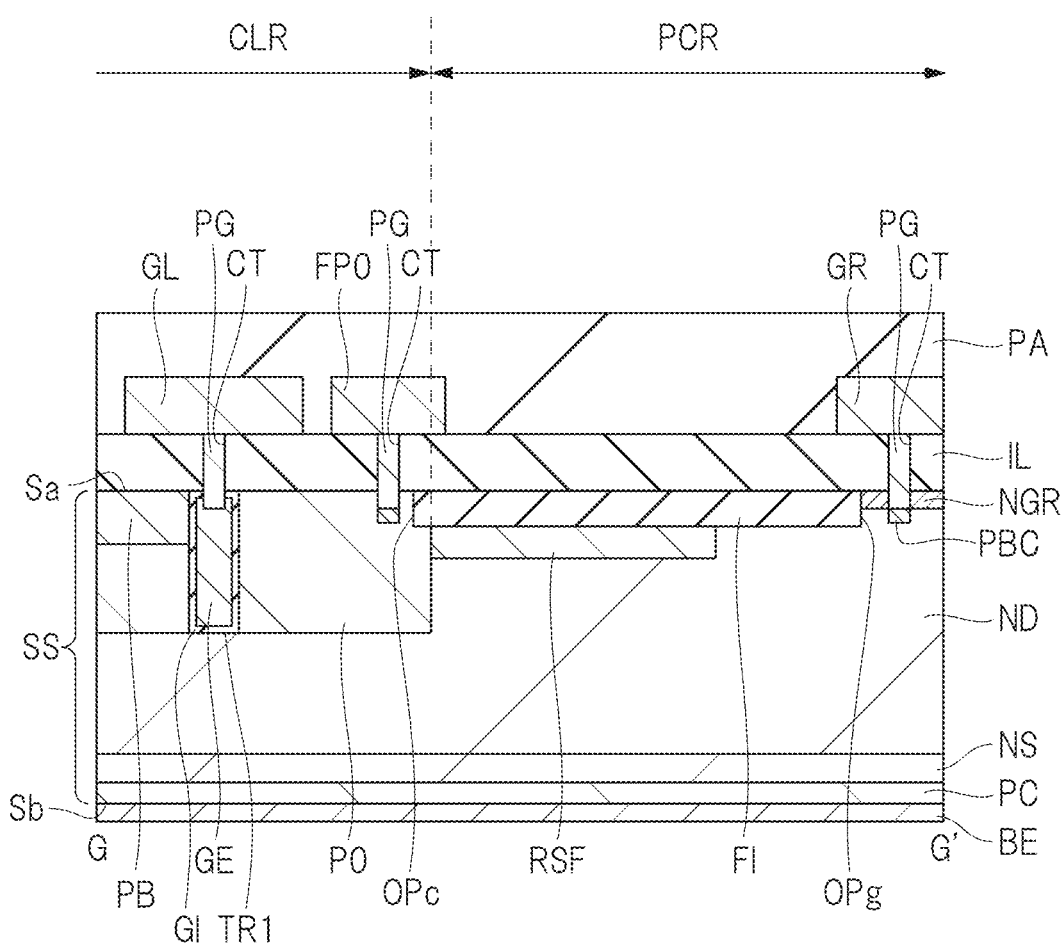
FIG. 40 is a cross-sectional view taken along a line G-G' of FIG. 39.

FIG. 38 is a plan perspective view of a semiconductor device CP2 according to a fourth embodiment, FIG. 39 is a plan view of a principal part of the semiconductor device CP2 according to the fourth embodiment, and FIG. 40 is across-sectional view taken along a line G-G' of FIG. 39. The fourth embodiment is a modified example of the first embodiment, and is different therefrom in terms of the structure of the peripheral region PCR. The structure of the cell region CLR in the fourth embodiment is similar to that in the first embodiment, and thus the description thereof will be omitted.

As shown in FIGS. 38 to 40, the field plates FP1 and FP2 and the p-type well regions P1 and P2 are not provided in the peripheral region PCR of the semiconductor device CP2. As shown in FIG. 40, the field insulating film FI embedded in the semiconductor substrate SS is provided in the peripheral region PCR, and the field insulating film FI has the opening OPc that defines the active region for forming the cell and the opening OPg that defines the active region for forming the guard ring. The fourth embodiment is similar to the first embodiment in this point. However, the semiconductor device CP2 according to the fourth embodiment is not provided with the field plates FP1 and FP2 and the opening OPf provided between the p-type well regions P1 and P2. Further, in the peripheral region PCR, a RESURF layer RSF that is a p-type semiconductor region is provided under the field insulating film FI so as to be in contact with the p-type well region P0. Namely, in the fourth embodiment, the RESURF layer RSF is provided in place of the field plates FP1 and FP2 in the peripheral region PCR and the p-type well regions P1 and P2 in the first embodiment.

In the semiconductor device CP2 having the peripheral region PCR according to the fourth embodiment, the second embodiment and the modified examples 5 and 6 are applicable to the opening OPc of the field insulating film FI. Moreover, in the semiconductor device CP2 having the peripheral region PCR according to the fourth embodiment, the third embodiment and the modified example 7 are applicable to the opening OPg of the field insulating film FI.

Fifth Embodiment

Figure 41:
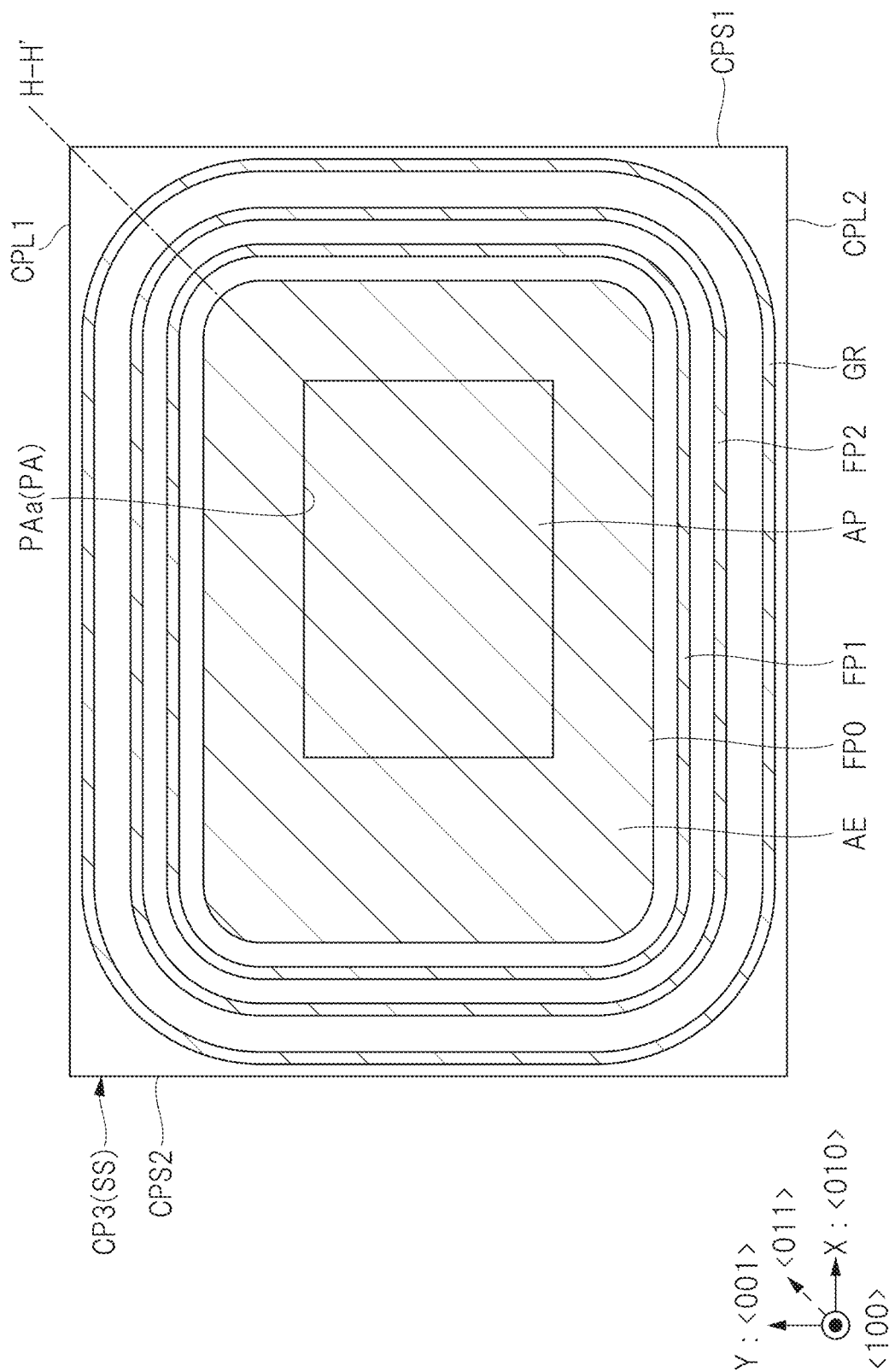
FIG. 41 is a plan perspective view of a semiconductor device according to a fifth embodiment.
Figure 42:
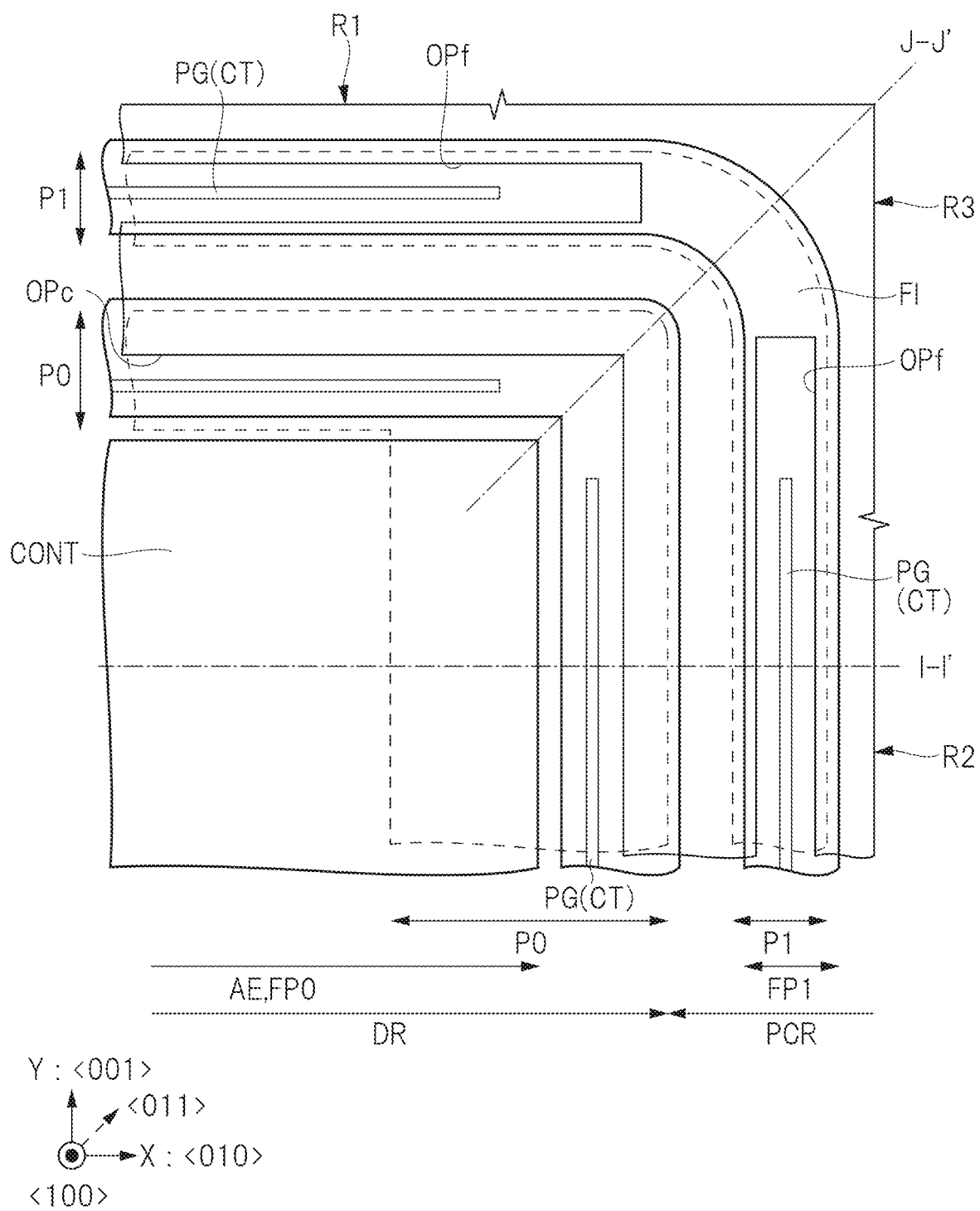
FIG. 42 is a plan view of a principal part of the semiconductor device according to the fifth embodiment.
Figure 43:
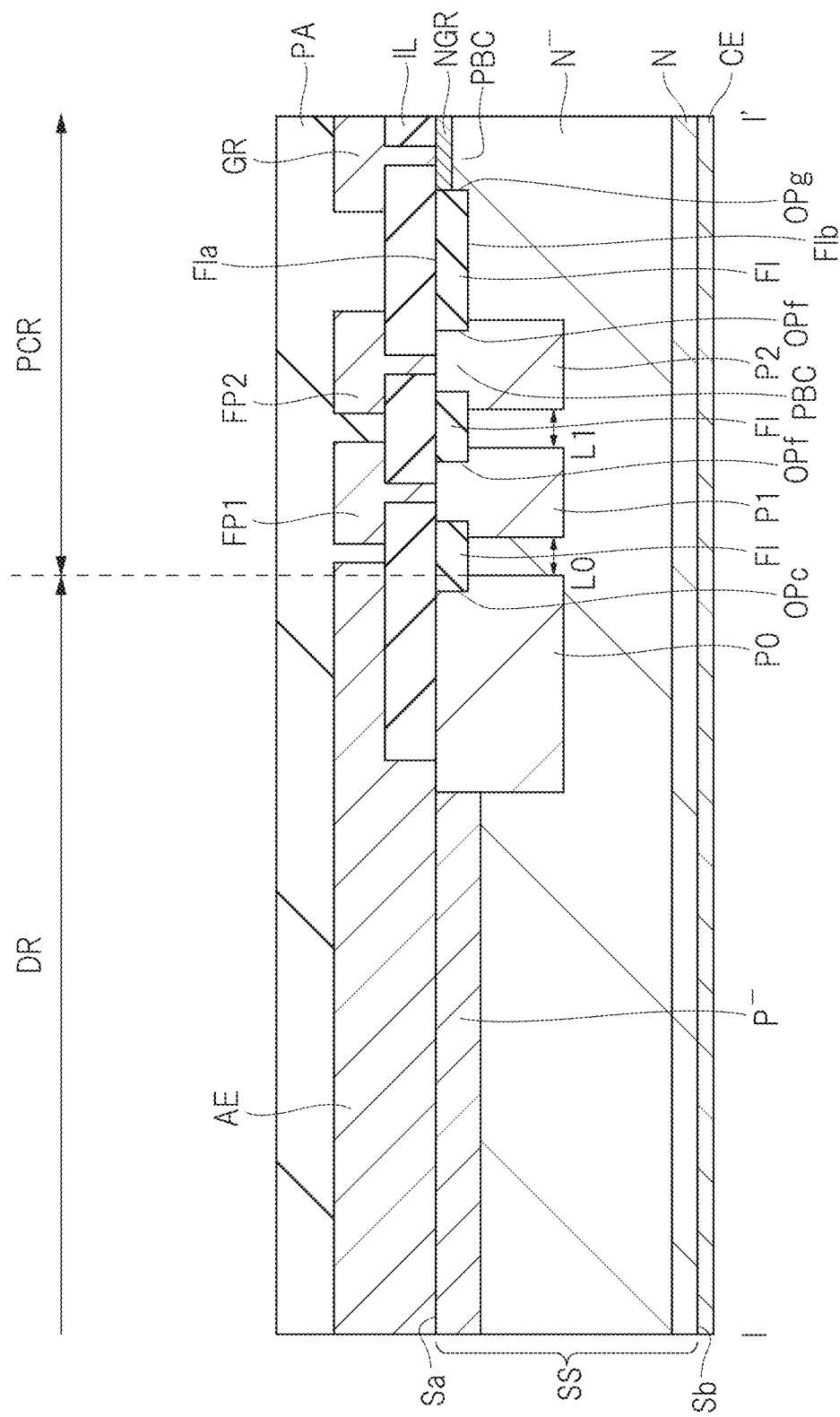
FIG. 43 is a cross-sectional view taken along a line I-I' of FIG. 42.
Figure 44:
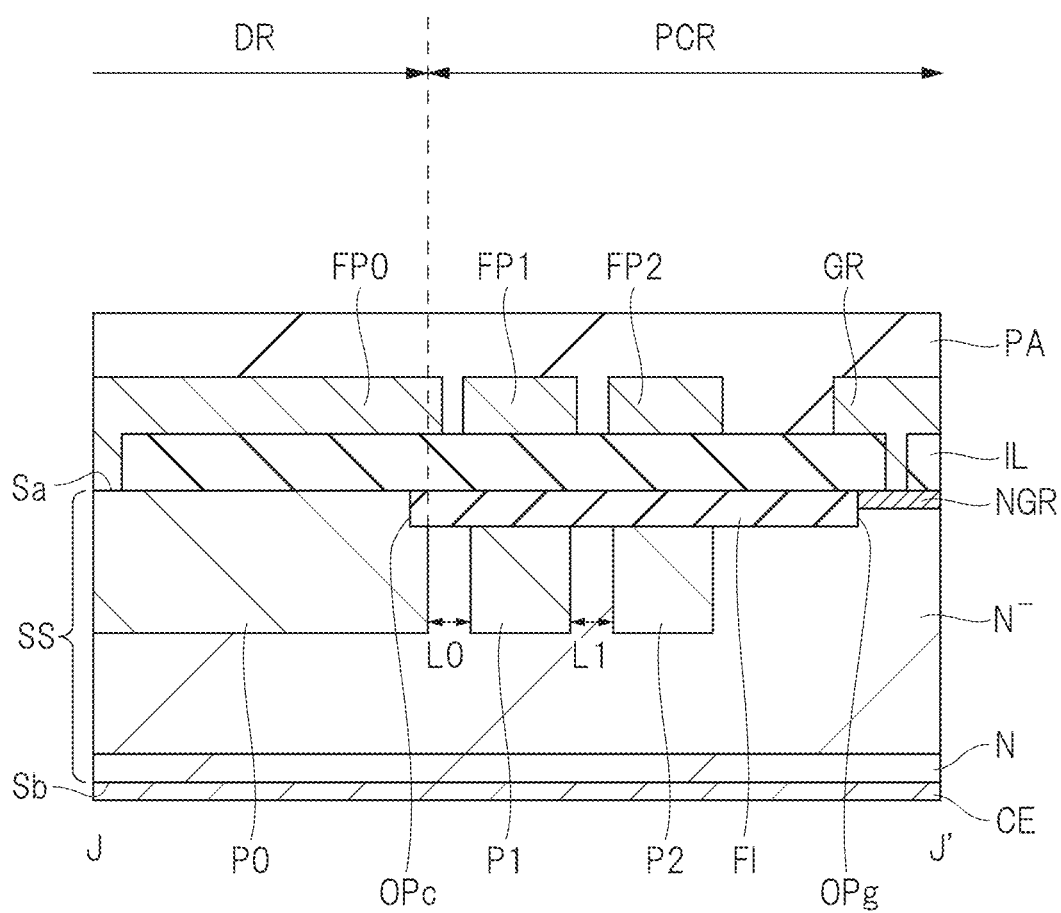
FIG. 44 is a cross-sectional view taken along a line J-J' of FIG. 42.

FIG. 41 is a plan perspective view of a semiconductor device CP3 according to a fifth embodiment, FIG. 42 is a plan view of a principal part of the semiconductor device CP3 according to the fifth embodiment, FIG. 43 is a cross-sectional view taken along a line I-I' of FIG. 42, and FIG. 44 is a cross-sectional view taken along a line J-J' of FIG. 42. Note that FIG. 44 serves also as a cross-sectional view taken along a line H-H' of FIG. 41. The fifth embodiment is a modified example of the first embodiment, and a diode element is formed in a diode region (element forming region) DR surrounded by the peripheral region PCR.

FIG. 41 shows an anode electrode AE, the field plates FP0, FP1 and FP2 and the guard ring GR formed on the main surface of the semiconductor substrate SS. The anode electrode AE and the field plate FP0 are integrated with each other. The anode electrode AE is disposed at the center portion of the main surface of the semiconductor substrate SS, the closed annular field plates FP1 and FP2 are sequentially provided so as to surround a periphery of the anode electrode AE, and further, the closed annular guard ring GR is provided so as to surround the periphery of the field plate FP2. The anode electrode AE, the field plates FP0, FP1 and FP2 and the guard ring GR are covered with the insulating film (protective insulating film) PA (not shown). An anode pad AP is provided on a part of the anode electrode AE exposed from an opening PAa provided in the insulating film PA.

FIG. 42 corresponds to FIG. 6 of the first embodiment. The p-type well region P1 and the field plate FP1 are provided so as to surround the diode region DR. Structures of the p-type well region P1, the field plate FP1, the opening OPf and the like are similar to those of FIG. 6.

As shown in FIG. 43, the diode element is formed on the semiconductor substrate SS, and has the anode electrode AE and a cathode electrode CE. The semiconductor substrate SS is composed of an n-type single crystal silicon substrate, which is formed by the FZ method or the MCZ method and to which n-type impurities such as phosphorus (P) are introduced. The semiconductor substrate SS has the main surface Sa that is one surface and the back surface Sb that is a surface opposite to the main surface Sa, and the main surface Sa is a (100) plane.

On the side closer to the back surface Sb of the semiconductor substrate SS, an n-type semi conduct or region N with a predetermined thickness is formed. In addition, on the back surface Sb of the semiconductor substrate SS, the cathode electrode CE is formed so as to be in contact with the n-type semiconductor region N.

As shown in FIG. 43, an n-type semiconductor region N$^-$ is formed on the n-type semiconductor region N, and a p-type semiconductor region P$^-$ is formed on the n-type semiconductor region N$^-$. Also, the p-type semiconductor region P$^-$ serves as an anode, and the n-type semiconductor region N$^-$ and the n-type semiconductor region N serve as a cathode. The p-type well region P0 is disposed so as to be in contact with the p-type semiconductor region P$^-$ and to surround a periphery thereof. Further, the anode electrode AE is electrically connected to the p-type semiconductor region P$^-$ and the p-type well region P0.

Moreover, the opening OPc of the field insulating film FI embedded in the semiconductor substrate SS defines an active region for forming the diode element. However, the diode region DR is defined to extend up to the end portion of the p-type well region P0. Also, the peripheral region PCR that surrounds the diode region DR is similar to that of the first embodiment.

According to the fifth embodiment, the occurrence of the large dislocation loop DL1 in the corner region R3 can be prevented, and the breakdown voltage of the semiconductor device CP3 can be enhanced.

The first to fourth embodiments described above and the modified examples 1 to 7 thereof are applicable to the fifth embodiment.

Sixth Embodiment

Figure 45:
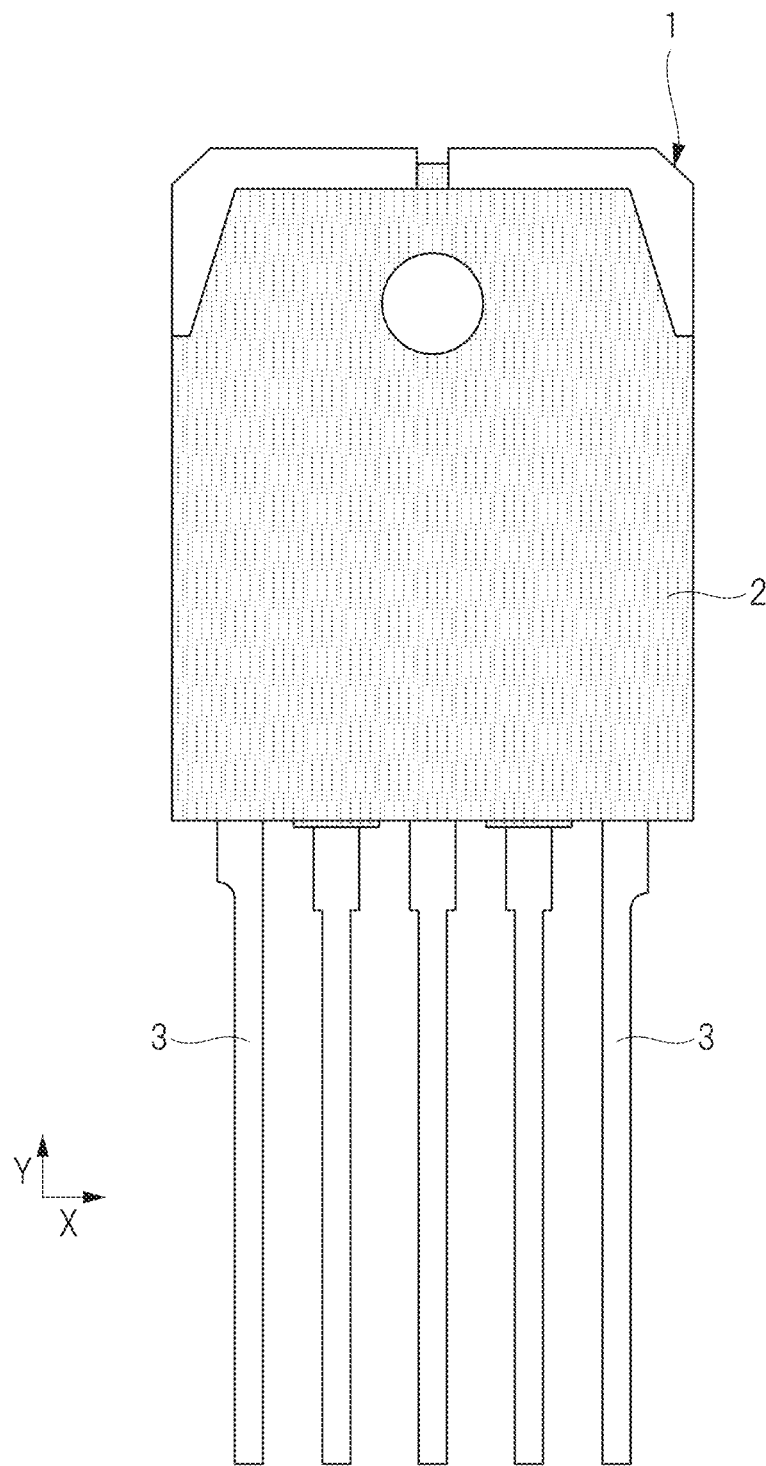
FIG. 45 is a plan view of an exterior appearance of a semiconductor device according to a sixth embodiment.
Figure 46:
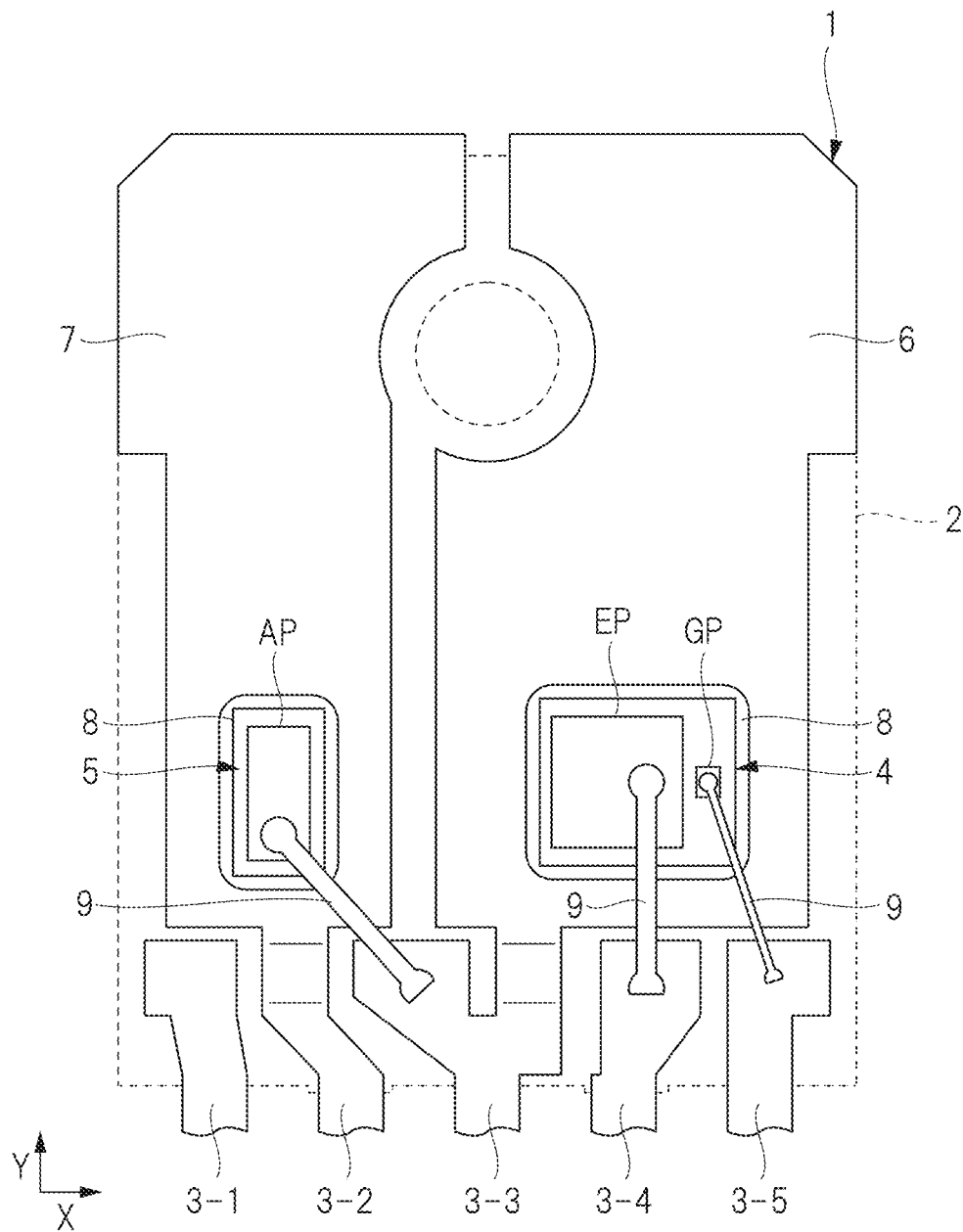
FIG. 46 is a perspective enlarged plan view showing an internal structure of the semiconductor device according to the sixth embodiment.

FIG. 45 is a plan view showing an exterior appearance of a semiconductor device 1 according to a sixth embodiment, and FIG. 46 is a perspective enlarged plan view showing an internal structure of the semiconductor device 1 according to the sixth embodiment.

As shown in FIG. 45, the semiconductor device 1 is a semiconductor package including a sealing body 2 made of resin and a plurality of leads 3 which are a plurality of external terminals exposed from the sealing body 2. The sealing body 2 is made of, for example, epoxy resin impregnated with silicone filler, and the leads 3 are made of, for example, copper (Cu) or an iron-nickel (Fe—Ni) alloy.

As shown in FIG. 46, inside the sealing body 2, the semiconductor device 1 includes a semiconductor chip (transistor chip) 4, a semiconductor chip (diode chip) 5, a metal plate 6 on which the semiconductor chip 4 is mounted, and a metal plate 7 on which the semiconductor chip 5 is mounted. The metal plate 6 and the metal plate 7 are separated from each other. Here, the semiconductor chip 4 is the above-mentioned semiconductor devices CP1 and CP2, and the semiconductor chip 5 is the above-mentioned semiconductor device CP3.

The semiconductor chips 4 and 5 are connected respectively to the metal plates 6 and 7 via a conductive die bond material (conductive adhesive material) 8. The emitter pad EP and the gate pad GP of the semiconductor chip 4 are connected respectively to the leads 3-4 and 3-5 via wires 9. A back electrode (collector electrode) of the semiconductor chip 4 is connected to the lead 3-3 via the conductive die bond material 8 and the metal plate 6. Moreover, the anode pad AP of the semiconductor chip 5 is connected to the lead 3-3 via the wire 9, and a cathode electrode is connected to the lead 3-2 via the metal plate 7.

Since the semiconductor device 1 is composed of the semiconductor chip 4 or 5 described in the above-described embodiments, a breakdown voltage of the semiconductor device 1 can be enhanced.

In the foregoing, the invention made by the inventor of the present invention has been concretely described based on the embodiments. However, it is needless to say that the present invention is not limited to the foregoing embodiments and various modifications can be made within the scope of the present invention. For example, in the first embodiment, the description has been given of the example where the IGBT is formed in the cell region; however, the IGBT may be replaced by a power MISFET having a trench gate.

Moreover, a part of contents described in the above-described embodiments will be described below.

Appendix 1

A semiconductor device including:
(a) a semiconductor substrate made of silicon and having a main surface composed of a crystal plane (100), aback surface opposite to the main surface, and a first semiconductor region of a first conductivity type;
(b) an element forming region provided in the main surface;
(c) a peripheral region provided in the main surface and surrounding a periphery of the element forming region;
(d) a field insulating film having an upper surface and a bottom surface, the bottom surface being located inside the semiconductor substrate, and the upper surface being exposed from the main surface of the semiconductor substrate; and
(e) a well region of a second conductivity type provided in the first semiconductor region and having a closed annular shape so as to surround the element forming region in plan view,
wherein, in plan view, an end portion of the well region on a side closer to the peripheral region includes a first portion extending in a <010> direction, a second portion extending in a <001> direction, and a third portion coupling the first portion and the second portion to each other and having an arc shape in plan view,
wherein the field insulating film covers the peripheral region and includes an opening exposing the element forming region, and
wherein the opening includes a first side extending in the <010> direction and a second side extending in the <001> direction, and the first side and the second side are perpendicular to each other and compose a corner portion of the element forming region.

Appendix 2

The semiconductor device according to appendix 1, wherein the third port ion having the arc shape has a curvature radius of 50 μm or more.

Appendix 3

The semiconductor device according to appendix 1, wherein the corner portion has a curvature radius of 5 μm or less.

Appendix 4

The semiconductor device according to appendix 1, further comprising:
a second semiconductor region of the second conductivity type provided under the field insulating film in the peripheral region,
wherein the second semiconductor region is in contact with the well region.

Appendix 5

The semiconductor device according to appendix 1,
wherein the opening further includes a third side extending in the <010> direction and a fourth side extending in the <001> direction, and
wherein the third side is connected to the second side and the fourth side is connected to the first side.

Appendix 6

A semiconductor device including:
(a) a semiconductor substrate made of silicon and having a main surface composed of a crystal plane (100), a back surface opposite to the main surface, and a first semiconductor region of a first conductivity type;
(b) an element forming region provided in the main surface;
(c) a peripheral region provided in the main surface and surrounding a periphery of the element forming region;

(d) a field insulating film having an upper surface and a bottom surface, the bottom surface being located inside the semiconductor substrate, and the upper surface being exposed from the main surface of the semiconductor substrate; and
(e) a well region of a second conductivity type provided in the first semiconductor region and having a closed annular shape so as to surround the element forming region in plan view,
wherein, in plan view, an end portion of the well region on a side closer to the peripheral region includes a first portion extending in a <010> direction, a second portion extending in a <001> direction, and a third portion coupling the first portion and the second portion to each other and having an arc shape in plan view,
wherein the field insulating film covers the peripheral region and includes an opening exposing the element forming region,
wherein the opening includes a first side extending in the <010> direction, a second side extending in the <001> direction, and a connection portion connecting the first side and the second side to each other,
wherein the connection portion includes a third side and a fourth side which are disposed symmetrically with respect to a <011> direction as a symmetry axis, and
wherein the third side and the fourth side extend in directions different from each other, and linearly extend in directions different from the <010> direction, the <001> direction and the <011> direction.

Appendix 7

The semiconductor device according to appendix 6,
wherein the third side is connected to the first side via a first arc portion having an arc shape, and
wherein the fourth side is connected to the second side via a second arc portion having an arc shape.

Appendix 8

A semiconductor device including:
(a) a semiconductor substrate made of silicon and having a main surface composed of a crystal plane (100), a back surface opposite to the main surface, and a first semiconductor region of a first conductivity type;
(b) an element forming region provided in the main surface;
(c) a peripheral region provided in the main surface and surrounding a periphery of the element forming region;
(d) a guard ring region located on an opposite side to the element forming region, the guard ring region being a part of the peripheral region; and
(e) a field insulating film having an upper surface and a bottom surface, the bottom surface being located inside the semiconductor substrate, and the upper surface being exposed from the main surface of the semiconductor substrate,
wherein, in the guard ring region, a second semiconductor region of a second conductivity type is formed in the first semiconductor region,
wherein the field insulating film covers the peripheral region and includes a first opening exposing the element forming region and a second opening exposing the guard ring region, and
wherein the second opening includes a first side extending in a <010> direction and a second side extending in a <001> direction, and the first side and the second side are perpendicular to each other and compose a corner portion of the field insulating film.

Appendix 9

A semiconductor device including:
(a) a semiconductor substrate made of silicon and having a main surface composed of a crystal plane (100), a back surface opposite to the main surface, and a first semiconductor region of a first conductivity type;
(b) an element forming region provided in the main surface;
(c) a peripheral region provided in the main surface and surrounding a periphery of the element forming region;
(d) a guard ring region located on an opposite side to the element forming region, the guard ring region being a part of the peripheral region; and
(e) a field insulating film having an upper surface and a bottom surface, the bottom surface being located inside the semiconductor substrate, and the upper surface being exposed from the main surface of the semiconductor substrate,
wherein, in the guard ring region, a second semiconductor region of a second conductivity type is formed in the first semiconductor region,
wherein the field insulating film covers the peripheral region and includes a first opening exposing the element forming region and a second opening exposing the guard ring region,
wherein the second opening includes a first side extending in a <010> direction, a second side extending in a <001> direction, and a connection portion connecting the first side and the second side to each other,
wherein the connection portion includes a third side and a fourth side which are disposed symmetrically with respect to a <011> direction as a symmetry axis, and
wherein, in plan view, the third side and the fourth side extend in directions different from each other, and linearly extend in directions different from the <010> direction, the <001> direction and the <011> direction.

Appendix 10

The semiconductor device according to appendix 9,
wherein the third side is connected to the first side via a first arc portion having an arc shape, and
wherein the fourth side is connected to the second side via a second arc portion having an arc shape.

Appendix 11

A method for manufacturing a semiconductor device including an element forming region and a well region including a first well region extending in a <010> direction, a second well region extending in a <001> direction, and a third well region connecting the first well region and the second well region to each other, the well region surrounding a periphery of the element forming region, the method including:
(a) a step of preparing a semiconductor substrate made of silicon and having a first region, a second region and a third region in a main surface composed of a crystal plane (100);
(b) a step of forming, in an inside of the semiconductor substrate, a first field insulating film having a first opening that exposes apart of the first region, a second field insulating film having a second opening that exposes a part of the second region, and a third field insulating film that covers the third region and does not expose the third region; and (c) a step of forming the first well region in the semiconductor substrate under the first opening and the first field insulating film in the first region, forming the second well region in the semiconductor substrate under the second opening and the second field insulating film in the second region, and forming the third well region in the semiconductor substrate under the third field insulating film in the third region, wherein, when the main surface of the semiconductor substrate is taken as a reference, depths of the first well region, the second well region and the third well region are equal to one another.

Appendix 12

The method for manufacturing a semiconductor device according to appendix 11,
wherein the step of forming the first well region, the second well region and the third well region includes:
(c-1) a first ion implantation step of introducing first impurities of a first conductivity type to a first depth of the semiconductor substrate; and
(c-2) a second ion implantation step of introducing second impurities of the first conductivity type to a second depth of the semiconductor substrate, and
wherein the first depth is larger than the second depth.

Appendix 13

The method for manufacturing a semiconductor device according to appendix 12,
wherein, in the (c-1) step, the first impurities are introduced at a first ion implantation angle with respect to a normal line of the main surface,
wherein, in the (c-2) step, the second impurities are introduced at a second ion implantation angle with respect to the normal line of the main surface, and
wherein the second ion implantation angle is larger than the first ion implantation angle.

What is claimed is:

1. A semiconductor device comprising:
(a) a semiconductor substrate made of silicon, the semiconductor substrate including a main surface having an element forming region and a peripheral region surrounding the element forming region, and a first semiconductor region of a first conductivity type located between the main surface and a back surface opposite to the main surface;
(b) an insulated-gate bipolar transistor (IGBT) element formed in the semiconductor substrate in the element forming region;
(c) a well region of a second conductivity type having a closed annular shape so as to surround the element forming region in plan view, the well region being formed in the first semiconductor region in the peripheral region;
(d) a plurality of field insulating films formed in a plurality of first trenches formed in the first semiconductor region in the peripheral region; and
(e) openings located between the field insulating films formed in the first trenches adjacent to each other,
wherein the IGBT element includes:
a gate insulating film and a gate electrode which are formed in a second trench extending from the main surface of the semiconductor substrate toward the back surface of the semiconductor substrate in the first semiconductor region;
a second semiconductor region of the first conductivity type being in contact with the gate insulating film on a sidewall of the trench, the second semiconductor region being formed so as to be in contact with the main surface of the semiconductor substrate in the first semiconductor region;
a third semiconductor region of the second conductivity type being in contact with the gate insulating film on the sidewall of the trench, the third semiconductor region being provided under the second semiconductor region; and
a fourth semiconductor region of the second conductivity type provided between the first semiconductor region and the back surface,
wherein the semiconductor substrate has a rectangular shape in plan view,
wherein, in plan view, the well region includes first regions extending along two opposite sides of the semiconductor substrate, and a second region having an arc shape and connecting the first regions each other in a corner portion of the semiconductor substrate, and
wherein the openings extend along two opposite sides of the semiconductor substrate in the first regions, and the openings are divided in the second region.

2. The semiconductor device according to claim 1 wherein each of the field insulating films has a bottom surface, and
wherein an end portion of the well region is located on the bottom surface of the field insulating film.

3. The semiconductor device according to claim 1, wherein the second region of the well region is covered with the field insulating film.

4. The semiconductor device according to claim 1, wherein a depth of the well region in the second region is equal to a depth of the well region in the first region.

5. The semiconductor device according to claim 1, wherein the arc shape of the well region in the second region has a curvature radius of 50 µm or more.

6. The semiconductor device according to claim 1, wherein a diode element is provided in the element forming region, and
wherein the diode element includes a fifth semiconductor region of the first conductivity type provided in the main surface of the semiconductor substrate in the first semiconductor region.

7. The semiconductor device according to claim 1, wherein the well region includes:
a sixth semiconductor region of the second conductivity type provided in the first semiconductor region;
a seventh semiconductor region of the second conductivity type provided on a side closer to the main surface than the sixth semiconductor region; and
an eighth semiconductor region of the second conductivity type provided on a side closer to the main surface than the seventh semiconductor region, and
wherein, in plan view, a width of the seventh semiconductor region is larger than a width of the sixth semiconductor region, and a width of the eighth semiconductor region is larger than the width of the seventh semiconductor region.

8. The semiconductor device according to claim 1, further comprising:
an insulating film covering the well region and the field insulating film;

a metal wiring provided on the insulating film so as to overlap the well region in plan view and having a closed annular shape that surrounds the element forming region; and a conductor layer electrically connecting the metal wiring and the well region to each other, wherein the insulating film includes a contact trench exposing the well region in the first region, and wherein the conductor layer is embedded in the contact trench and is in contact with the well region.

9. The semiconductor device according to claim 8,
wherein, in plan view, the contact trench is located in the opening.

10. The semiconductor device according to claim 1,
wherein, in plan view, the first region extends in a <001> direction or a <001> direction, wherein the openings include a first opening extending in the <001> direction, a second opening extending in the <001> direction, and a square or rectangular dummy opening provided in the second region, and wherein four sides composing the dummy opening extend in the <010> direction or the <001> direction.

11. The semiconductor device according to claim 10, wherein the openings are composed of a plurality of square or rectangular sub-opening.

* * * * *